(12) United States Patent
Kato et al.

(10) Patent No.: US 7,590,528 B2
(45) Date of Patent: Sep. 15, 2009

(54) METHOD AND APPARATUS FOR NOISE SUPPRESSION

(75) Inventors: Masanori Kato, Tokyo (JP); Akihiko Sugiyama, Tokyo (JP)

(73) Assignee: NEC Corporation, Tokyo (JP)

( * ) Notice: Subject to any disclaimer, the term of this patent is extended or adjusted under 35 U.S.C. 154(b) by 875 days.

(21) Appl. No.: 10/451,141

(22) PCT Filed: Dec. 27, 2001

(86) PCT No.: PCT/JP01/11560

§ 371 (c)(1),
(2), (4) Date: Jun. 27, 2003

(87) PCT Pub. No.: WO02/054387

PCT Pub. Date: Jul. 11, 2002

(65) Prior Publication Data

US 2004/0049383 A1     Mar. 11, 2004

(30) Foreign Application Priority Data

Dec. 28, 2000     (JP)     ............... 2000-401578

(51) Int. Cl.
G10L 21/02     (2006.01)
G10L 15/20     (2006.01)
(52) U.S. Cl. ................................. 704/226; 704/233
(58) Field of Classification Search .............. 704/233, 704/226
See application file for complete search history.

(56) References Cited

U.S. PATENT DOCUMENTS

| | | | |
|---|---|---|---|
| 4,630,304 A * | 12/1986 | Borth et al. ............... | 381/94.3 |
| 4,811,404 A | 3/1989 | Vilmur | |
| 5,012,519 A * | 4/1991 | Adlersberg et al. ......... | 704/226 |
| 5,757,937 A | 5/1998 | Itoh | |
| 6,263,307 B1 * | 7/2001 | Arslan et al. ............... | 704/226 |
| 6,351,731 B1 * | 2/2002 | Anderson et al. .......... | 704/233 |
| 6,459,914 B1 * | 10/2002 | Gustafsson et al. ......... | 455/570 |
| 6,591,234 B1 * | 7/2003 | Chandran et al. .......... | 704/225 |
| 6,757,395 B1 * | 6/2004 | Fang et al. ................ | 381/94.3 |
| 6,778,954 B1 * | 8/2004 | Kim et al. ................. | 704/226 |
| 2002/0002455 A1 * | 1/2002 | Accardi et al. ............. | 704/226 |

FOREIGN PATENT DOCUMENTS

| | | |
|---|---|---|
| CN | 1277500 A | 12/2000 |
| EP | 1 059 628 A2 | 12/2000 |
| EP | 1 104 925 A | 6/2001 |

(Continued)

*Primary Examiner*—David R Hudspeth
*Assistant Examiner*—Abdelali Serrou
(74) *Attorney, Agent, or Firm*—Foley & Lardner LLP

(57) ABSTRACT

An apparatus for noise suppression has a converter for converting an input signal into a frequency-domain, an SNR calculator for determining a signal-to-noise ratio (SNR) using the frequency-domain signal, a spectral gain generator for determining a spectral gain based on the SNR, a spectral gain modification unit for correcting the spectral gain to determine a modified spectral gain, a multiplier for weighting the frequency-domain signal using the modified spectral gain, and an inverse converter for converting the weighted frequency-domain signal into a signal in a time-domain signal. In the apparatus for noise suppression, it is preferable to calculate a weighted noisy speech power spectrum from the power spectrum of noisy speech and the power spectrum of estimated noise thereby determining an SNR.

25 Claims, 37 Drawing Sheets

FOREIGN PATENT DOCUMENTS

| | | |
|---|---|---|
| JP | 9-16194 A | 10/1975 |
| JP | 63-500543 A | 2/1988 |
| JP | 3-266899 A | 11/1991 |
| JP | 9-204196 A | 8/1997 |
| JP | 9-212196 A | 8/1997 |
| JP | 10-254499 A | 9/1998 |
| JP | 2000-82999 A | 2/2000 |
| JP | 2000-47697 A | 9/2000 |
| JP | 2000-347688 A | 12/2000 |
| JP | 2001-134287 A | 2/2001 |
| JP | 2002-73066 A | 3/2002 |
| WO | WO 00/22444 A | 4/2000 |
| WO | WO 00/48171 A | 8/2000 |

\* cited by examiner

METHOD AND APPARATUS FOR NOISE SUPPRESSION

TECHNICAL FIELD

The present invention relates to a method of and an apparatus for suppressing noise superposed on a desired speech signal.

BACKGROUND ART

A noise suppressor is an apparatus which suppresses noise superposed on a desired speech signal. A noise suppressor operates to estimate the power spectrum of a noise component using an input signal that has been transformed into a frequency-domain signal, and subtracts the estimated noise power spectrum from the input signal thereby suppressing the noise mixed with the desired speech signal. A noise suppressor can be used to suppress nonstationary noise by detecting a silent section of speech and updating the power spectrum of a noise component.

A noise suppressor is described in IEEE TRANSACTIONS ON ACOUSTICS, SPEECH, AND SIGNAL PROCESSING, Vol. 32, No. 6, pp. 1109-1121, DECEMBER 1984, (Reference 1). In this paper, the noise suppressor uses a technique known as a minimum mean-square error short-time spectral amplitude process. FIG. 1 shows the structure of the noise suppressor described in Reference 1. A signal including a desired speech signal and noise mixed therewith will hereinafter be referred to as a noisy speech signal.

The noise suppressor shown in FIG. 1 comprises input terminal 11, frame decomposition unit 1, windowing unit 2, Fourier transform unit 3, voice activity detector 4, noise estimation unit 51, frequency-dependent SNR (signal-to-noise ratio) calculator 6, a-priori SNR estimator 7, spectral gain generator 8, inverse Fourier transform unit 9, frame synthesis unit 10, output terminal 12, counter 13, and multiplexed multipliers 16, 17. In the noise suppressor, input terminal 11 is supplied with a noisy speech signal as a sequence of samples. Samples of the noisy speech signal are then supplied to frame decomposition unit 1, which divides the noisy speech signal into frames with K/2 samples where K represents an even number. The noisy speech signal samples which are divided into frames are supplied to windowing unit 2 in which they are multiplied by a window function w(t). A signal $\bar{y}_n(t)$ produced by windowing the $n^{th}$-frame of the input signal $y_n(t)$ (t=0, 1, ..., K/2−1) with w(t) is expressed by the following equation:

$$\bar{y}_n(t) = w(t) y_n(t) \tag{1}$$

In the noise suppressor, successive two frames are generally overlapped and windowed. If it is assumed that 50% of the frame length is used as the overlap length, then windowing unit 2 outputs $\bar{y}_n(t)$ (t=0, 1, ..., K−1) expressed by (2), (3):

$$\bar{y}_n(t) = w(t) y_{n-1}(t) \tag{2}$$

$$\bar{y}_n(t+K/2) = w(t+K/2) y_n(t) \tag{3}$$

In the following description, 50% overlap is assumed. A Hanning window expressed by equation (4), for example, may be used as w(t):

$$w(t) = \begin{cases} 0.5 + 0.5\cos\left(\dfrac{\pi(k - K/2)}{K/2}\right), & 0 \le t < K \\ 0, & \text{otherwise} \end{cases} \tag{4}$$

The windowed output $\bar{y}_n(t)$ is supplied to Fourier transform unit 3, which converts the windowed output $\bar{y}_n(t)$ into a noisy speech spectrum $Y_n(k)$. The noisy speech spectrum $Y_n(k)$ is separated into a phase and an amplitude. The noisy speech phase spectrum $\arg Y_n(k)$ is supplied to inverse Fourier transform unit 9, and the spectral amplitude of noisy speech $|Y_n(k)|$ is supplied to voice activity detector 4, multiplexed multiplier 16, and multiplexed multiplier 17.

Voice activity detector 4 determines whether there is speech or not based on the spectral amplitude of noisy speech $|Y_n(k)|$, and transmits a voice activity detection flag that is set in accordance with the determined result to noise estimation unit 51. Multiplexed multiplier 17 calculates a noisy speech power spectrum using the supplied spectral amplitude of noisy speech $|Y_n(k)|$, and provides the calculated noisy speech power spectrum to noise estimation unit 51 and frequency-dependent SNR calculator 6.

Noise estimation unit 51 estimates a power spectrum of the noise using the voice activity detection flag, the noisy speech power spectrum, and a count value supplied from counter 13, and transmits the estimated power spectrum to frequency-dependent SNR calculator 6 as an estimated noise power spectrum. Frequency-dependent SNR calculator 6 calculates an SNR for each frequency by using the noisy speech power spectrum and the estimated noise power spectrum which have been supplied thereto, and supplies the calculated SNR as an a-posteriori SNR to a-priori SNR estimator 7 and spectral gain generator 8.

A-priori SNR estimator 7 estimates an a-priori SNR using the a-posteriori SNR supplied thereto and a spectral gain supplied from spectral gain generator 8, and supplies the estimated a-priori SNR as feedback to spectral gain generator 8.

Spectral gain generator 8 generates a spectral gain using the a-posteriori SNR and the estimated a-priori SNR which are supplied thereto as inputs, and supplies the spectral gain to a-priori SNR estimator 7 as feedback and also transmits the generated noise spectral gain to multiplexed multiplier 16.

Multiplexed multiplier 16 weights the spectral amplitude of noisy speech $|Y_n(k)|$ supplied from Fourier transform unit 3 with the spectral gain $\bar{G}_n(k)$ supplied from spectral gain generator 8, thus determining a spectral amplitude of the enhanced speech $|\bar{X}_n(k)|$, and transmits the spectral amplitude of the enhanced speech $|\bar{X}_n(k)|$ to inverse Fourier transform unit 9. The spectral amplitude of the enhanced speech $|\bar{X}_n(k)|$ is expressed by equation (5):

$$|\bar{X}_n(k)| = \bar{G}_n(k) |Y_n(k)| \tag{5}$$

Inverse Fourier transform unit 9 multiplies the spectral amplitude of the enhanced speech $|\bar{X}_n(k)|$ supplied from multiplexed multiplier 16 by the noisy speech phase spectrum $\arg Y_n(k)$ supplied from Fourier transform unit 3 by each other, thus determining enhanced speech $\bar{X}_n(k)$. That is, inverse Fourier transform unit 9 carries out a calculation according to equation (6):

$$\bar{X}_n(k) = |\bar{X}_n(k)| \arg Y_n(k) \tag{6}$$

Inverse Fourier transform unit 9 performs an inverse Fourier transform on the produced enhanced speech $\bar{X}_n(k)$, producing a time-domain sequence of samples $\bar{x}_n(t)$ (t=0, 1, ..., K−1) where one frame is made up of K samples, and transmits the time-domain samples $\bar{x}_n(t)$ to frame synthesis unit 10. Frame synthesis unit 10 takes out K/2 samples from adjacent two frames of $\bar{x}_n(t)$, and overlaps the K/2 samples, producing enhanced speech $\hat{x}_n(t)$ according to equation (7). The produced enhanced speech $\hat{x}_n(t)$ ($t=0, 1, \ldots, K-1$) is transmitted as an output from frame synthesis unit 10 to output terminal 12.

$$\hat{x}_n(t) = \bar{x}_{n-1}(t+K/2) + \bar{x}_n(t) \qquad (7)$$

Reference 1 discloses no details about how to implement voice activity detector 4 included in the noise suppressor shown in FIG. 1. However, one example of the voice activity detector that can be used in the noise suppressor is available in "Proceedings of National Convention of the Acoustical Society of Japan, March 2000, pages 321-322 (Reference 2)." The voice activity detector shown in Reference 2 will be described below as a conventional implemented example of voice activity detector 4. As shown in FIG. 2, voice activity detector 4 comprises threshold memory 401, comparator 402, multiplier 404, logarithmic calculator 405, power calculator 406, weighted adder 407, weight memory 408, and NOT circuit 409.

In voice activity detector 4, the spectral amplitude of noisy speech supplied from the Fourier transform unit 3 (FIG. 1) is supplied to power calculator 406. Power calculator 406 calculates the sum of powers $|Y_n(k)|^2$ of the spectral amplitude of noisy speech from $k=0$ to $K-1$, and transmits the calculated sum to logarithmic calculator 405. Logarithmic calculator 405 determines a logarithm of the supplied noisy speech spectrum power, and supplies the logarithm to multiplier 404. Multiplier 404 multiplies the supplied logarithm by a constant to determine a noisy speech power $Q_n$, and supplies the noisy speech power $Q_n$ to comparator 402 and weighted adder 407. Specifically, noisy speech power $Q_n$ in the $n^{th}$-frame is expressed by the following equation:

$$Q_n = 10\log_{10}\left(\sum_{k=0}^{K-1} |Y_n(k)|^2\right) \qquad (8)$$

The voice activity detector disclosed in Reference 2 determines $Q_n$ according to equation (9), using time-domain samples $\bar{y}_n(t)$.

$$Q_n = 10\log_{10}\left(\sum_{t=0}^{K-1} \bar{y}_n^2(t)\right) \qquad (9)$$

As described in "Digital Signal Processing", 1985, Corona, pages 75-76 (Reference 3), it is known that the equations (8) and (9) are equivalent by the Parseval's Theorem.

Comparator 402 is supplied with a threshold value $TH_n$ from threshold memory 401. Comparator 402 compares the output from multiplier 404 with the threshold value $TH_n$. If $TH_n > Q_n$, then comparator 402 outputs "1" representing a speech section, and if $TH_n \leq Q_n$, then comparator 402 outputs "0" representing a silent section, as a voice activity detection flag. The output from comparator 402 is used as the voice activity detection flag, and is also supplied to NOT circuit 409. NOT circuit 409 supplies its output as weighted adder control signal 905 for weighted adder 407. Weighted adder 407 is also supplied with threshold value 902 from threshold memory 401 and weight 903 from weight memory 408.

Weighted adder 407 selectively updates threshold value 902 supplied from threshold memory 401 based on weighted adder control signal 905, and supplies updated threshold value 904 as feedback to threshold memory 401. The updated threshold value $TH_n$ is determined by performing weighted addition of a threshold value $TH_{n-1}$ and noisy speech power 901 using weight 903 from weight memory 408. The updated threshold value $TH_n$ is calculated only when weighted adder control signal 905 which is the output from NOT circuit 409 is equal to "1", i.e., only during a silent section. Updated threshold value 904 thus updated is supplied as feedback to threshold memory 401.

As shown in FIG. 3, power calculator 406 has demultiplexer 4061, K multipliers $4062_0$ to $4062_{K-1}$, and adder 4063. The multiplexed spectral amplitude of noisy speech supplied from Fourier transform unit 3 (FIG. 1) is separated by demultiplexer 4061 into frequency-dependent K samples, which are supplied respectively to multipliers $4062_0$ to $4062_{K-1}$. Multipliers $4062_0$ to $4062_{K-1}$ square the supplied input signals, respectively, and transmit the squared signals to adder 4063, which determines the sum of the input signals and outputs the determined sum.

As shown in FIG. 4, weighted adder 407 has multipliers 4071, 4073, constant multiplier 4075, and adders 4072, 4074. Weighted adder 407 is supplied with noisy speech power 901 from multiplier 404 (FIG. 2), threshold value 902 from threshold memory 401 (FIG. 2), weight 903 from weight memory 408 (FIG. 2), and weighted adder control signal 905 from NOT circuit 409 (FIG. 2) as inputs thereto. Weight 903 having a value β is transmitted to constant multiplier 4075 and multiplier 4073. Constant multiplier 4075 multiplies the input signal by −1 to produce a value −β, and transmits the value −β to adder 4074, which is supplied also with 1 as another input. Adder 4074 thus outputs a sum 1−β, which is supplied to multiplier 4071. On the other hand, multiplier 4071 multiplies the sum 1−β, by noisy speech power $Q_n$ as another input thereto, producing a product $(1-\beta)Q_n$ that is transmitted to adder 4072. Multiplier 4073 multiplies the value β supplied as weight 903 by threshold value 902, and transmits a product $\beta TH_{n-1}$ to adder 4072. Adder 4072 adds $\beta TH_{n-1}$ and $(1-\beta)Q_n$, and outputs the sum as updated threshold value 904. The updated threshold value $TH_n$ is calculated only when weighted adder control signal 905 is equal to "1". That is, weighted adder 407 has a function to update $TH_{n-1}$ to determine $TH_n$ during a silent section according to the following equation where β represents the value of weight 903:

$$TH_n = \begin{cases} TH_n, & TH_n \geq Q_n \\ \beta TH_{n-1} + (1-\beta)Q_n, & TH_n < Q_n \end{cases} \qquad (10)$$

FIG. 5 shows an example of an arrangement of multiplexed multiplier 17 included in the noise suppressor shown in FIG. 1. Multiplexed multiplier 17 has K multipliers $1701_0$ to $1701_{K-1}$ demultiplexers 1702, 1703, and multiplexer 1704. In multiplexed multiplier 17, the multiplexed spectral amplitude of noisy speech supplied from Fourier transform unit 3 (FIG. 1) is separated by demultiplexers 1702, 1703 into frequency-dependent K samples, which are supplied respectively to multipliers $1701_0$ to $1701_{K-1}$. Multipliers $1701_0$ to $1701_{K-1}$ square the supplied input signals, respectively, and transmit the squared signals to multiplexer 1704, which multiplexes the input signals and outputs the multiplexed signal as a noisy speech power spectrum.

As shown in FIG. 6, noise estimation unit 51 included in the noise suppressor shown in FIG. 1 has demultiplexer 502, multiplexer 503, and K frequency-dependent noise estimation units $514_0$ to $514_{K-1}$. In noise estimation unit 51, the voice activity detection flag supplied from voice activity detector 4 (FIG. 1) and the count value supplied from counter 13 (FIG. 1) are transmitted to frequency-dependent noise estimation units $514_0$ to $514_{K-1}$. The noisy speech power spectrum supplied from multiplexed multiplier 17 (FIG. 1) is transmitted to demultiplexer 502. Demultiplexer 502 separates the supplied multiplexed noisy speech power spectrum into K frequency-dependent components, and transmits the K frequency-dependent components respectively to frequency-dependent noise estimation units $514_0$ to $514_{K-1}$. Frequency-dependent noise estimation units $514_0$ to $514_{K-1}$ calculate noise power spectrum components using the noisy speech power spectrum supplied from demultiplexer 502, and transmit the calculated noise power spectrum components to multiplexer 503. Calculation of the noise power spectrum is controlled by the count value and the value of the voice activity detection flag and is performed only when predetermined conditions are satisfied. Multiplexer 503 multiplexes the supplied K noise power spectrum components, and outputs the multiplexed noise power spectrum as an estimated noise power spectrum.

FIG. 7 shows an arrangement of each of frequency-dependent noise estimation units $514_0$ to $514_{K-1}$ included in noise estimation unit 51 (FIG. 6). Since frequency-dependent noise estimation units $514_0$ to $514_{K-1}$ are identical in arrangement to each other, they are indicated as frequency-dependent noise estimation unit 514 in FIG. 7. The noise estimation algorithm disclosed in Reference 2 serves to update an estimated noise value in a silent section, and uses instantaneous values of estimated noise which are averaged by a recursive filter, as the estimated noise value. Another noise estimation algorithm is disclosed in IEEE TRANSACTIONS ON SPEECH AND AUDIO PROCESSING, Vol. 6, No. 3, pp. 287-292, MAY 1998 (Reference 4), which states that instantaneous values of estimated noise are averaged and used. Reference 4 suggests the implementation of an averaging process using a transversal filter, i.e., a filter comprising a shift register, rather than a recursive filter. Since both of the above implementations have equal functions, the process disclosed in Reference 4 will be described below.

Frequency-dependent noise estimation unit 514 has update decision unit 521, register length memory 5041, switch 5044, shift register 4045, adder 5046, minimum value selector 5047, divider 5048, and counter 5049. Switch 5044 is supplied with the frequency-dependent noisy speech power spectrum from demultiplexer 502 (FIG. 6). When switch 5044 closes its circuit, the frequency-dependent noisy speech power spectrum is transmitted to shift register 5045. In response to a control signal supplied from update decision unit 521, shift register 5045 shifts stored values in internal register elements to adjacent register elements. The length of the shift register 5045 is equal to a value stored in register length memory 5941. The outputs from all the internal register elements of shift register 5045 are supplied to adder 5046. Adder 5046 adds the supplied outputs from all the internal register elements, and transmits the sum to divider 5048.

On the other hand, update decision unit 521 is supplied with the count value from counter 13 and the voice activity detection flag from voice activity detector 4. Update decision unit 521 outputs "1" at all times until the count value reaches a preset value. After the count value reaches the preset value, update decision unit 521 outputs "1" when the voice activity detection flag is "0", i.e., during a silent section, and outputs "0" otherwise. Update decision unit 521 transmits its output to counter 5049, switch 5044, and shift register 5045. Switch 5044 closes its circuit when the signal supplied from update decision unit 521 is "1", and opens its circuit when the signal supplied from update decision unit 521 is "0". Counter 5049 increments its count value when the signal supplied from update decision unit 521 is "1", and does not change its count value when the signal supplied from update decision unit 521 is "0". Shift register 5045 reads one signal sample supplied from switch 5044 and shifts the stored values in the internal register elements to the adjacent register elements, when the signal supplied from update decision unit 521 is "1".

Minimum value selector 5047 is supplied with the output from counter 5049 and the output from register length memory 5941. Minimum value selector 5047 selects a smaller one of the count value and the register length which are supplied thereto, and transmits the selected value to divider 5048. Divider 5048 divides the sum of the frequency-dependent noisy speech power spectrum supplied from adder 5046 by the smaller one of the count value and the register length, and outputs the quotient as a frequency-dependent estimated noise power spectrum $\lambda_n(k)$. If the sample values of the frequency-dependent noisy speech power spectrum components stored in shift register 5045 are represented by $B_n(k)$ (n=0, 1, ..., N-1), then the frequency-dependent estimated noise power spectrum $\lambda_n(k)$ is expressed by equation (11):

$$\lambda_n(k) = \frac{1}{N} \sum_{n=0}^{N-1} B_n(k) \tag{11}$$

where N represents a smaller one of the count value and the register length. Since the count value monotonously increments from zero, dividing operation is initially performed by using the count value and then performed by using the register length. Performing dividing operation by using the register length means determining an average value of the values stored in the shift register. Initially, since sufficiently many values are not stored in shift register 5045, the sum of frequency-dependent noisy speech power spectrum is divided by the number of register elements where values are actually stored. The number of register elements where values are actually stored is equal to the count value when the count value is smaller than the register length, and equal to the register length when the count value becomes larger than the register length.

FIG. 8 shows an arrangement of update decision unit 521. Update decision unit 521 has NOT circuit 5202, comparator 5203, threshold memory 5204, and OR circuit 5211. In update decision unit 521, the count value supplied from counter 13 (FIG. 1) is transmitted to comparator 5203. Comparator 5203 is also supplied with a threshold value output from threshold memory 5204. Comparator 5203 compares the supplied count value and the supplied threshold value with each other. If the count value is smaller than the threshold value, then comparator 5203 transmits "1" to OR circuit 5211, and if the count value is greater than the threshold value, then comparator 5203 transmits "0" to OR circuit 5211. The voice activity detection flag supplied to update decision unit 521 is transmitted to NOT circuit 5202, which determines a logical inverted value of the input signal and transmits the inverted value to OR circuit 5211. Specifically, NOT circuit 5202 transmits "0" to OR circuit 5211 in a speech section where the voice activity detection flag is "1", and transmits "1" to OR circuit 5211 in a silent section where the voice activity detection flag is "0". As a result, OR circuit 5211 outputs "1" during a silent section where the voice activity detection flag is "0" or when the count value is smaller than the threshold value, closing the switch shown in FIG. 7 and counting up counter 5049.

FIG. 9 shows an example of an arrangement of frequency-dependent SNR calculator 6 included in the noise suppressor shown in FIG. 1. Frequency-dependent SNR calculator 6 has K dividers $601_0$ to $601_{K-1}$, demultiplexers 602, 603, and a multiplexer 604. In frequency-dependent SNR calculator 6, the noisy speech power spectrum supplied from multiplexed multiplier 17 (FIG. 1) is transmitted to demultiplexer 602.

The estimated noise power spectrum supplied from noise estimation unit 51 (FIG. 1) is transmitted to demultiplexer 603. The noisy speech power spectrum is separated into K samples corresponding to respective frequency components by demultiplexer 602, and the K samples are supplied to respective dividers $601_0$ to $601_{K-1}$. The estimated noise power spectrum is separated into K samples corresponding to respective frequency components by demultiplexer 603, and the K samples are supplied to respective dividers $601_0$ to $601_{K-1}$. Dividers $601_0$ to $601_{K-1}$ divide the supplied noisy speech power spectrum by the supplied estimated noise power spectrum, thus determining frequency-dependent SNR $\gamma_n(k)$ according to equation (12), and transmit the frequency-dependent SNR $\gamma_n(k)$ to multiplexer 604:

$$\gamma_n(k) = \frac{|Y_n(k)|^2}{\lambda_n(k)} \quad (12)$$

where $\lambda_n(k)$ represents the estimated noise power spectrum. Multiplexer 604 multiplexes the transmitted K frequency-dependent SNRs, and outputs the multiplexed SNR as an a-posteriori SNR.

As shown in FIG. 10, a-priori SNR estimator 7 included in the noise suppressor shown in FIG. 1 has multiplexed range limitation processor 701, a-posteriori SNR memory 702, spectral gain memory 703, multiplexed multipliers 704, 705, weight memory 706, multiplexed weighted adder 707, and adder 708.

In a-priori SNR estimator 7, the a-posteriori SNRs $\gamma_n(k)$ (k=0, 1, ..., K−1) supplied from frequency-dependent SNR calculator 6 (FIG. 6) are transmitted to a-posteriori SNR memory 702 and adder 708. A-posteriori SNR memory 702 stores a-posteriori SNR $\gamma_n(k)$ in the $n^{th}$-frame and transmits a-posteriori SNR $\gamma_{n-1}(k)$ in the $(n-1)^{th}$-frame to multiplexed multiplier 705. The spectral gains $\overline{G}_n(k)$ (k=0, 1, ..., K−1) supplied from spectral gain generator 8 are transmitted to spectral gain memory 703. Spectral gain memory 703 stores spectral gain $\overline{G}_n(k)$ in the $n^{th}$-frame and transmits spectral gain $\overline{G}_{n-1}(k)$ in the $(n-1)^{th}$-frame to multiplexed multiplier 704. Multiplexed multiplier 704 squares the supplied spectral gain $\overline{G}_{n-1}(k)$ to determine $\overline{G}^2_{n-1}(k)$ and transmits $\overline{G}^2_{n-1}(k)$ to multiplexed multiplier 705. Multiplexed multiplier 705 multiplies $\overline{G}^2_{n-1}(k)$ and $\gamma_{n-1}(k)$ for k=0, 1, ..., K−1 to determine $\overline{G}^2_{n-1}(k)\gamma_{n-1}(k)$, and transmits $\overline{G}^2_{n-1}(k)\gamma_{n-1}(k)$ as past estimated SNR 922 to multiplexed weighted adder 707. Multiplexed multipliers 704, 705 are identical in arrangement to multiplexed multiplier 17 already described with reference to FIG. 5 and will not be described here.

The other terminal of adder 708 is supplied with −1, so that the sum $\gamma_n(k)-1$ is transmitted to multiplexed range limitation processor 701. Multiplexed range limitation processor 701 processes the sum $\gamma_n(k)-1$ supplied from adder 708 with a range limitation operator P[·], and transmits the result $P[\gamma_n(k)-1]$ as instantaneous estimated SNR 921 to multiplexed weighted adder 707. P[χ] is defined as (13):

$$P[x] = \begin{cases} x, & x > 0 \\ 0, & \text{otherwise} \end{cases} \quad (13)$$

Multiplexed weighted adder 707 is also supplied with weight 923 from weight memory 706. Multiplexed weighted adder 707 determines estimated a-priori SNR 924 using instantaneous estimated SNR 921, past estimated SNR 922, and weight 923, which are supplied thereto. If weight 923 is represented by α and estimated a-priori SNR 924 is represented by $\hat{\xi}_n(k)$, then $\hat{\xi}_n(k)$ is calculated according to equation (14):

$$\hat{\xi}_n(k) = \alpha\gamma_{n-1}(k)\overline{G}_{n-1}^2(k) + (1-\alpha)P[\gamma_n(k)-1] \quad (14)$$

where $\overline{G}^2_{-1}(k)\gamma_{-1}(k) = 1$.

As shown in FIG. 11, above-described multiplexed range limitation processor 701 has constant memory 7011, K maximum value selectors $7012_0$ to $7012_{K-1}$, demultiplexer 7013, and multiplexer 7014. In multiplexed range limitation processor 701, demultiplexer 7013 is supplied with $\gamma_n(k)-1$ from adder 708 (FIG. 10). Demultiplexer 7013 splits the supplied $\gamma_n(k)-1$ into K frequency-dependent components and supplies frequency-dependent components respectively to maximum value selectors $7012_0$ to $7012_{K-1}$, whose other input terminals are supplied with zero from constant memory 7011. Maximum value selectors $7012_0$ to $7012_{K-1}$ compare $\gamma_n(k)-1$ with zero, and transmit larger values to multiplexer 7014. This maximum value selecting calculation corresponds to the calculation according to equation (13). Multiplexer 7014 multiplexes the supplied values and outputs the multiplexed value.

As shown in FIG. 12, multiplexed weighted adder 707 has K weighted adders $7071_0$ to $7071_{K-1}$, demultiplexers 7072, 7074, and multiplexer 7075. In multiplexed weighted adder 707, demultiplexer 7072 is supplied with $P[\gamma_n(k)-1]$ as instantaneous estimated SNR 921 from multiplexed range limitation processor 701 (FIG. 10). Demultiplexer 7072 separates $P[\gamma_n(k)-1]$ into K frequency-dependent components, and transmit the frequency-dependent components as frequency-dependent instantaneous estimated SNRs $921_0$ to $921_{K-1}$ to respective weighted adders $7071_0$ to $7071_{K-1}$. Demultiplexer 7074 is supplied with $\overline{G}^2_{n-1}(k)\gamma_{n-1}(k)$ as past estimated SNR 922 from multiplexed multiplier 705 (FIG. 10). Demultiplexer 7074 separates $\overline{G}^2_{n-1}(k)\gamma_{n-1}(k)$ into K frequency-dependent components, and transmits the frequency-dependent components as past frequency-dependent estimated SNRs $922_0$ to $922_{K-1}$ to respective weighted adders $7071_0$ to $7071_{K-1}$. Weighted adders $7071_0$ to $7071_{K-1}$ are also supplied with weight 923. Weighted adders $7071_0$ to $7071_{K-1}$ carry out the weighted addition according to equation (14), and transmit the result as frequency-dependent estimated a-priori SNRs $924_0$ to $924_{K-1}$ to multiplexer 7075. Multiplexer 7075 multiplexes frequency-dependent estimated a-priori SNRs $924_0$ to $924_{K-1}$ and outputs the multiplexed result as estimated a-priori SNR 924. Operation and arrangement of each of weighted adders $7071_0$ to $7071_{K-1}$ are the same as weighted adder 407 already described above with reference to FIG. 4, and will not be described in detail. However, the weighted addition is calculated at all times.

FIG. 13 shows an example of an arrangement of spectral gain generator 8 included in the noise suppressor shown in FIG. 1. Spectral gain generator 8 has K spectral gain search units $801_0$ to $801_{K-1}$, demultiplexers 802, 803, and multiplexer 804. In spectral gain generator 8, demultiplexer 802 is supplied with the a-posteriori SNR from frequency-dependent SNR calculator 6 (FIG. 1). Demultiplexer 802 separates the supplied a-posteriori SNR into K frequency-dependent components and transmits the K frequency-dependent components respectively to spectral gain search units $801_0$ to $801_{K-1}$. Demultiplexer 803 is supplied with the estimated a-priori SNR from a-priori SNR estimator 7 (FIG. 1). Demultiplexer 803 separates the supplied estimated a-priori SNR into K frequency-dependent components and transmits the K frequency-dependent components respectively to spectral gain search units $801_0$ to $801_{K-1}$. Spectral gain search units $801_0$ to $801_{K-1}$ search for spectral gains corresponding to the a-posteriori SNR and the estimated a-priori SNR which have been supplied, and transmit the results to multiplexer 804. Multiplexer 804 multiplexes the supplied spectral gains and outputs the multiplexed result.

FIG. 14 shows an example of an arrangement of spectral gain search units $801_0$ to $801_{K-1}$. Since spectral gain search units $801_0$ to $801_{K-1}$ are identical in arrangement to each other, they are represented as spectral gain search unit 801 in FIG. 14. Spectral gain search unit 801 has spectral gain table 8011 and address converters 8012, 8013. In spectral gain search unit 801, address converter 8012 is supplied with the frequency-dependent a-posteriori SNR from demultiplexer 802 (FIG. 13). Address converter 8012 converts the supplied frequency-dependent a-posteriori SNR into a corresponding address, and transmits the address to spectral gain table 8011. Address converter 8013 is supplied with the frequency-dependent estimated a-priori SNR from demultiplexer 803 (FIG. 13). Address converter 8013 converts the supplied frequency-dependent estimated a-priori SNR into a corresponding address, and transmits the address to spectral gain table 8011. Spectral gain table 8011 outputs spectral gains which are stored in areas corresponding to the addresses supplied from address converter 8012 and address converter 8013, as frequency-dependent spectral gains.

The conventional noise suppressor has been described above. With the conventional noise suppressor described above, the power spectrum of noise is updated in a silent section based on the output of the voice activity detector. Therefore, if the detected result from the voice activity detector is incorrect, then it is unable to estimate the power spectrum of noise accurately. When a speech section continues for a long time, since no silent section exists, the power spectrum of noise cannot be updated, and hence the accuracy with which to estimate the power spectrum of nonstationary noise is inevitably lowered. Accordingly, the conventional noise suppressor has residual noise and distortion in the enhanced speech.

According to the conventional suppression algorithm, the power spectrum of noise is estimated using the power spectrum of noisy speech. With the conventional algorithm, therefore, the power spectrum of noise cannot be estimated accurately under the influence of the power spectrum of speech contained in the noisy speech, so that noise tends to remain and distortion tends to be introduced in the enhanced speech. According to the conventional noise suppression algorithm, furthermore, because noise suppression is carried out using spectral gains determined by the same calculation method independent of the SNR, a sufficiently high quality cannot be achieved for the enhanced speech.

It is an object of the present invention to provide a method of noise suppression to produce enhanced speech with reduced distortion and noise by accurately estimating the power spectrum of noise independent of the performance of a voice activity detector.

Another object of the present invention is to provide an apparatus for noise suppression to produce enhanced speech with reduced distortion and noise by accurately estimating the power spectrum of noise without being governed by the performance of a voice activity detector.

Still another object of the present invention is to provide a method of noise suppression to produce enhanced speech suffering with reduced distortion and noise by accurately estimating the power spectrum of noise even in a speech section when the noise is nonstationary.

Yet still another object of the present invention is to provide an apparatus for noise suppression to produce enhanced speech with reduced distortion and noise by accurately estimating the power spectrum of noise even in a speech section when the noise is nonstationary.

A further object of the present invention is to provide a method of noise suppression to produce enhanced speech with reduced distortion and noise by using optimum spectral gains with respect to all SNR values.

A still further object of the present invention is to provide an apparatus for noise suppression to produce enhanced speech with reduced distortion and noise by using optimum spectral gains with respect to all SNR values.

DISCLOSURE OF THE INVENTION

According to a first aspect of the present invention, there is provided a method of noise suppression, comprising the steps of converting an input signal into a frequency-domain and determining a signal-to-noise ratio based on a frequency-domain signal, determining a spectral gain based on the signal-to-noise ratio, correcting the spectral gain to produce a modified spectral gain, weighting the frequency-domain signal using the modified spectral gain, and converting the weighted frequency-domain signal into a time-domain signal to produce an output signal where noise has been suppressed.

According to a second aspect of the present invention, there is provided an apparatus for noise suppression, comprising a signal-to-noise ratio calculator for converting an input signal into a frequency-domain and determining a signal-to-noise ratio using a frequency-domain signal, a spectral gain generator for determining a spectral gain based on the signal-to-noise ratio, a spectral gain modification unit for correcting the spectral gain to produce a modified spectral gain, a multiplier for weighting the frequency-domain signal using the modified spectral gain, and an inverse converter for converting the weighted frequency-domain signal into a time-domain signal.

In the above method of and apparatus for noise suppression, noise is suppressed using a spectral gain modified depending on the value of a signal-to-noise ratio (SNR). Specifically, the apparatus for noise suppression has the spectral gain modification unit which receives the value of the SNR and the spectral gain and calculates a modified spectral gain. By suppressing noise using the spectral gain modified depending on the value of the SNR, it is possible according to the present invention to obtain enhanced speech suffering little distortion and noise with respect to all SNR values.

According to a third aspect of the present invention, there is provided a method of noise suppression, comprising the steps of converting an input signal into a frequency-domain and weighting a frequency-domain signal to determine a weighted frequency-domain signal, estimating noise using the weighted frequency-domain signal, determining a signal-to-noise ratio using the estimated noise and the frequency-domain signal, determining a spectral gain based on the signal-to-noise ratio, weighting the frequency-domain signal using the spectral gain, and converting the weighted frequency-domain signal into a time-domain signal to produce an output signal where noise has been suppressed.

According to a fourth aspect of the present invention, there is provided an apparatus for noise suppression, at least comprising a signal-to-noise ratio calculator for converting an input signal into a frequency-domain and determining a signal-to-noise ratio using a frequency-domain signal, a spectral gain generator for determining a spectral gain based on the signal-to-noise ratio, a multiplier for weighting the frequency-domain signal using the spectral gain, and an inverse converter for converting the weighted frequency-domain signal into a time-domain signal, wherein the signal-to-noise ratio calculator includes a weighted frequency-domain signal calculator for weighting the frequency-domain signal to determine a weighted frequency-domain signal, and a noise estimation unit for estimating noise using the weighted frequency-domain signal.

In the above method of and apparatus for noise suppression, the power spectrum of noise is estimated using a weighted frequency-domain signal, i.e., a weighted noisy speech power spectrum. More specifically, the apparatus for noise suppression has the weighted frequency-domain signal calculator, i.e., a weighted noisy speech calculator, which calculates a weighted noisy speech power spectrum from a noisy speech power spectrum and an estimated noise power spectrum. Since a noise power spectrum in a present frame is estimated using a weighted noisy speech power spectrum which is determined from a noisy speech power spectrum and an estimated noise power spectrum in a preceding frame, it is possible to estimate the power spectrum of noise accurately regardless of the nature of noise, thus producing enhanced speech suffering little distortion and noise.

According to a fifth aspect of the present invention, there is provided a method of estimating noise, comprising the steps of determining a signal-to-noise ratio using an input signal and estimated noise, determining a weight using the signal-to-noise ratio, weighting the input signal with the weight to determine a weighted input signal, and determining estimated noise based on the weighted input signal.

According to a sixth aspect of the present invention, there is provided an apparatus for estimating noise, comprising a signal-to-noise calculator for determining a signal-to-noise ratio using an input signal and estimated noise, a weight calculator for determining a weight based on the signal-to-noise ratio, an input signal calculator for weighting the input signal with the weight to determine a weighted input signal, and a noise estimation unit for determining estimated noise based on the weighted input signal.

BEST MODE FOR CARRYING OUT THE INVENTION

Figure 1:
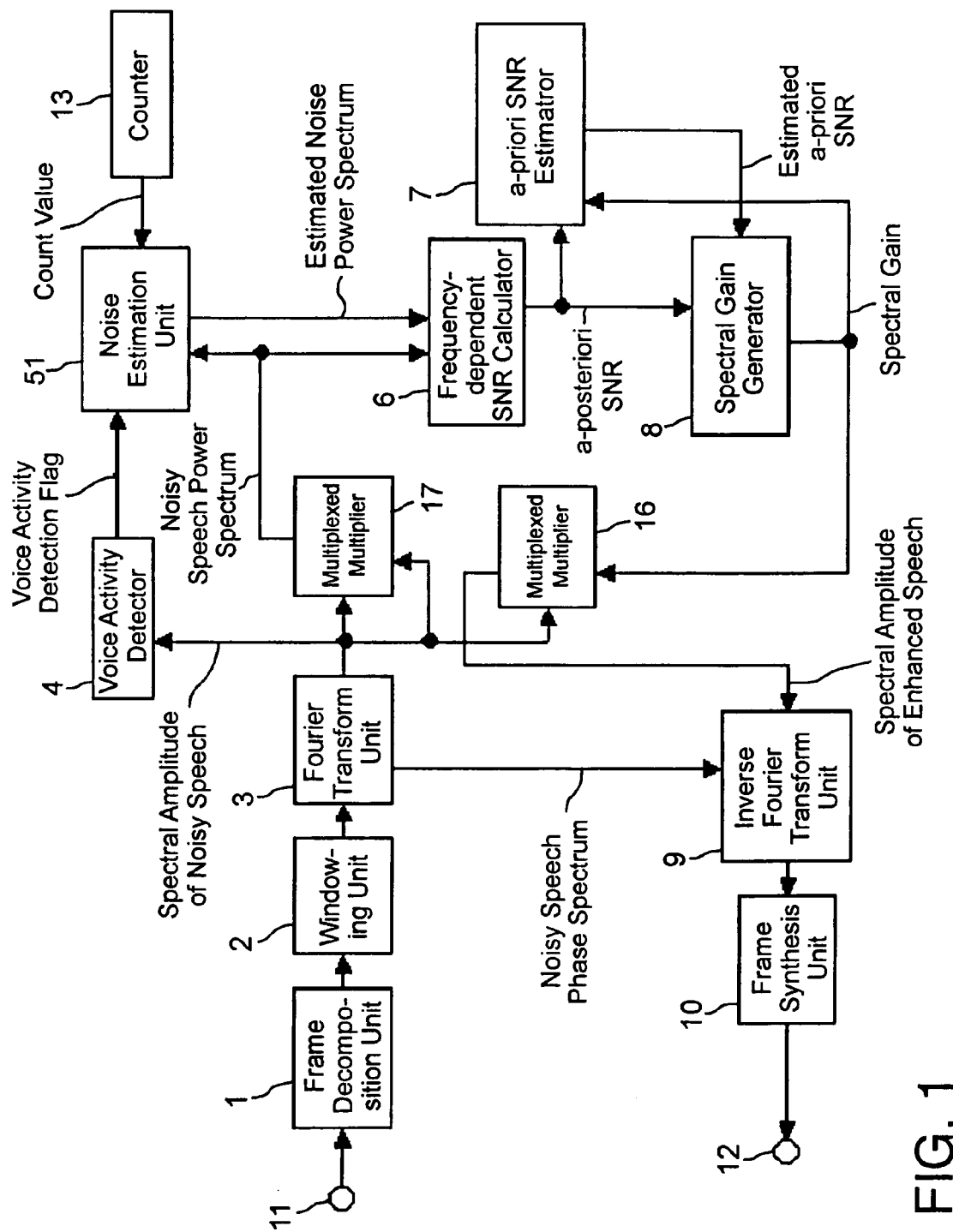
FIG. 1 is a block diagram showing an arrangement of a conventional noise suppressor.
Figure 2:
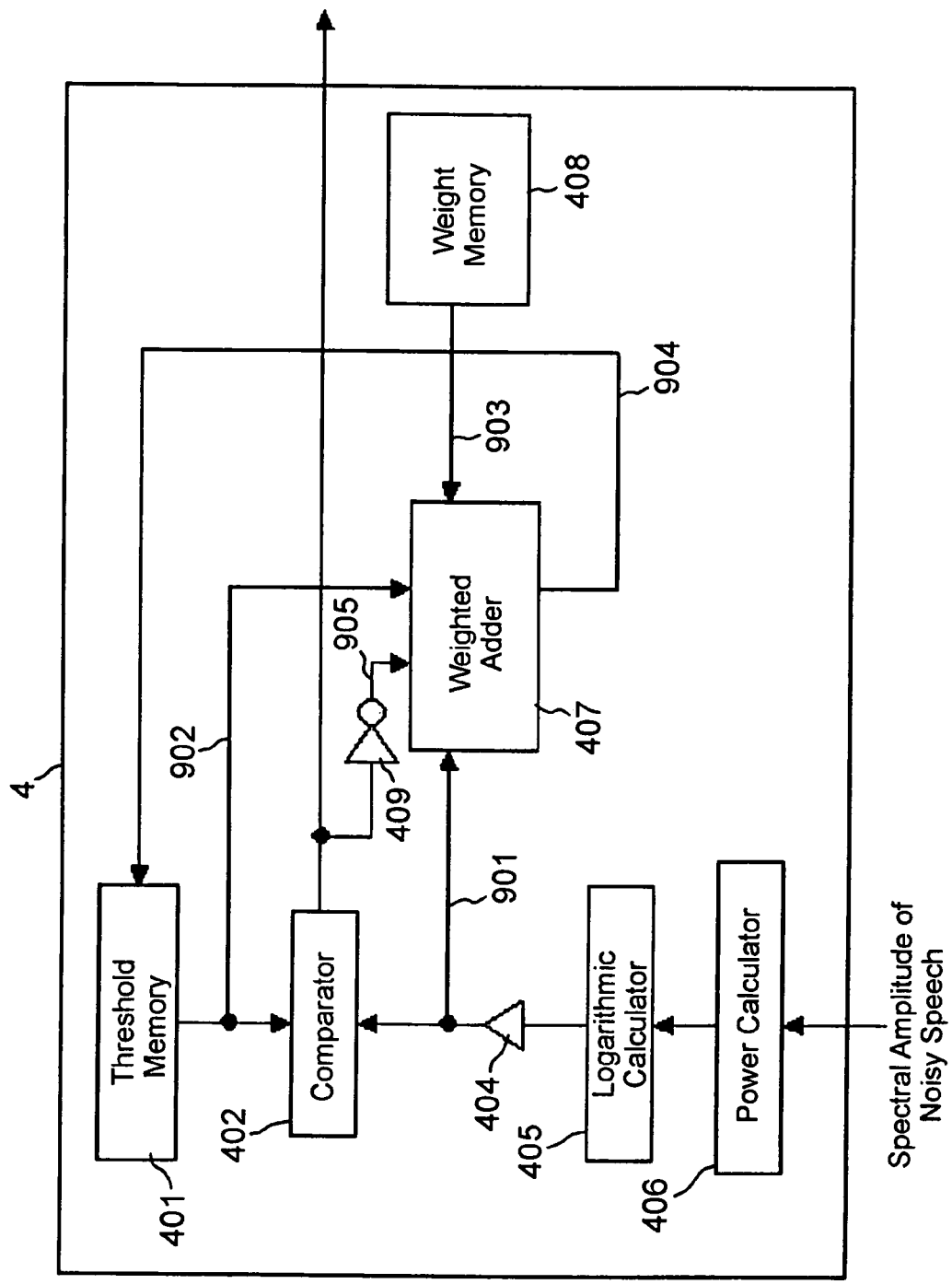
FIG. 2 is a block diagram showing an arrangement of a voice activity detector included in the noise suppressor shown in FIG. 1.
Figure 3:
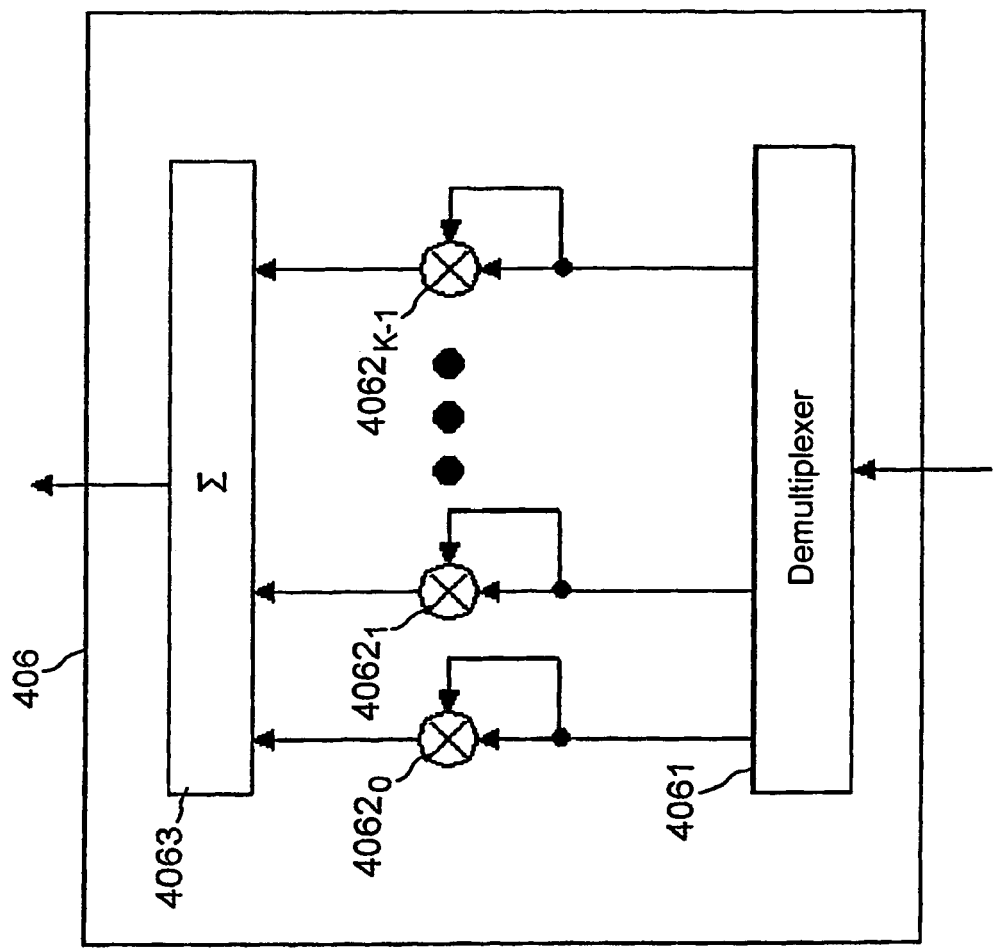
FIG. 3 is a block diagram showing an arrangement of a power calculator included in the voice activity detector shown in FIG. 2.
Figure 4:
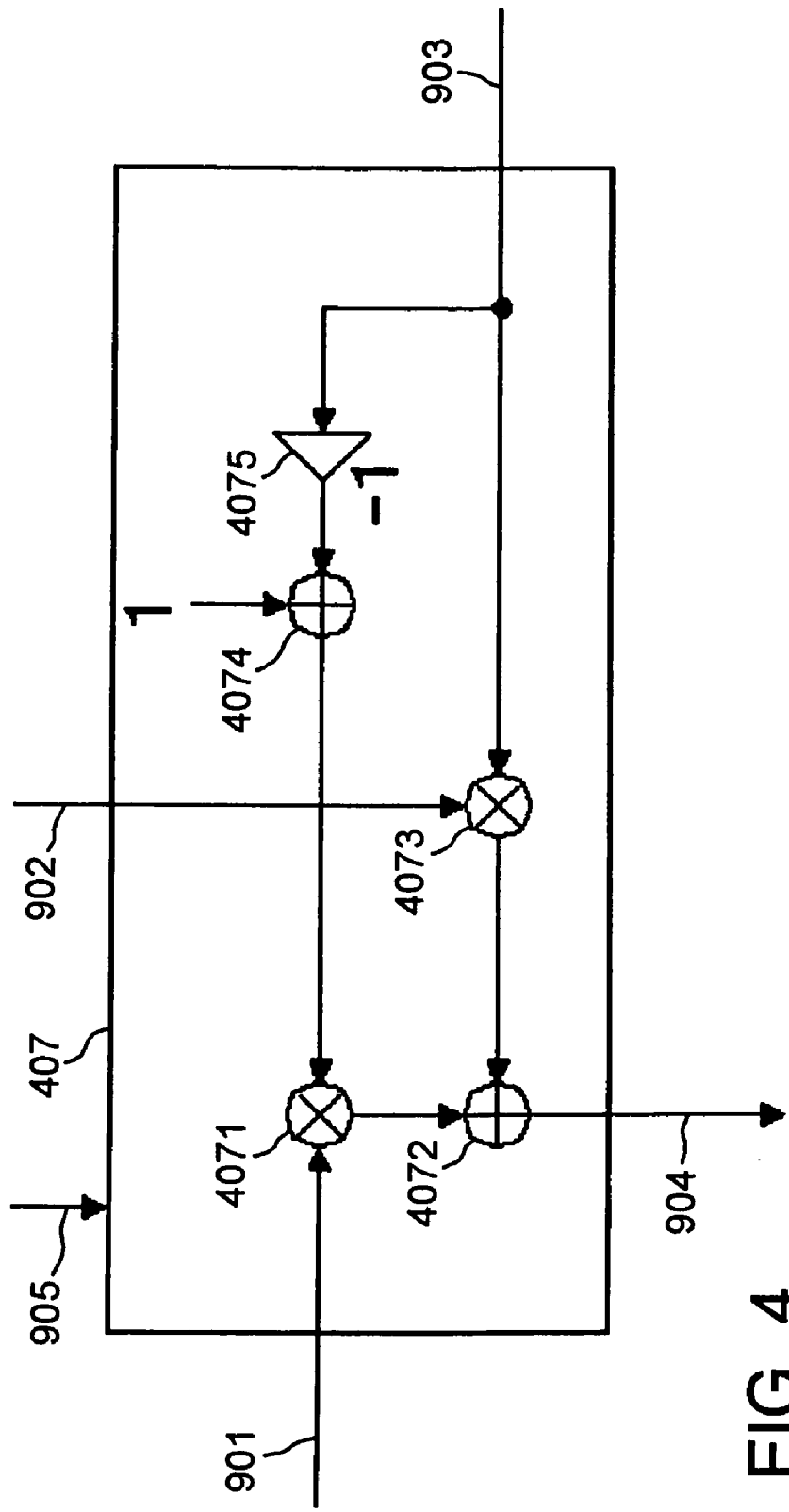
FIG. 4 is a block diagram showing an arrangement of a weighted adder included in the voice activity detector shown in FIG. 2.
Figure 5:
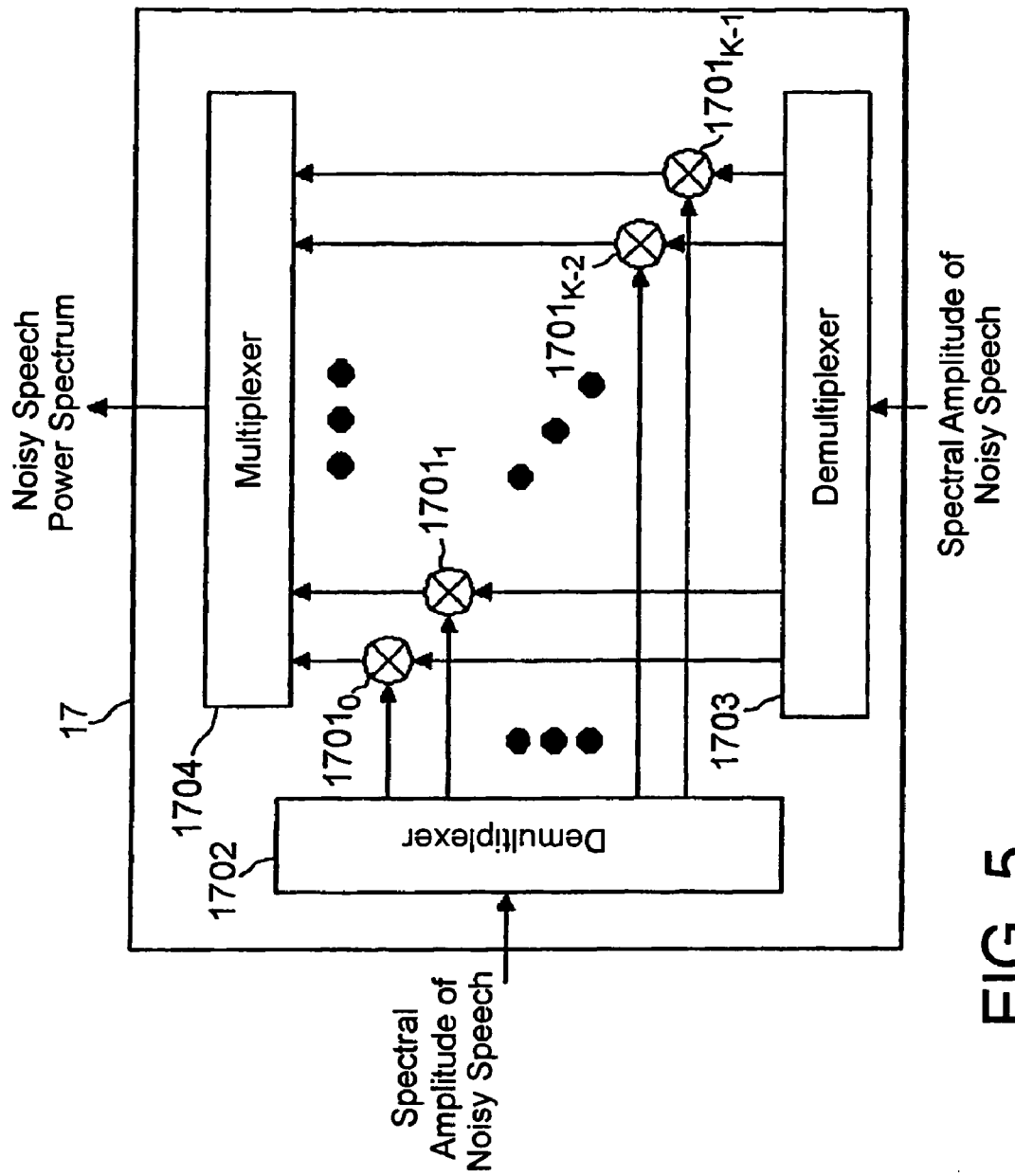
FIG. 5 is a block diagram showing an arrangement of a multiplexed multiplier included in the noise suppressor shown in FIG. 1.
Figure 6:
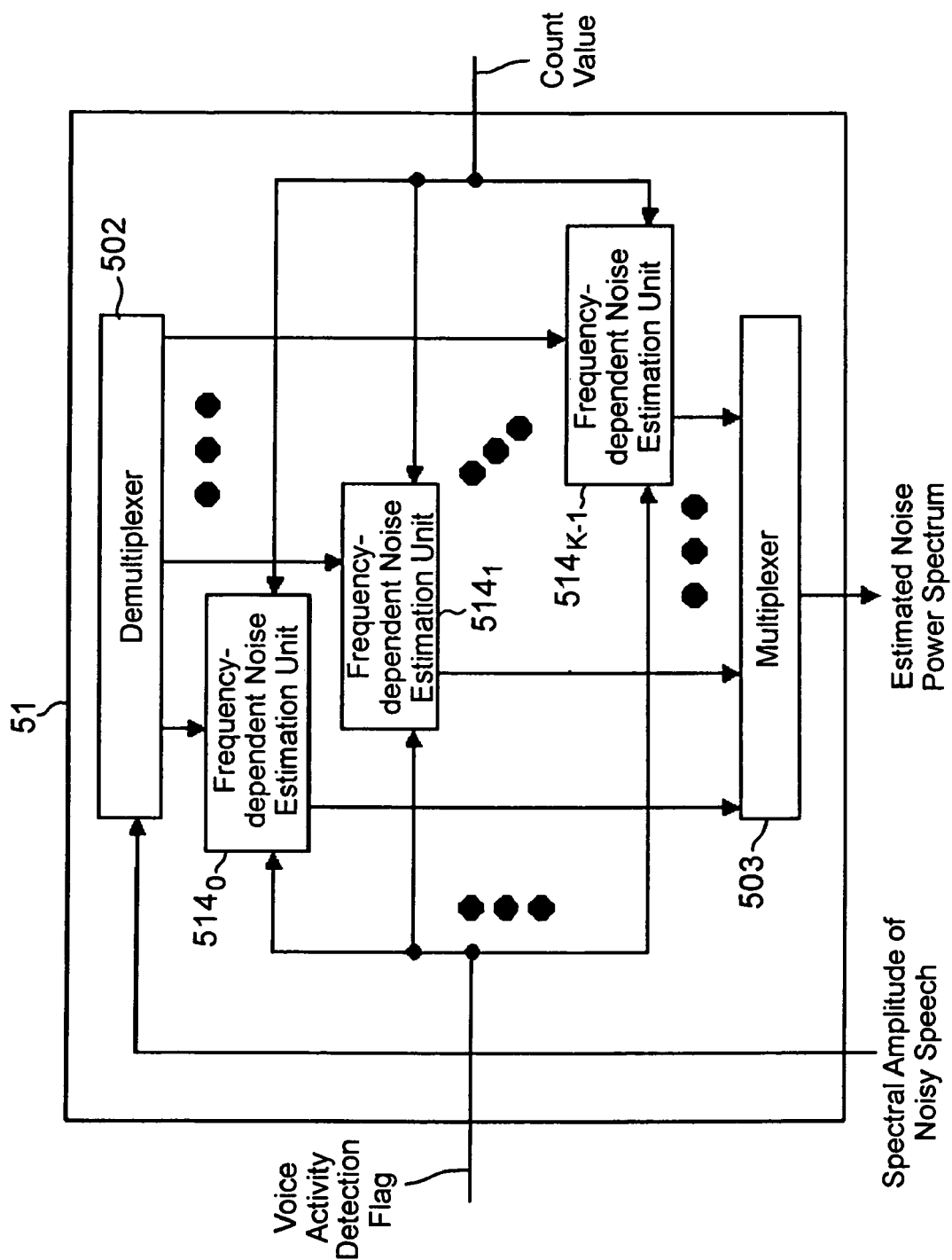
FIG. 6 is a block diagram showing an arrangement of a noise estimation unit included in the noise suppressor shown in FIG. 1.
Figure 7:
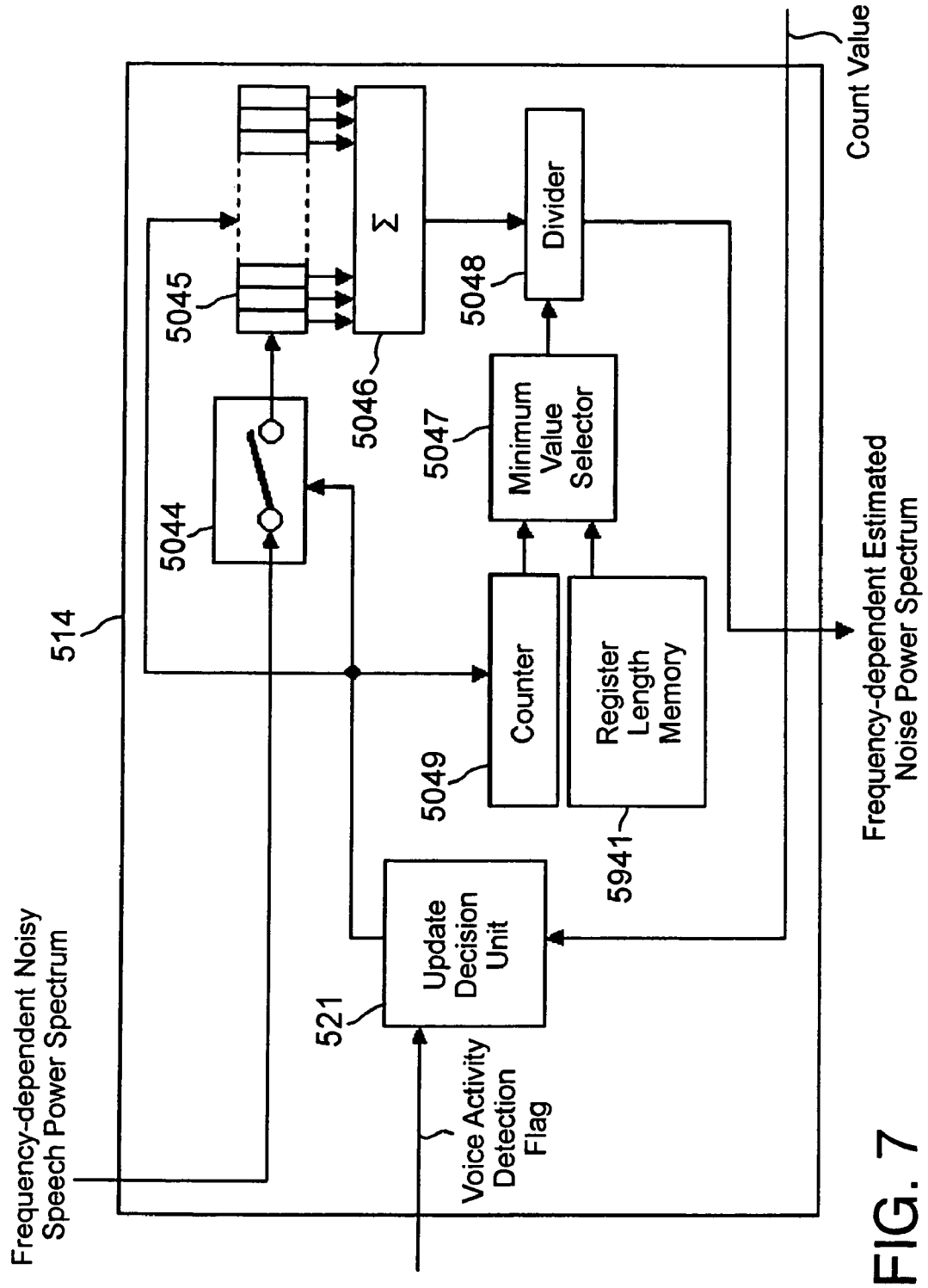
FIG. 7 is a block diagram showing an arrangement of a frequency-dependent noise estimation unit included in the noise estimation unit shown in FIG. 6.
Figure 8:
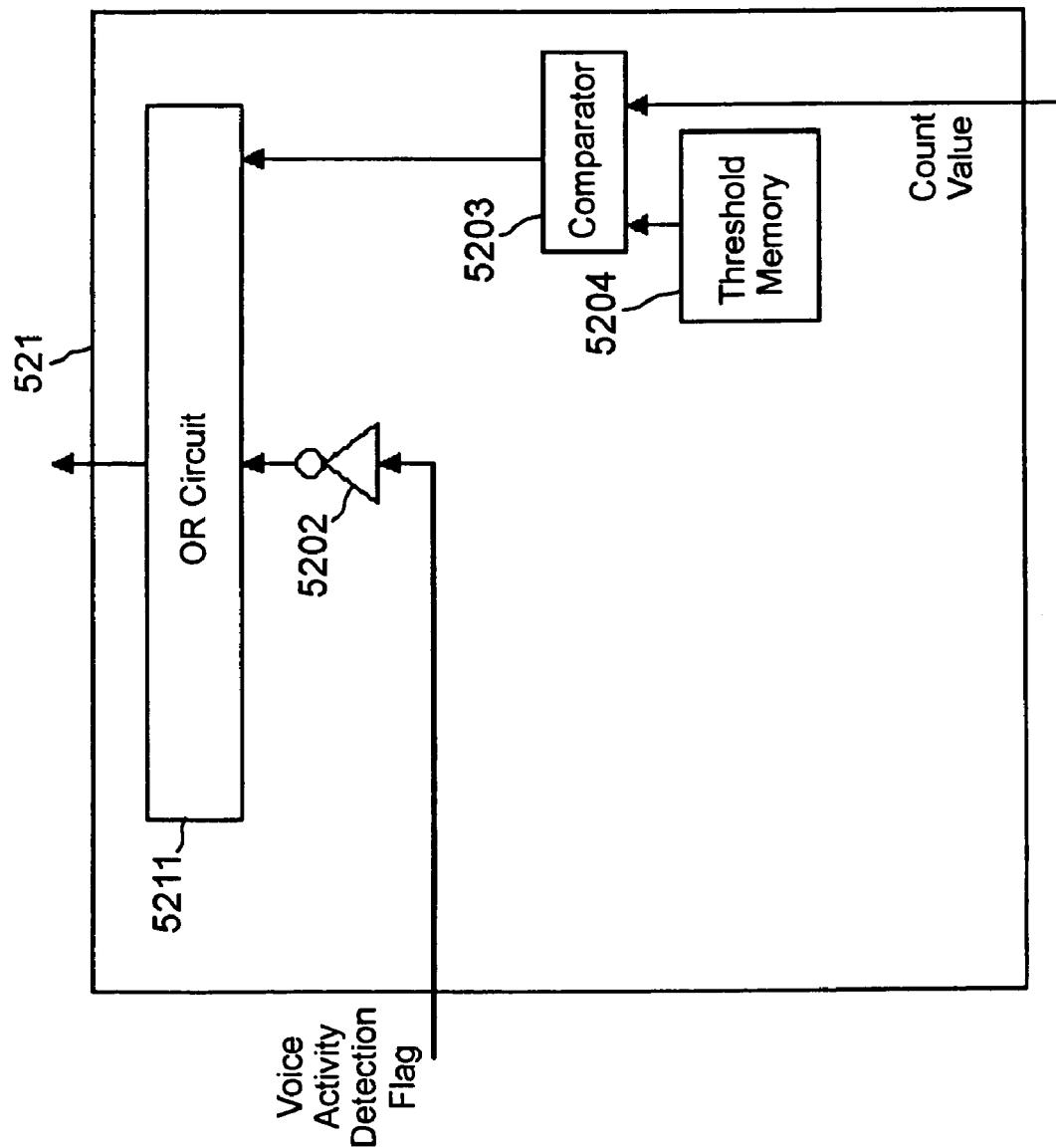
FIG. 8 is a block diagram showing an arrangement of an update decision unit included in the frequency-dependent noise estimation unit shown in FIG. 7.
Figure 9:
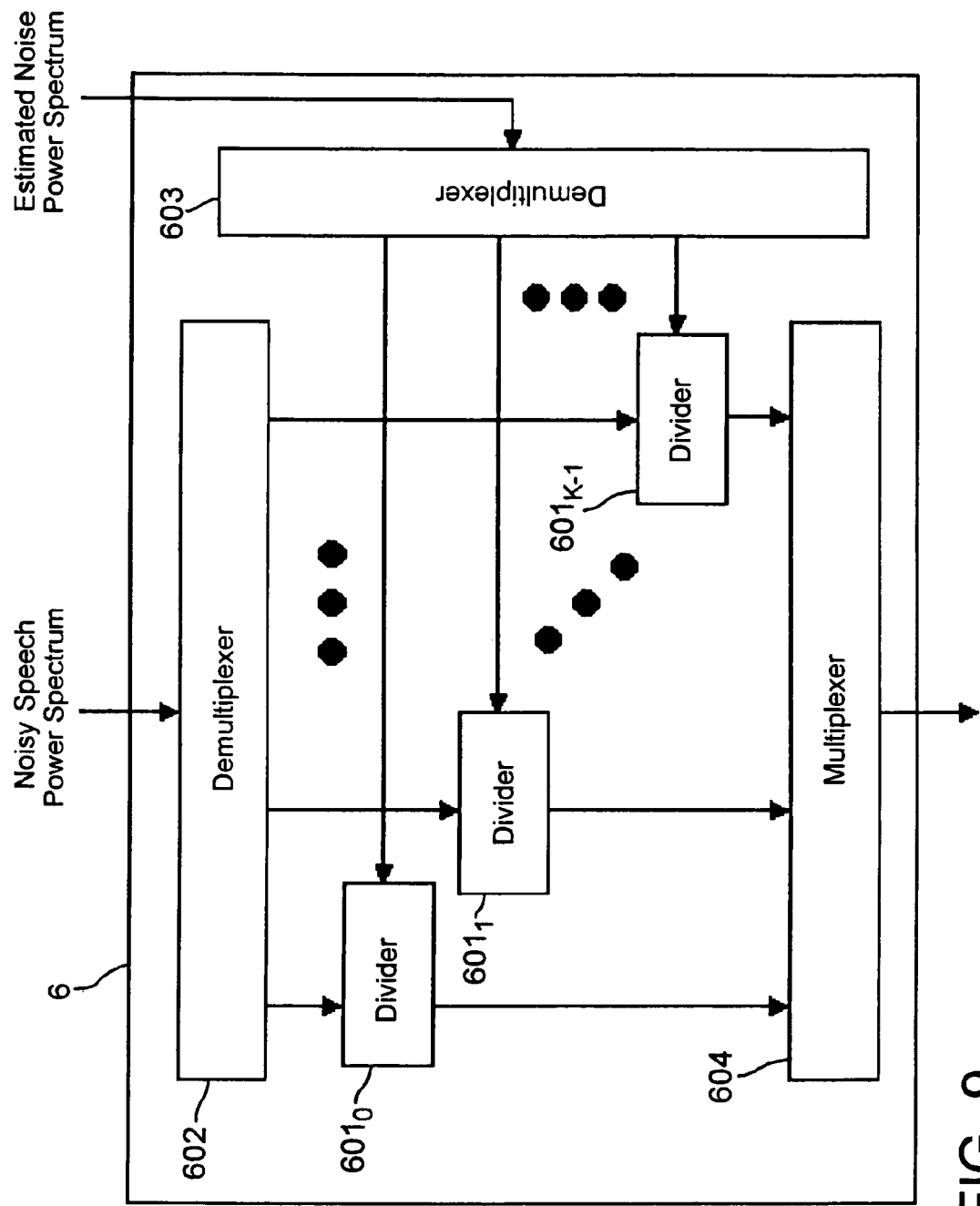
FIG. 9 is a block diagram showing an arrangement of a frequency-dependent SNR calculator included in the noise suppressor shown in FIG. 1.
Figure 15:
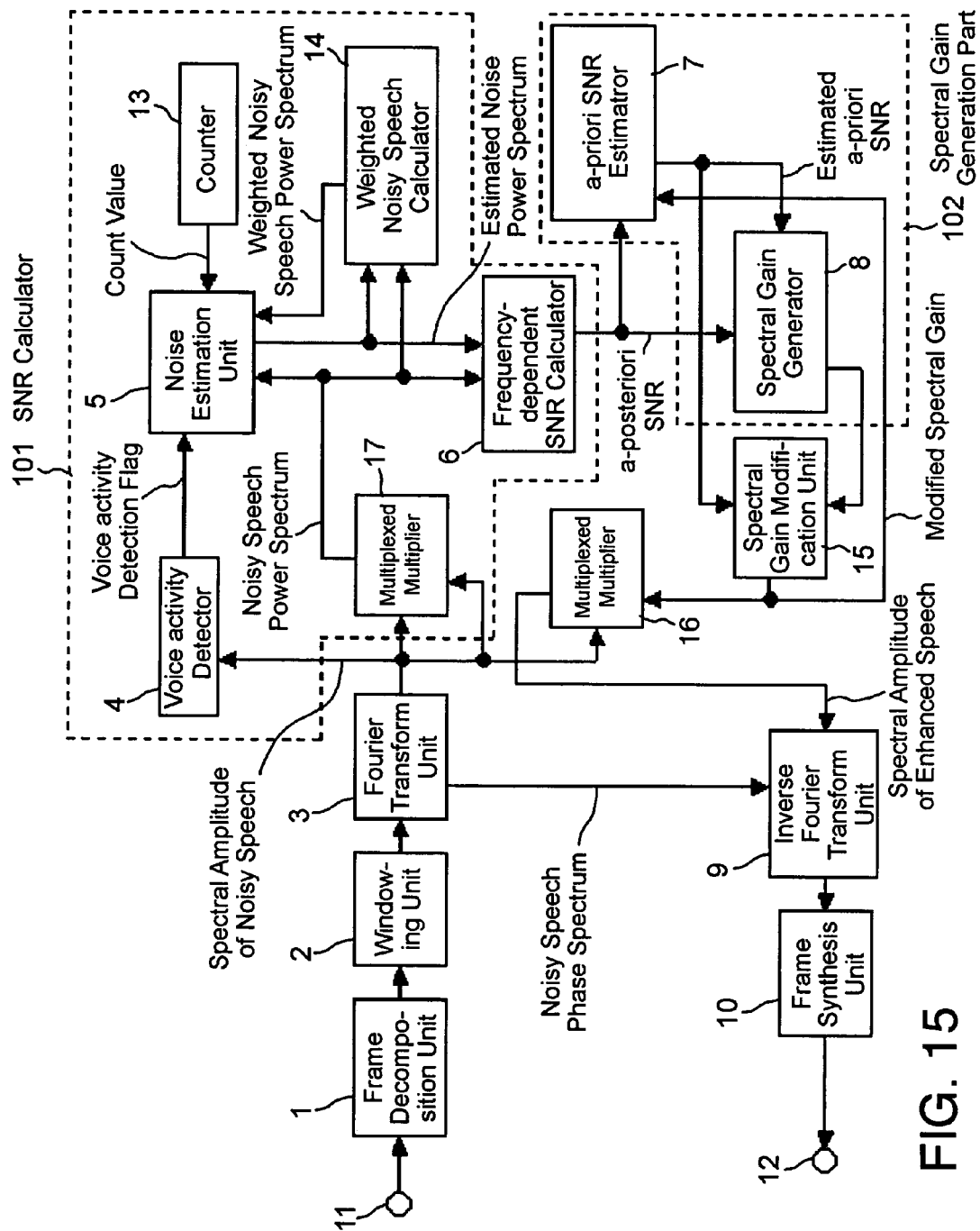
FIG. 15 is a block diagram showing an arrangement of a noise suppressor according to a first embodiment of the present invention.

A noise suppressor according to a first embodiment of the present invention shown in FIG. 15 is similar to the conventional noise suppressor shown in FIG. 1, but differs in that a noise estimation unit has a different internal structure, and weighted noisy speech calculator 14 and spectral gain modification unit 15 are added. Specifically, the noise suppressor according to the first embodiment has noise estimation unit 5 instead of noise estimation unit 51 in the noise suppressor shown in FIG. 1. Weighted noisy speech calculator 14 calculates a weighted noisy speech power spectrum from a noisy speech power spectrum and an estimated noise power spectrum, and outputs the calculated weighted noisy speech power spectrum to noise estimation unit 5. Spectral gain modification unit 15 calculates a modified spectral gain based on a spectral gain and an estimated a-priori SNR. Multiplexed multiplier 16 and a-priori SNR estimator 7 are supplied with the modified spectral gain instead of the spectral gain which is generated by spectral gain generator 8. Voice activity detector 4, noise estimation unit 5, frequency-dependent SNR calculator 6, counter 13, weighted noisy speech calculator 14, and multiplexed multiplier 17 jointly make up SNR (signal-to-noise ratio) calculator 101. A-priori SNR estimator 7 and spectral gain generator 8 jointly make up spectral gain generation unit 102.

In the following description, those components which are indicated by reference characters that are identical to those shown in FIGS. 1 to 14 are identical to those shown in FIGS. 1 to 14. The noise suppressor according to the present embodiment will be described below basically with respect to its differences from the conventional noise suppressor.

Figure 16:
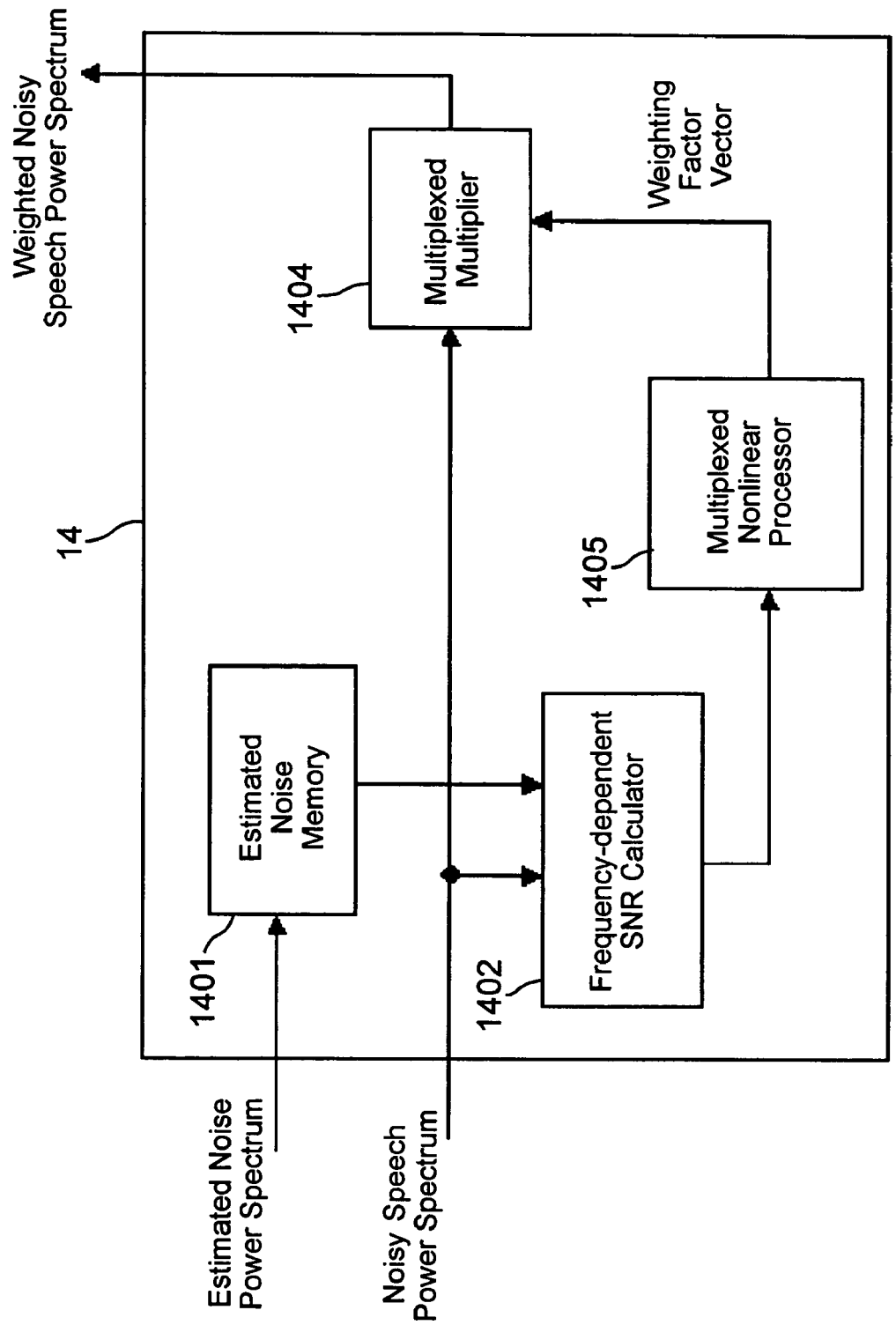
FIG. 16 is a block diagram showing an arrangement of a weighted noisy speech calculator included in the noise suppressor shown in FIG. 15.

As shown in FIG. 16, weighted noisy speech calculator 14 has estimated noise memory 1401, frequency-dependent SNR calculator 1402, multiplexed nonlinear processor 1405, and multiplexed multiplier 1404. Estimated noise memory 1401 stores the estimated noise power spectrum supplied from noise estimation unit 5 (FIG. 15), and outputs a stored estimated noise power spectrum in a previous frame to frequency-dependent SNR calculator 1402. Frequency-dependent SNR calculator 1402 calculates an SNR per frequency using the estimated noise power spectrum supplied from estimated noise memory 1401 and the noisy speech power spectrum supplied from multiplexed multiplier 17 (FIG. 15), and outputs the calculated SNR to multiplexed nonlinear processor 1405. Multiplexed nonlinear processor 1405 calculates a weighting factor vector using the SNR supplied from frequency-dependent SNR calculator 1402, and outputs the weighting factor vector to multiplexed multiplier 1404. Multiplexed multiplier 1404 calculates the product, per frequency, of the noisy speech power spectrum supplied from multiplexed multiplier 17 (FIG. 16) and the weighting factor vector supplied from multiplexed nonlinear processor 1405, and outputs a weighted noisy speech power spectrum to estimated noise memory 5 (FIG. 15). The weighted noisy speech power spectrum corresponds to a weighted amplitude component.

In weighted noisy speech calculator 14, frequency-dependent SNR calculator 1402 is identical in arrangement to frequency-dependent SNR calculator 6 described above with reference to FIG. 9, and multiplexed multiplier 1404 is identical in arrangement to multiplexed multiplier 17 described above with reference to FIG. 5. Therefore, these will not be described in detail below.

Figure 17:
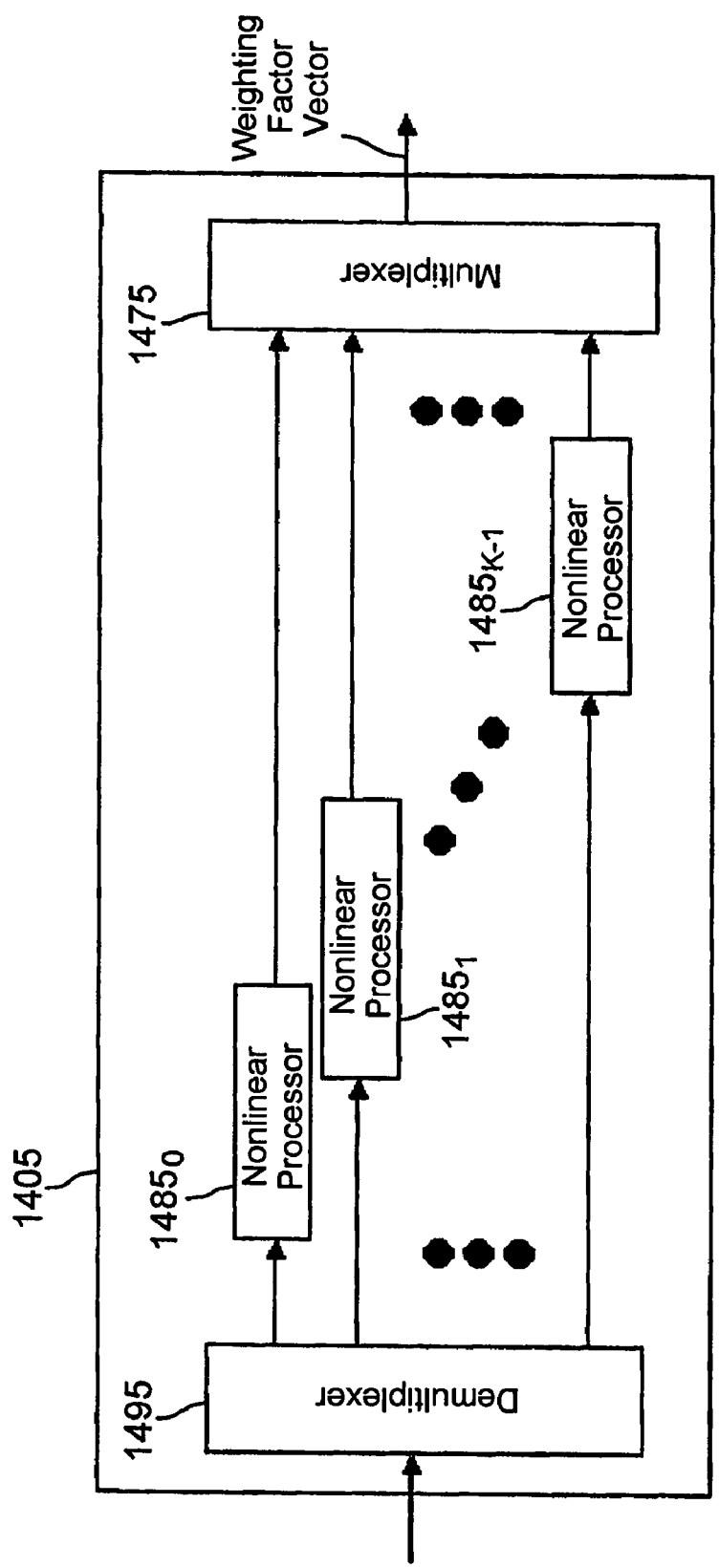
FIG. 17 is a block diagram showing an arrangement of a multiplexed nonlinear processor included in the weighted noisy speech calculator.
Figure 18:
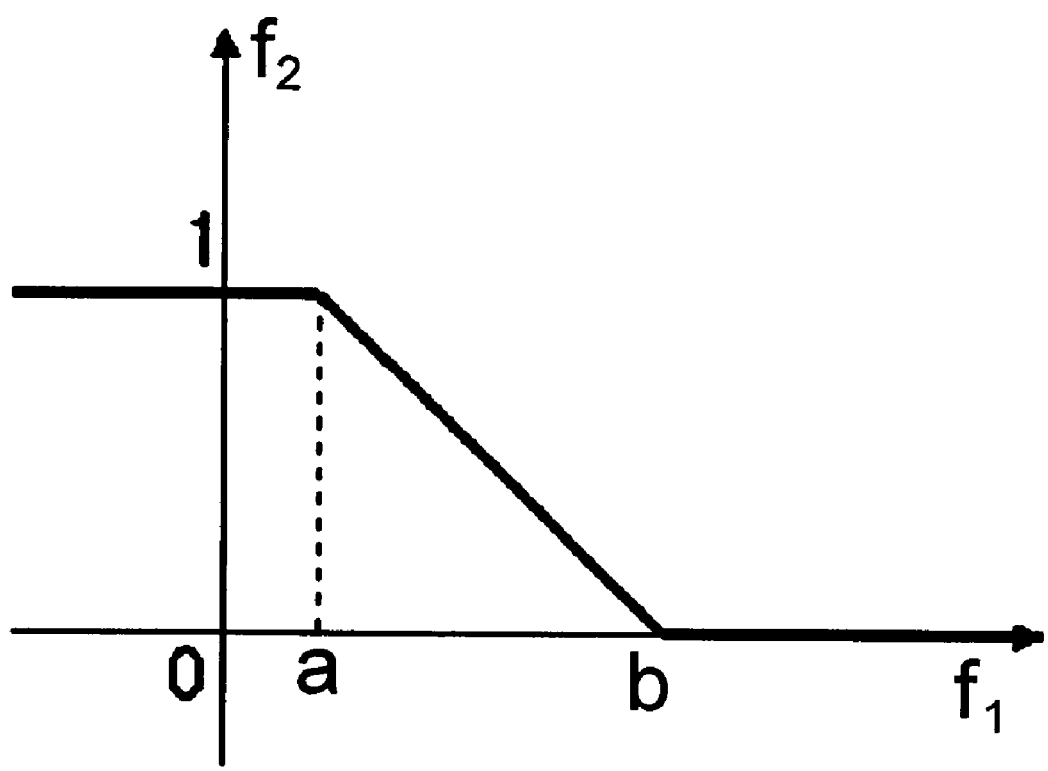
FIG. 18 is a graph showing an example of a nonlinear function used by the multiplexed nonlinear processor.

Structural details and operation of multiplexed nonlinear processor 1405 included in weighted noisy speech calculator 14 will be described in detail below with reference to FIG. 17. As shown in FIG. 17, multiplexed nonlinear processor 1405 has demultiplexer 1475, K nonlinear processors $1485_0$ to $1485_{K-1}$, and multiplexer 1495. Demultiplexer 1475 separates the SNR supplied from frequency-dependent SNR calculator 1402 (FIG. 16) into frequency-dependent SNRs, and outputs the frequency-dependent SNRs respectively to nonlinear processors $1485_0$ to $1485_{K-1}$. Nonlinear processors $1485_0$ to $1485_{K-1}$ outputs real valued numbers depending on the input values based on a nonlinear function. FIG. 18 shows an example of the nonlinear function. When an input value is represented by $f_1$, the nonlinear function shown in FIG. 18 has an output value $f_2$ expressed by equation (15):

$$f_2 = \begin{cases} 1, & f_1 \leq a \\ \dfrac{f_1 - b}{a - b}, & a < f_1 \leq b \\ 0, & \text{otherwise} \end{cases} \quad (15)$$

Each of nonlinear processors $1485_0$ to $1485_{K-1}$ processes the frequency-dependent SNR supplied from demultiplexer 1495 with the nonlinear function to determine weighting factor, and output the weighting factor to multiplexer 1475. Specifically, nonlinear processors $1485_0$ to $1485_{K-1}$ output weighting factors ranging from 1 to 0 depending on the SNRs such that they output 1 when the SNR is small and output 0 when the SNR is large. Multiplexer 1475 multiplexes the weighting factors output from nonlinear processors $1485_0$ to $1485_{K-1}$ and output a weighting factor vector to multiplexed multiplier 1404.

The weighting factors by which the noisy speech power spectrum is to be multiplied by multiplexed multiplier 1404 (FIG. 16) are of values depending on the SNRs. The weighting factors have smaller values as the SNRs are larger, i.e., the noisy speech contains a greater speech component. Estimated noise is updated using a noisy speech power spectrum in general. By weighting the noisy speech power spectrum used to update the estimated noise with the SNR, the influence of the speech component contained in the noisy speech power spectrum can be reduced for estimating noise with higher accuracy. While a nonlinear function is used to calculate weighting factors in this example, it is possible to use an SNR function expressed in another form than the nonlinear function, such as a linear function or a higher-degree polynomial.

Figure 19:
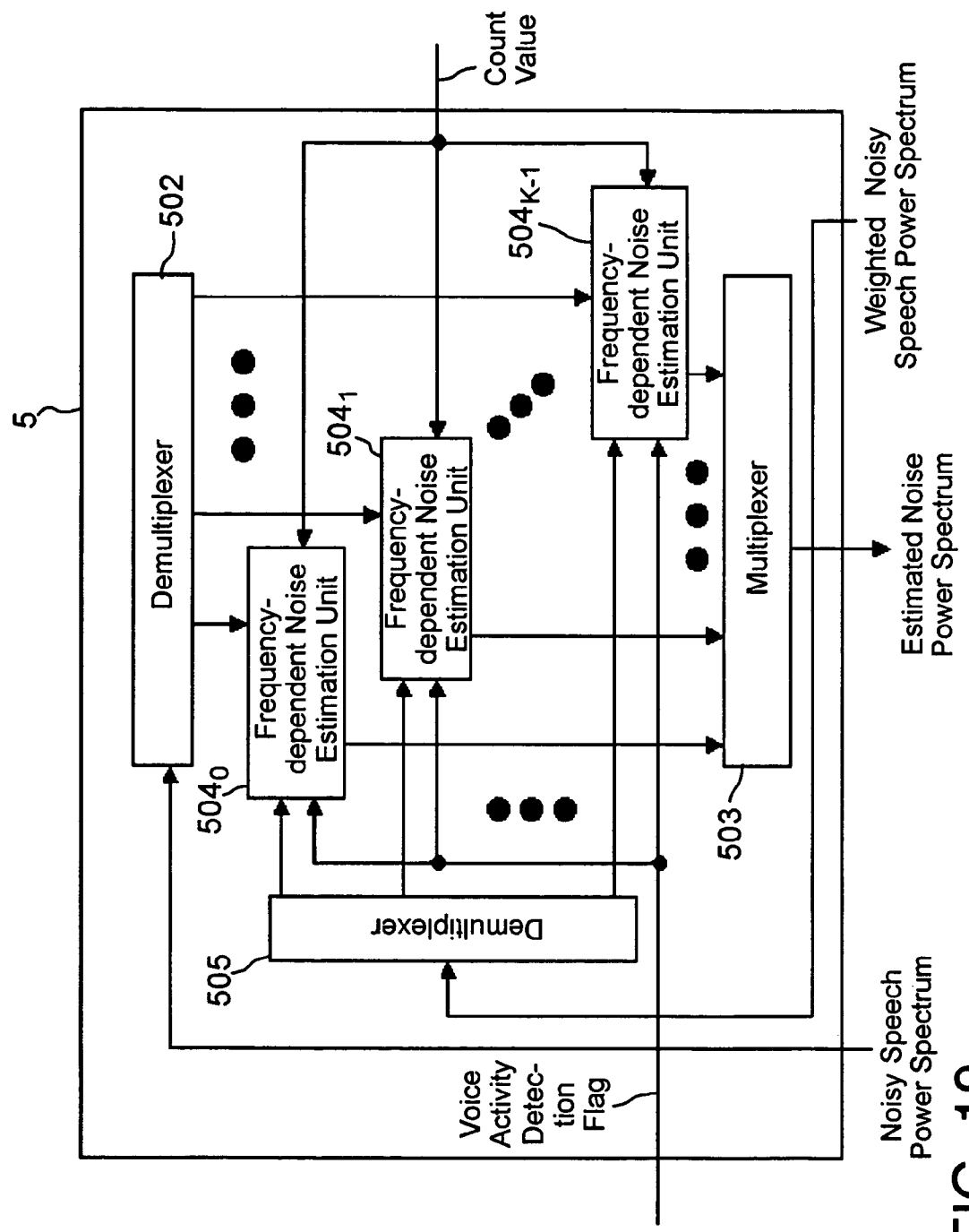
FIG. 19 is a block diagram showing an arrangement of a noise estimation unit included in the noise suppressor shown in FIG. 15.

FIG. 19 shows an arrangement of noise estimation unit 5 included in the noise suppressor. Noise estimation unit 5 is similar to noise estimation unit 51 used in the conventional noise suppressor shown in FIG. 6, except that it has demultiplexer 505, and frequency-dependent noise estimation units $514_0$ to $514_{K-1}$ are replaced with frequency-dependent noise estimation units $504_0$ to $504_{K-1}$. Noise estimation unit 5 will be described below basically with respect to these differences.

Demultiplexer 505 splits the weighted noisy speech power spectrum supplied from weighted noisy speech calculator 14 (FIG. 15) into frequency-dependent weighted noisy speech power spectrum, and output the frequency-dependent weighted noisy speech power spectrum respectively to frequency-dependent noise estimation units $504_0$ to $504_{K-1}$. Frequency-dependent noise estimation units $504_0$ to $504_{K-1}$ calculates frequency-dependent estimated noise power spectrum from the frequency-dependent noisy speech power spectrum supplied from demultiplexer 502, the frequency-dependent weighted noisy speech power spectrum supplied from demultiplexer 505, the voice activity detection flag supplied from voice activity detector 4 (FIG. 15), and the count value supplied from counter 13 (FIG. 15), and output the calculated frequency-dependent estimated noise power spectrum to multiplexer 503. Multiplexer 503 multiplexes the frequency-dependent estimated noise power spectrum supplied from frequency-dependent noise estimation units $504_0$ to $504_{K-1}$, and outputs a resultant estimated noise power spectrum to frequency-dependent SNR calculator 6 (FIG. 15) and weighted noisy speech calculator 14 (FIG. 15). An arrangement of frequency-dependent noise estimation units $504_0$ to $504_{K-1}$ will be described below.

Figure 20:
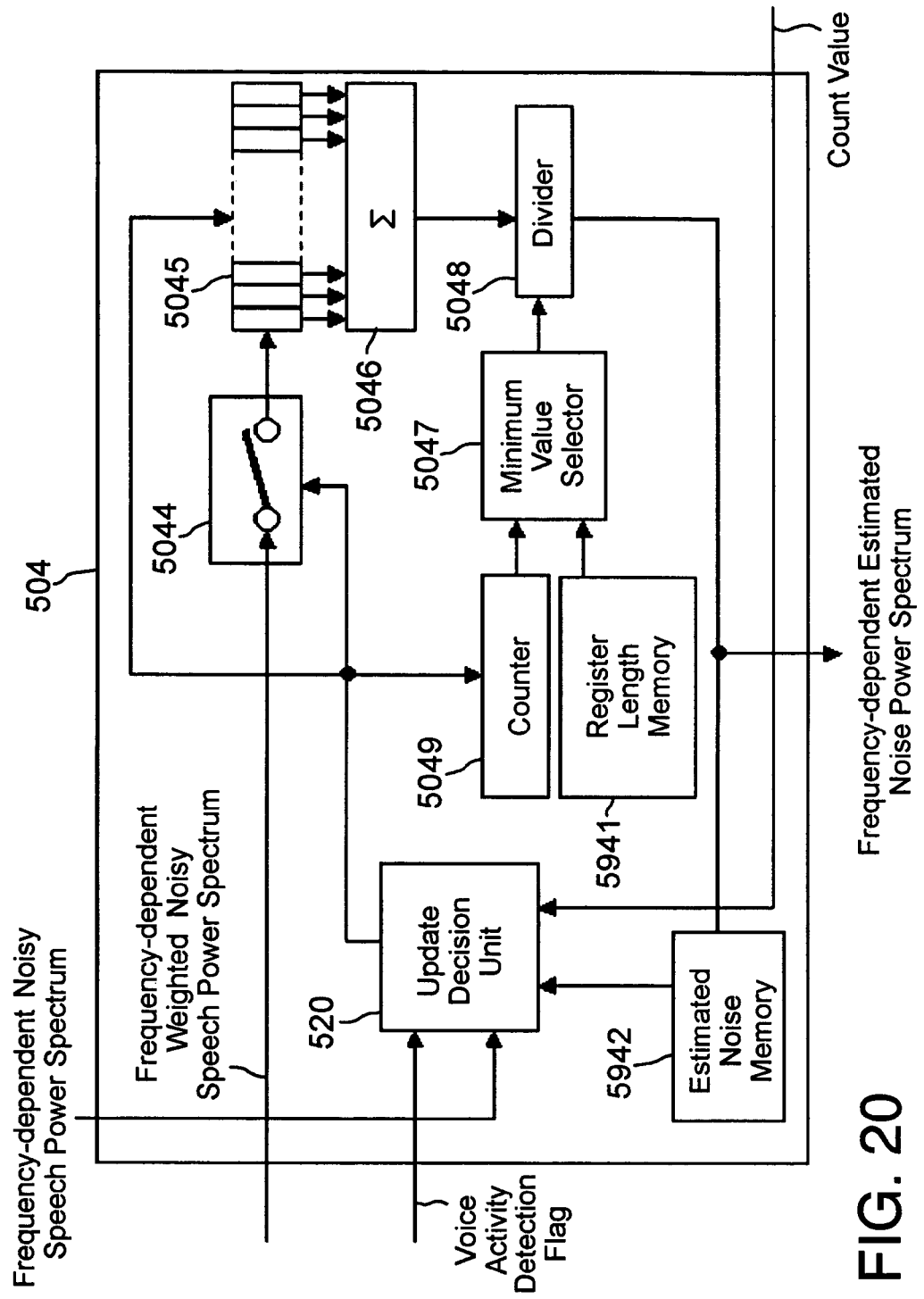
FIG. 20 is a block diagram showing an arrangement of a frequency-dependent noise estimation unit included in the noise estimation unit shown in FIG. 19.

FIG. 20 shows an arrangement of frequency-dependent noise estimation units $504_0$ to $504_{K-1}$. Since frequency-dependent noise estimation units $504_0$ to $504_{K-1}$ are identical in arrangement to each other, they are indicated as frequency-dependent noise estimation unit 504 in FIG. 20. Frequency-dependent noise estimation unit 504 used herein differs from frequency-dependent noise estimation unit 514 shown in FIG. 7 in that frequency-dependent noise estimation unit 504 has estimated noise memory 5942, update decision unit 521 is replaced with update decision unit 520, and a frequency-dependent weighted noisy speech power spectrum, rather than the frequency-dependent noisy speech power spectrum, is supplied to switch 5044. These differences occur because frequency-dependent noise estimation units $504_0$ to $504_{K-1}$ use the weighted noisy speech power spectrum, rather than the noisy speech power spectrum, in calculating estimated noise, and use estimated noise and noisy speech power spectrum in determining the updating of estimated noise. Estimated noise memory 5942 stores the frequency-dependent estimated noise power spectrum supplied from divider 5048 and outputs stored frequency-dependent estimated noise power spectrum in a previous frame to update decision unit 520.

Figure 21:
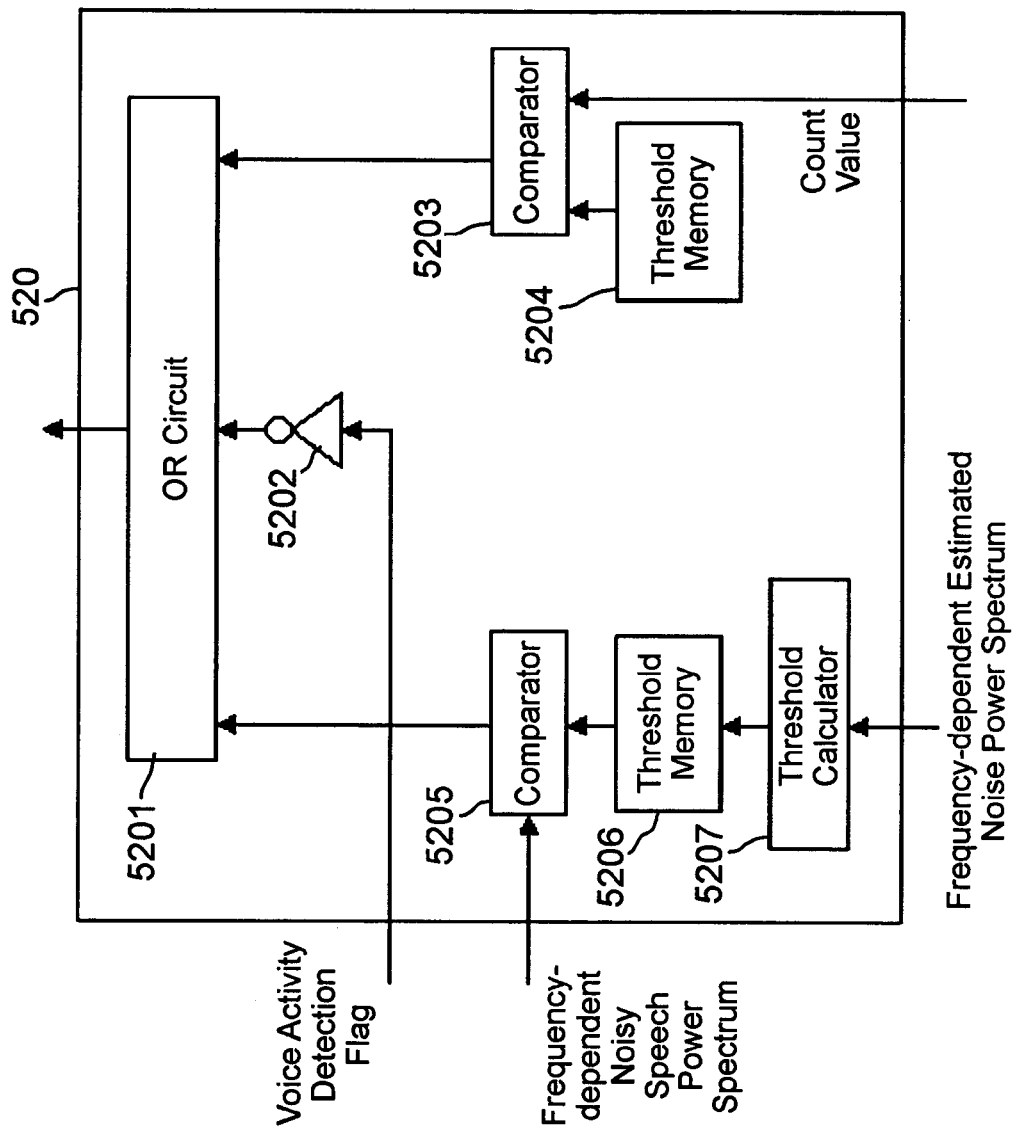
FIG. 21 is a block diagram showing an arrangement of an update decision unit included in the frequency-dependent noise estimation unit shown in FIG. 20.

FIG. 21 shows an arrangement of update decision unit 520. Update decision unit 520 differs from update decision unit 521 shown in FIG. 8 in that update decision unit 520 has comparator 5205, threshold memory 5206, and threshold calculator 5207, and OR circuit 5211 is replaced with OR circuit 5201. Update decision unit 520 will be described below basically with respect to these differences.

Threshold calculator 5207 calculates a value depending on the frequency-dependent estimated noise power spectrum supplied from estimated noise memory 5942 (FIG. 20), and outputs the calculated value as a threshold value to threshold memory 5206. According to the simplest process of calculating a threshold value, a multiple of the frequency-dependent estimated noise power spectrum by a constant is used as a threshold value. According to another process, a threshold value may be calculated using a higher-degree polynomial or a nonlinear function. Threshold memory 5206 stores a threshold value output from threshold calculator 5207, and outputs a stored threshold value in a previous frame to comparator 5205. Comparator 5205 compares the threshold value supplied from threshold memory 5206 with the frequency-dependent noisy speech spectrum supplied from demultiplexer 502 (FIG. 19). If the frequency-dependent noisy speech spectrum is smaller than the threshold value, comparator 5205 outputs "1" to OR circuit 5201. If the frequency-dependent noisy speech spectrum is greater than the threshold value, comparator 5205 outputs "0" to OR circuit 5201. Thus, comparator 5205 determines whether the noisy speech signal is noise or not based on the magnitude of the estimated noise power spectrum. OR circuit 5201 calculates logical sum of the output from comparator 5203, the output from NOT circuit 5202, and the output from comparator 5205, and outputs the result to switch 5044, shift register 5045, and counter 5049 (FIG. 20).

Update decision unit 520 thus outputs "1", thereby updating estimated noise, if the noisy speech power is small not only in an initial state and a silent section, but also in a speech section. Since a threshold value is calculated for each frequency, estimated noise can be updated for each frequency.

In FIG. 20, it is assumed that counter 5049 has a count value CNT, shift register 5045 has a register length N, and shift register 5045 stores frequency-dependent weighted noisy speech power spectrum $B_n(k)$ (n=0, 1, ..., N−1). The frequency-dependent estimated noise power spectrum $\lambda_n(k)$ supplied from divider 5048 is expressed by equation (16):

$$\lambda_n(k) = \begin{cases} \dfrac{1}{CNT} \sum_{n=0}^{CNT-1} B_n(k), & CNT < N \\ \dfrac{1}{N} \sum_{n=0}^{N-1} B_n(k), & \text{otherwise} \end{cases} \quad (16)$$

In other words, the frequency-dependent estimated noise power spectrum $\lambda_n(k)$ represents the average value of the frequency-dependent weighted noisy speech power spectrum stored in shift register 5045. The average value may be calculated using a weighted adder (recursive filter). An arrangement which employs a weighted adder to calculate the frequency-dependent estimated noise power spectrum $\lambda_n(k)$ will be described below.

Figure 22:
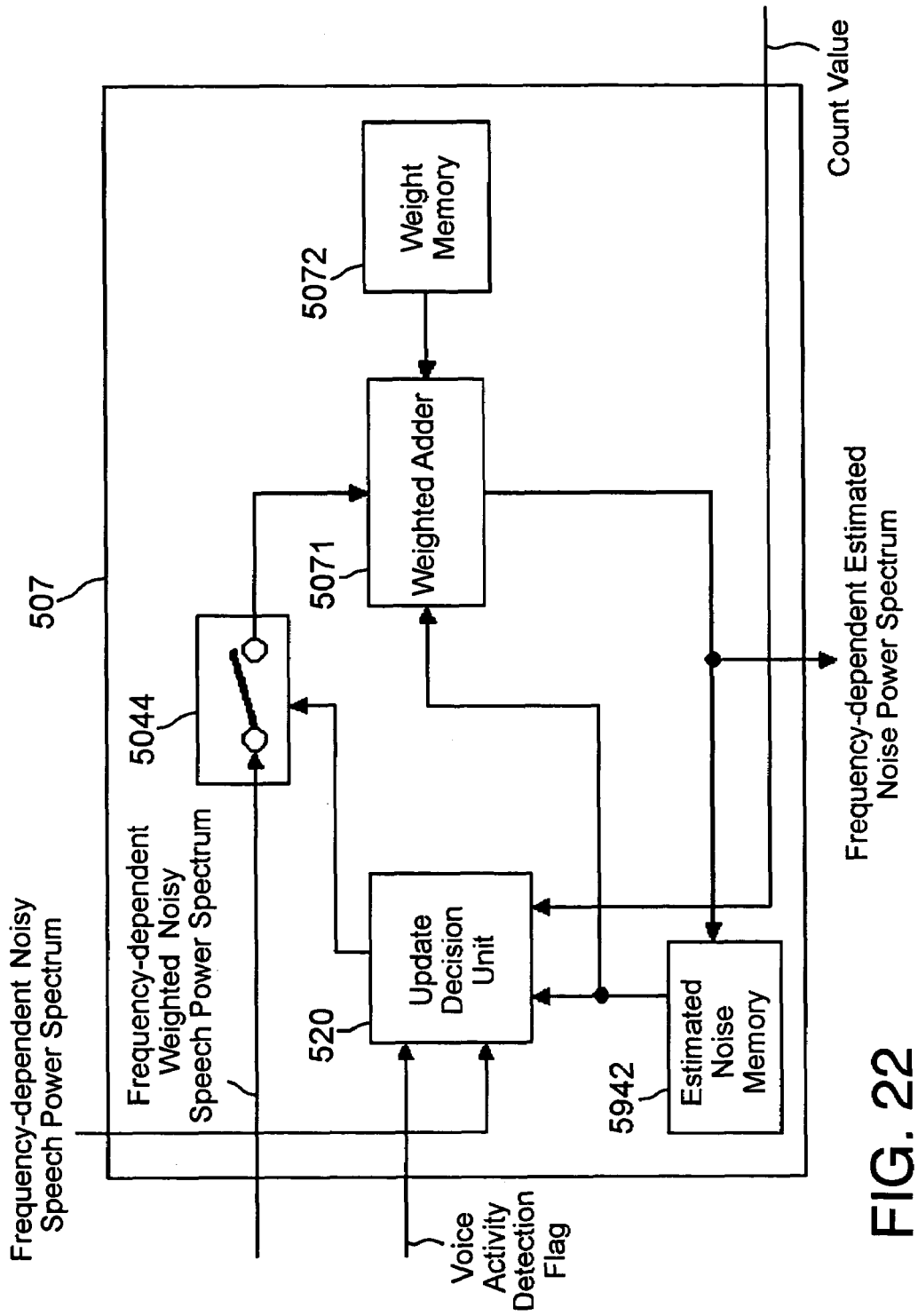
FIG. 22 is a block diagram showing a second example of the arrangement of a frequency-dependent noise estimation unit included in the noise estimation unit shown in FIG. 19.

FIG. 22 shows an arrangement of a second example of frequency-dependent noise estimation units $504_0$ to $504_{K-1}$. Since frequency-dependent noise estimation units $504_0$ to $504_{K-1}$ are identical in arrangement to each other, they are indicated as frequency-dependent noise estimation unit 507 in FIG. 22. Frequency-dependent noise estimation unit 507 shown in FIG. 22 has weighted adder 5071 and weight memory 5072 which are added in place of shift register 5045, adder 5046, minimum value selector 5047, divider 5048, counter 5049, and register length memory 5941 in frequency-dependent noise estimation unit 504 shown in FIG. 20.

Weighted adder 5071 calculates frequency-dependent estimated noise using the frequency-dependent estimated noise power spectrum in the previous frame supplied from estimated noise memory 5942, the frequency-dependent weighted noisy speech power spectrum supplied from switch 5044, and the weighting factor output from weight memory 5072, and outputs the calculated frequency-dependent estimated noise to multiplexer 503. Specifically, if the weighting factor stored in weight memory 5072 is represented by δ and the frequency-dependent weighted noisy speech power spectrum is represented by $|\overline{Y}_n(k)|^2$, then the frequency-dependent estimated noise power spectrum $\lambda_n(k)$ output from weighted adder 5071 is expressed by equation (17). Since weighted adder 5071 is identical in arrangement to weighted adder 407 described above with reference to FIG. 4, weighted adder 5071 will not be described in detail. However, the weighted addition is calculated at all times in weighted adder 5071.

$$\lambda_n(k)=\delta\lambda_{n-1}(k)+(1-\delta)|\overline{Y}_n(k)|^2 \qquad (17)$$

Figure 23:
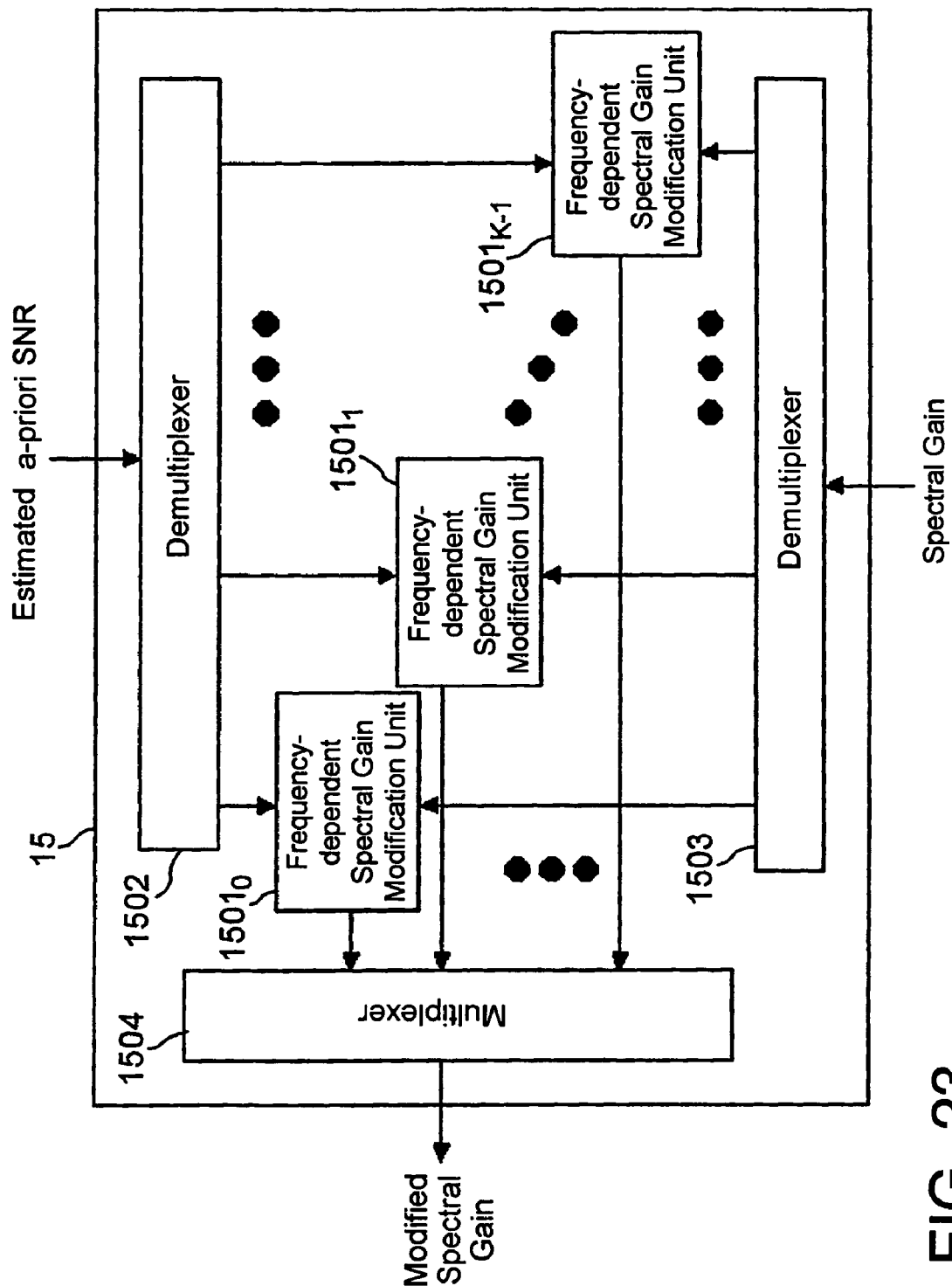
FIG. 23 is a block diagram showing an arrangement of a spectral gain modification unit included in the noise suppressor shown in FIG. 15.

Spectral gain modification unit 15 in the noise suppressor shown in FIG. 15 will be described below. Spectral gain modification unit 15 modifies a spectral gain depending on the SNR in order to prevent residual noise which would be introduced due to insufficient suppression when the SNR is low, and also to prevent speech quality degradation due to speech distortion which would occur owing to excessive suppression when the SNR is high. As an example of the spectral gain modification, when the SNR is low, a modification value is added to a spectral gain to suppress residual noise, and when the SNR is high, a minimum value of a spectral gain is limited to prevent speech distortion. As shown in FIG. 23, spectral gain modification unit 15 has K frequency-dependent spectral gain modification units $\mathbf{1501}_0$ to $\mathbf{1501}_{K-1}$, demultiplexers 1502, 1503, and multiplexer 1054.

Demultiplexer 1502 separates the estimated a-priori SNR supplied from a-priori SNR estimator 7 (FIG. 15) into frequency-dependent components, and outputs the frequency-dependent components respectively to frequency-dependent spectral gain modification units $\mathbf{1501}_0$ to $\mathbf{1501}_{K-1}$. Demultiplexer 1503 separates the spectral gain supplied from spectral gain generator 8 (FIG. 15) into frequency-dependent components, and outputs the frequency-dependent components respectively to frequency-dependent spectral gain modification units $\mathbf{1501}_0$ to $\mathbf{1501}_{K-1}$. Each of frequency-dependent spectral gain modification units $\mathbf{1501}_0$ to $\mathbf{1501}_{K-1}$ calculates a frequency-dependent modified spectral gain from the frequency-dependent estimated a-priori SNR supplied from demultiplexer 1502 and the frequency-dependent spectral gain supplied from demultiplexer 1503, and output the calculated frequency-dependent modified spectral gain to multiplexer 1504. Multiplexer 1504 multiplexes the frequency-dependent modified spectral gains supplied from frequency-dependent spectral gain modification units $\mathbf{1501}_0$ to $\mathbf{1501}_{K-1}$, and output a multiplexed modified spectral gain to multiplexed multiplier 16 and a-priori SNR estimator 7.

Figure 24:
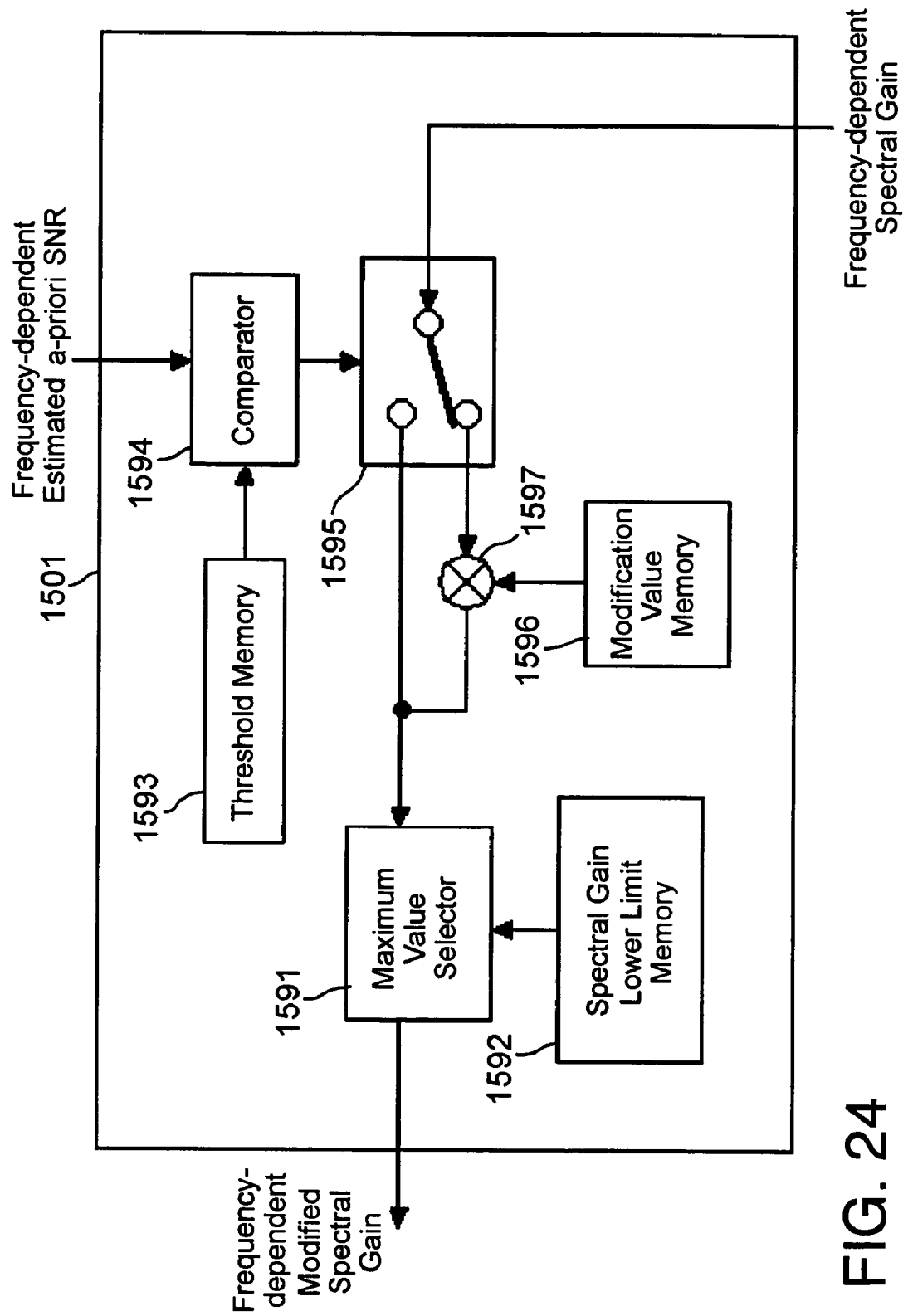
FIG. 24 is a block diagram showing an arrangement of a frequency-dependent spectral gain modification unit included in the spectral gain modification unit shown in FIG. 23.

FIG. 24 shows an arrangement of frequency-dependent spectral gain modification units $\mathbf{1501}_0$ to $\mathbf{1501}_{K-1}$. Since frequency-dependent spectral gain modification units $\mathbf{1501}_0$ to $\mathbf{1501}_{K-1}$ are identical in arrangement to each other, they are indicated as frequency-dependent spectral gain modification unit 1501 in FIG. 24. Frequency-dependent spectral gain modification unit 1501 has maximum value selector 1591, spectral gain lower limit memory 1592, threshold memory 1593, comparator 1594, switch (selector) 1595, modification value memory 1596, and multiplier 1597.

Comparator 1594 compares a threshold value supplied from threshold memory 1593 and the frequency-dependent estimated a-priori SNR supplied from demultiplexer 1502 (FIG. 23) with each other. If the frequency-dependent estimated a-priori SNR is greater than the threshold value, then comparator 1594 supplies "0" to switch 1595. If the frequency-dependent estimated a-priori SNR is smaller than the threshold value, then comparator 1594 supplies "1" to switch 1595. Switch 1595 outputs the signal supplied from demultiplexer 1503 (FIG. 23) to multiplier 1597 when the output from comparator 1594 is "1". Switch 1595 outputs the signal supplied from demultiplexer 1503 to maximum value selector 1591 when the output from comparator 1594 is "0". That is, when the frequency-dependent estimated a-priori SNR is smaller than the threshold value, the spectral gain is modified. As the spectral gain is modified when the SNR is small, the speech component is not excessively suppressed, and the amount of residual noise is reduced. Multiplier 1579 calculates the product of the output value from switch 1595 and the output value from modification value memory 1596, and outputs the calculated result to maximum value selector 1591. In order to reduce the spectral gain value, the modification value is normally smaller than 1. However, the modification value may be selected otherwise depending on the purpose of the noise suppressor. In the conventional noise suppressor shown in FIG. 1, the spectral gain is supplied to multiplexed multiplier 16 and a-priori SNR estimator 7. In the noise suppressor according to the first embodiment, however, the modified spectral gain, rather than the spectral gain, is supplied to multiplexed multiplier 16 and a-priori SNR estimator 7.

Spectral gain lower limit memory 1592 supplies a stored lower limit for the spectral gain to maximum value selector 1591. Maximum value selector 1591 compares the frequency-dependent spectral gain supplied from switch 1595 and the spectral gain lower limit value supplied from spectral gain lower limit memory 1592 with each other, and outputs a larger one of them to multiplexer 1504 (FIG. 23). That is, the spectral gain is always larger than the lower limit stored in spectral gain lower limit memory 1592. Therefore, speech distortion due to excessive suppression is prevented.

Figure 25:
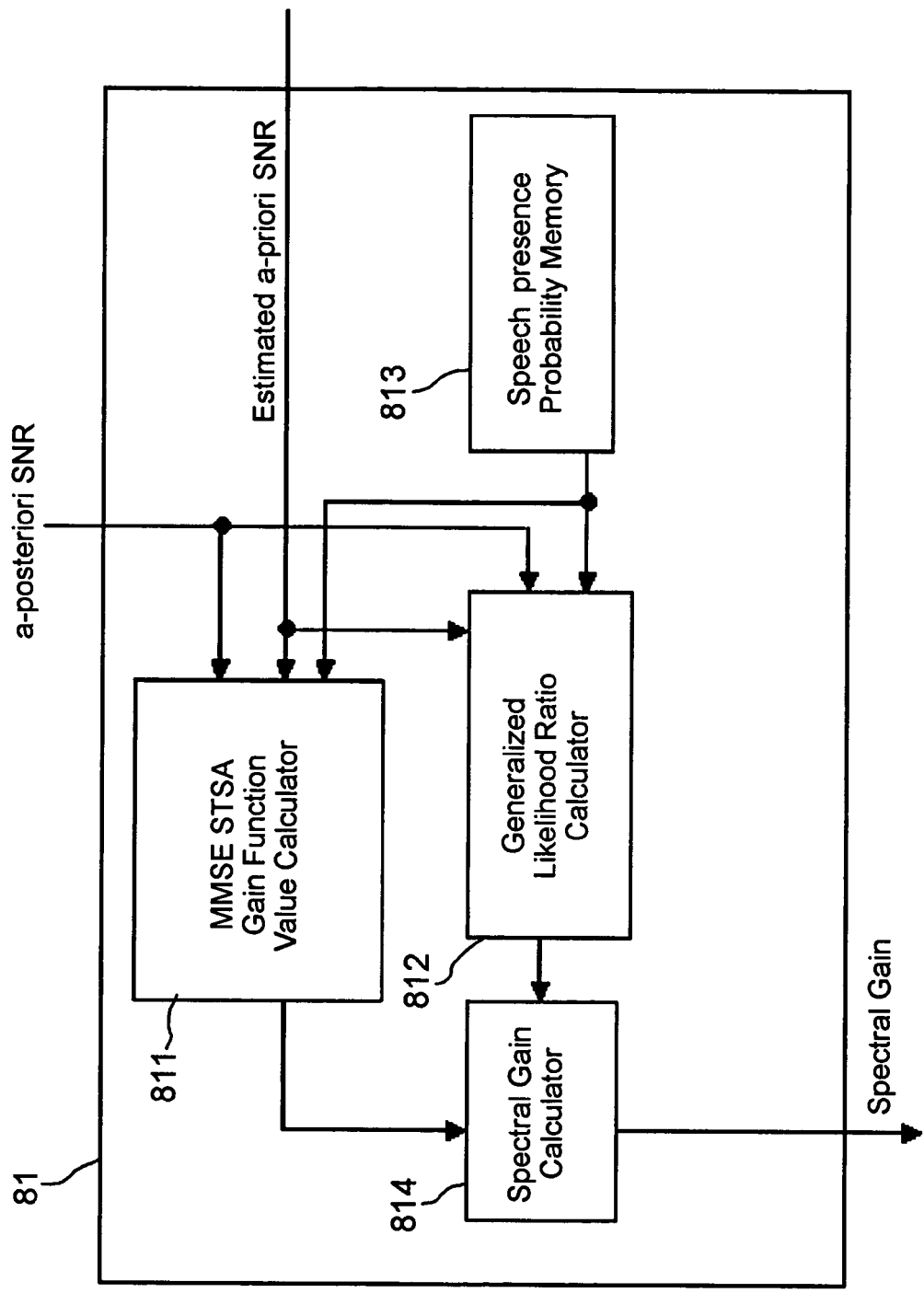
FIG. 25 is a block diagram showing a second example of an arrangement of a spectral gain generator.

FIG. 25 shows a second example of the arrangement of the spectral gain generator included in the noise suppressor shown in FIG. 15. Spectral gain generator 81 illustrated herein has MMSE STSA gain function value calculator 811, generalized likelihood ratio calculator 812, speech presence probability memory 813, and spectral gain calculator 814. Spectral gain generator 81 differs from spectral gain generator 8 shown in FIG. 15 which determines a spectral gain through search, in that noise spectral gain generator 81 calculates a spectral gain from an estimated a-priori SNR and an a-posteriori SNR that are supplied thereto. A process of calculating a spectral gain based on equations described in Reference 1 will be described below.

It is assumed that a frame number is represented by n, a frequency number is represented by k, $\gamma_n(k)$ represents the frequency-dependent a-posteriori SNR supplied from frequency-dependent SNR calculator 6 (FIG. 15), and $\hat{\xi}_n(k)$ represents the frequency-dependent estimated a-priori SNR supplied from a-priori SNR estimator 7 (FIG. 15). It is also assumed that:

$$\eta_n(k)=\hat{\xi}_n(k)/q, \text{ and}$$

$$v_n(k)=\eta_n(k)\cdot\gamma_n(k)/(1+\eta_n(k))v_n(k)$$

MMSE STSA gain function value calculator 811 calculates MMSE STSA gain function values for respective frequencies based on the a-posteriori SNR supplied from frequency-dependent SNR calculator 6, the estimated a-priori SNR supplied from a-priori SNR estimator 7, and a speech presence probability q supplied from speech presence probability memory 813, and outputs the calculated MMSE STSA gain function values to spectral gain calculator 814. The MMSE STSA gain function values $G_n(k)$ for the respective frequencies are given by equation (18). In equation (18), $I_0(z)$ represents the $0^{th}$-order modified Bessel function, and $I_1(z)$ represents the $1^{st}$-order modified Bessel function. The modified Bessel functions are described in "Dictionary of mathematics", 1985, Iwanami Shoten, page 374 G (Reference 5).

$$G_n(k) = \frac{\sqrt{\pi}}{2} \frac{\sqrt{v_n(k)}}{\gamma_n(k)} \exp\left(-\frac{v_n(k)}{2}\right) \cdot \left[(1+v_n(k))I_0\left(\frac{v_n(k)}{2}\right) + v_n(k)I_1\left(\frac{v_n(k)}{2}\right)\right] \quad (18)$$

Generalized likelihood ratio calculator 812 calculates generalized likelihood ratios for respective frequencies based on the a-posteriori SNR $\gamma_n(k)$ supplied from frequency-dependent SNR calculator 6, the estimated a-priori SNR $\xi_n(k)$ supplied from a-priori SNR estimator 7, and the speech presence probability q supplied from speech presence probability memory 813, and outputs the calculated generalized likelihood ratios to spectral gain calculator 814. The generalized likelihood ratios $\Lambda_n(k)$ for the respective frequencies are expressed by equation (19):

$$\Lambda_n(k) = \frac{q}{1-q} \frac{\exp(v_n(k))}{1+\eta_n(k)} \quad (19)$$

Spectral gain calculator 814 calculates spectral gains for respective frequencies from the MMSE STSA gain function values $G_n(k)$ supplied from MMSE STSA gain function value calculator 811 and the generalized likelihood ratios $\Lambda_n(k)$ supplied from generalized likelihood ratio calculator 812, and outputs the calculated spectral gains to spectral gain modification unit 15 (FIG. 15). The spectral gains $\overline{G}_n(k)$ for the respective frequencies are expressed by equation (20):

$$\overline{G}_n(k) = \frac{\Lambda_n(k)}{\Lambda_n(k)+1} G_n(k) \quad (20)$$

In the noise suppressor shown in FIG. 15, it is possible to determine and use common SNRs for respective frequency bands comprising a plurality of frequencies, rather than frequency-dependent SNRs. A second example of frequency-dependent SNR calculator 6 for calculating SNRs for respective bands will be described below.

Figure 26:
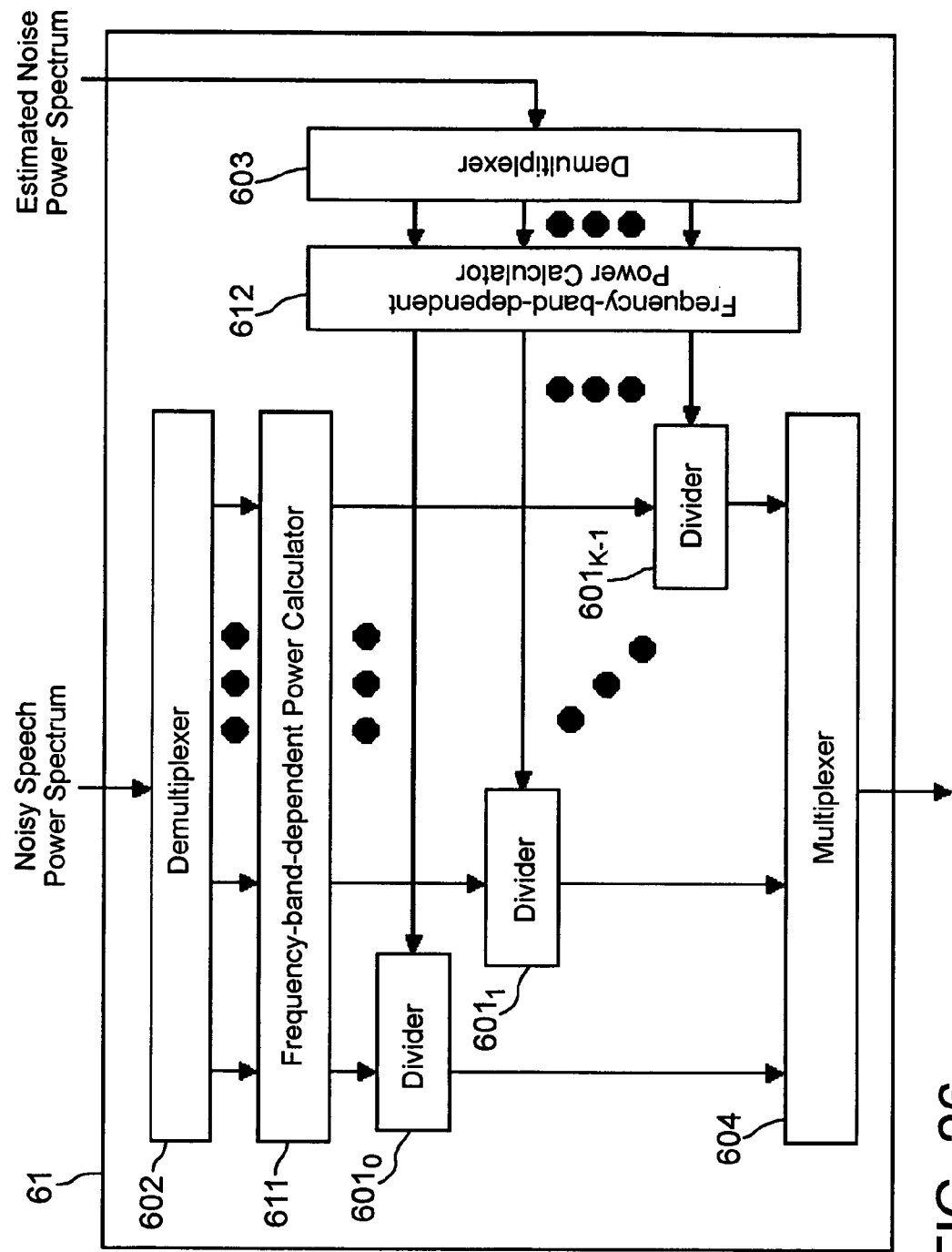
FIG. 26 is a block diagram showing an arrangement of a frequency-band-dependent SNR calculator that can be used instead of a frequency-dependent SNR calculator in the noise suppressor shown in FIG. 15.

FIG. 26 shows an arrangement of frequency-band-dependent SNR calculator 61 that can be used instead of frequency-dependent SNR calculator 6 in the noise suppressor shown in FIG. 15. Frequency-band-dependent SNR calculator 61 differs from frequency-dependent SNR calculator 6 shown in FIG. 9 in that it has frequency-band-dependent power calculators 611, 612. Frequency-band-dependent power calculator 611 calculates frequency-band-dependent powers based on the frequency-dependent noisy speech power spectrum supplied from demultiplexer 602, and outputs the calculated frequency-band-dependent powers to dividers $601_0$ to $601_{K-1}$, respectively. Frequency-band-dependent power calculator 612 calculates frequency-band-dependent powers based on the frequency-dependent estimated noise power spectrum supplied from demultiplexer 603, and outputs the calculated frequency-band-dependent powers to dividers $601_0$ to $601_{K-1}$, respectively.

Figure 27:
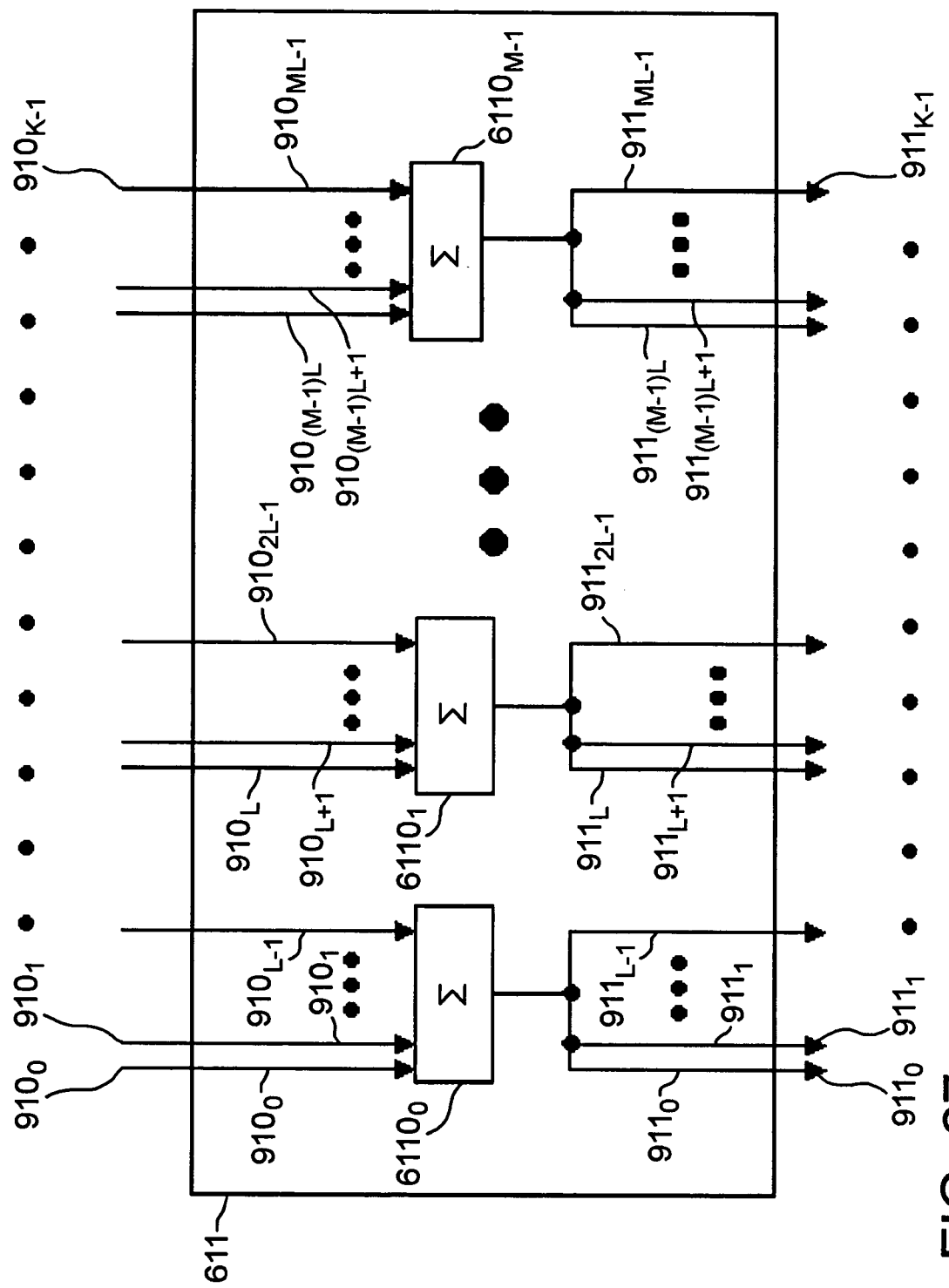
FIG. 27 is a block diagram showing an arrangement of a frequency-band-dependent power calculator included in the frequency-band-dependent SNR calculator shown in FIG. 26.

FIG. 27 shows an arrangement of frequency-band-dependent power calculator 611. In the illustrated example, the entire power spectrum is divided into equal M bands having a bandwidth L where L, M are natural numbers satisfying the relationship K=LM.

Frequency-band-dependent power calculator 611 has M adders $6110_0$ to $6110_{M-1}$. Frequency-dependent noisy speech power spectrum components $910_0$ to $910_{K-1}$ ($910_0$ to $910_{ML-1}$) supplied from demultiplexer 602 (FIG. 26) are transmitted respectively to adders $6110_0$ to $6110_{M-1}$ which correspond to the respective frequencies. Since the frequency numbers corresponding to the frequency band number 0 are 0 to L−1, for example, frequency-dependent noisy speech power spectrum components $910_0$ to $910_{L-1}$ are transmitted to adder $6110_0$. Similarly, since the frequency numbers corresponding to the frequency band number 1 are L to 2L−1, for example, frequency-dependent noisy speech power spectrum components $910_L$ to $9102_{L-1}$ are transmitted to adder $6110_1$. Adders $6110_0$ to $6110_{M-1}$ calculate respective sums of supplied frequency-dependent noisy speech power spectrum components, and output frequency-band-dependent noisy speech power spectrum components $911_0$ to $911_{ML-1}$ ($911_0$ to $911_{K-1}$) to dividers $601_0$ to $601_{K-1}$ (FIG. 26). The calculated results from adders $6110_0$ to $6110_{M-1}$ are supplied as frequency-band-dependent noisy speech power spectrum components for frequencies depending on respective frequency band numbers. For example, the calculated results from adder $6110_0$ are output as frequency-band-dependent noisy speech power spectrum components $911_0$ to $911_{L-1}$, and the calculated results from adder $6110_1$ are output as frequency-band-dependent noisy speech power spectrum components $911_L$ to $911_{2L-1}$.

Frequency-band-dependent power calculator 612 is equivalent in arrangement and operation to frequency-band-dependent power calculator 611. Therefore, frequency-band-dependent power calculator 612 will not be described in detail below.

While the entire power spectrum is divided into a plurality of frequency bands described earlier, it is possible to employ another frequency band dividing method such as a method for dividing the entire power spectrum into critical bands as disclosed in "Hearing and speech", The Institute of Electronics, Information, and Communication Engineers, pages 115-118, 1980 (Reference 6), or a method for dividing the entire power spectrum into octave bands as disclosed in "Multirate Digital Signal Processing", 1983, Prentice-Hall Inc., USA, 1983 (Reference 7).

Figure 28:
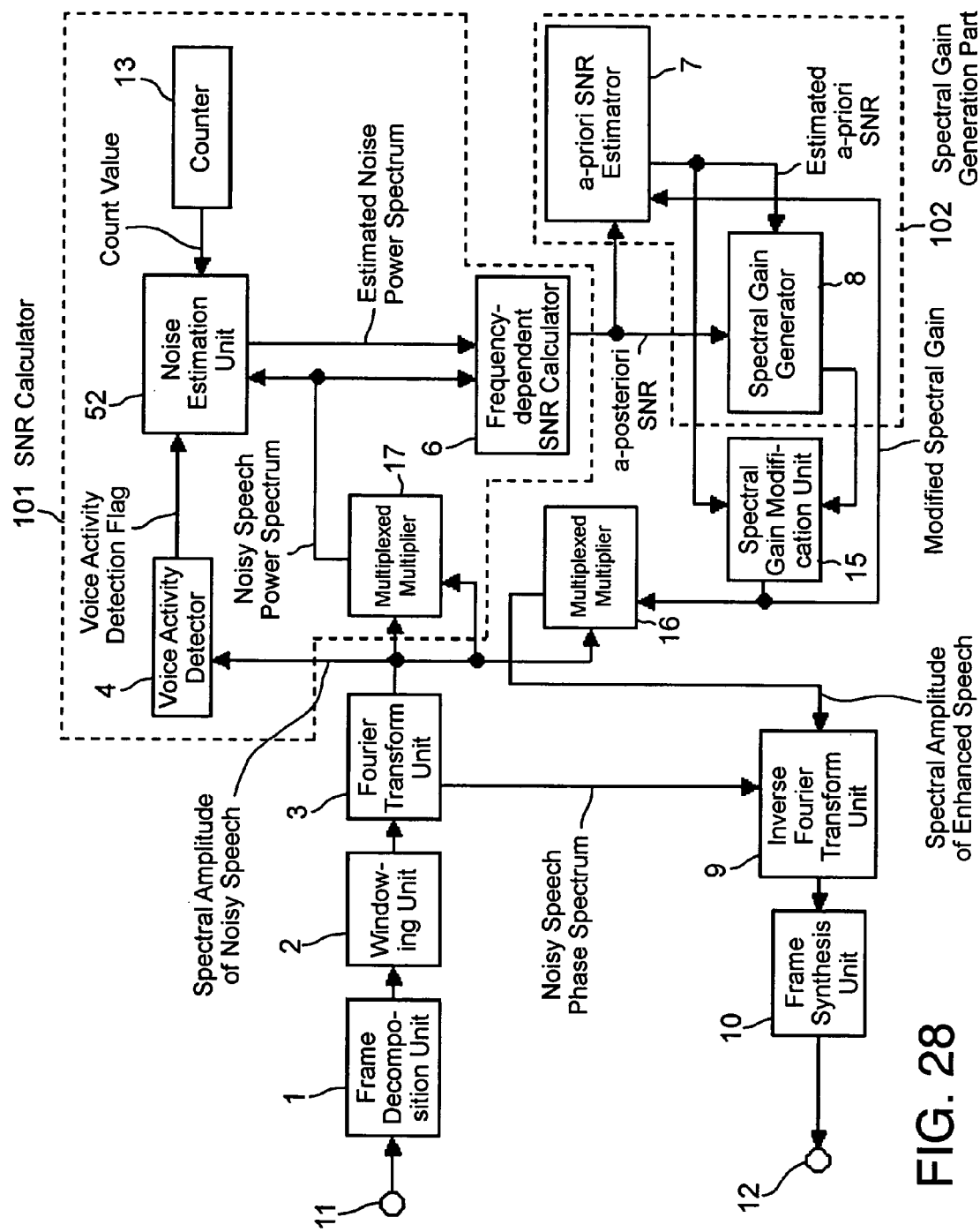
FIG. 28 is a block diagram showing an arrangement of a noise suppressor according to a second embodiment of the present invention.

A second embodiment of the present invention will be described below. A noise suppressor according to the second embodiment shown in FIG. 28 differs from the noise suppressor according to the first embodiment shown in FIG. 15 in that noise estimation unit 5 is replaced with noise estimation unit 52 and weighted noisy speech calculator 14 is dispensed with. The noise suppressor according to the second embodiment will be described below basically with respect to these differences.

Figure 29:
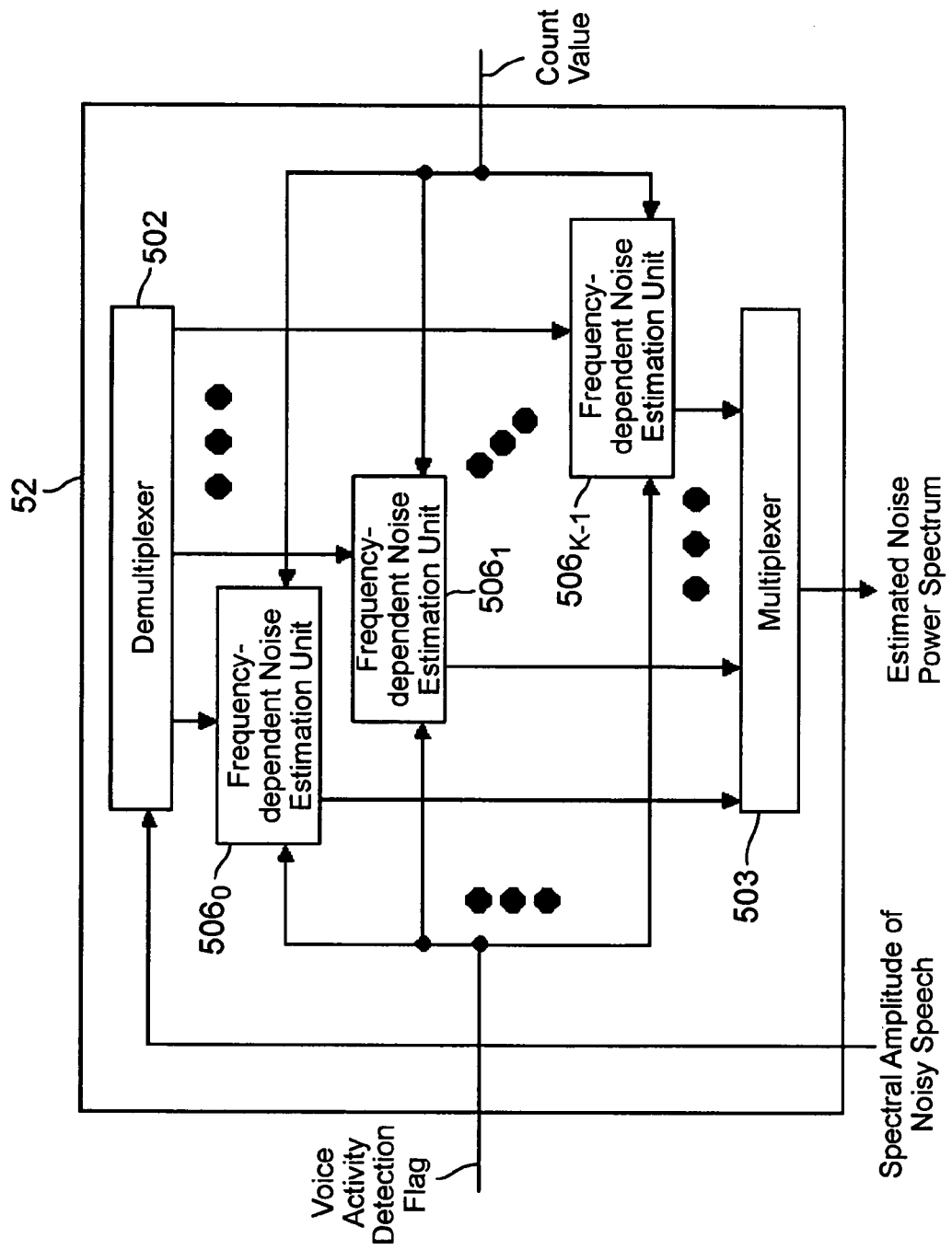
FIG. 29 is a block diagram showing an arrangement of a noise estimation unit included in the noise suppressor shown in FIG. 28.

FIG. 29 shows an arrangement of noise estimation unit 52 included in the noise suppressor according to the second embodiment. Noise estimation unit 52 differs from noise estimation unit 5 shown in FIG. 19 in that frequency-dependent noise estimation units $504_0$ to $504_{K-1}$ are replaced with frequency-dependent noise estimation units $506_0$ to $506_{K-1}$ and an input signal for noise estimation unit 52 does not have a weighted noisy speech power spectrum. This is because whereas frequency-dependent noise estimation units $504_0$ to $504_{K-1}$ in noise estimation unit 5 shown in FIG. 19 require the input signal to have a frequency-dependent weighted noisy speech power spectrum, noise estimation units $506_0$ to $506_{K-1}$ in noise estimation unit 52 do not require the input signal to have a frequency-dependent weighted noisy speech power spectrum.

Figure 30:
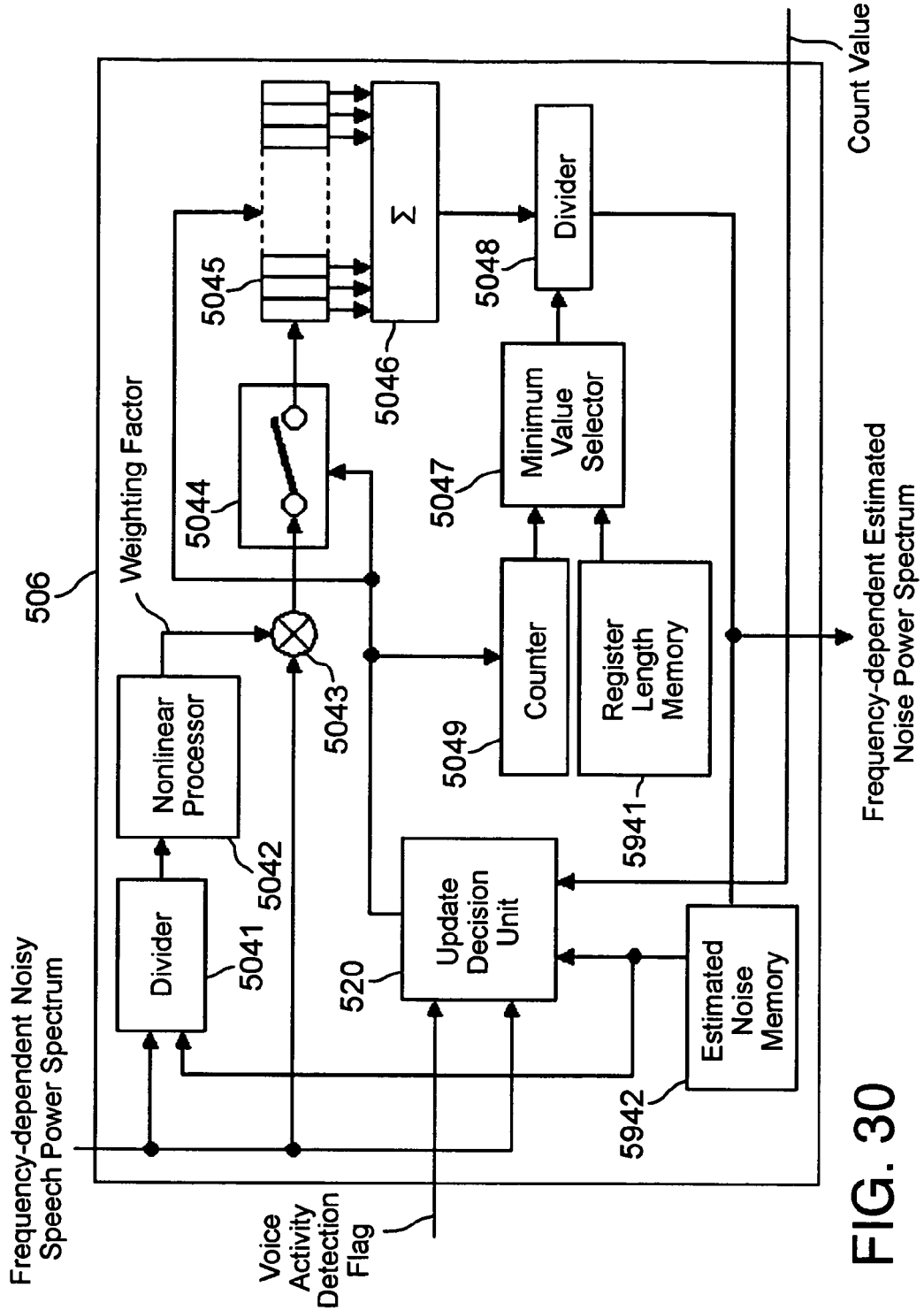
FIG. 30 is a block diagram showing an arrangement of a frequency-dependent noise estimation unit included in the noise estimation unit shown in FIG. 29.

FIG. 30 is a block diagram showing an arrangement of frequency-dependent noise estimation units $506_0$ to $506_{K-1}$ included in noise estimation unit 52 shown in FIG. 29. Since frequency-dependent noise estimation units $506_0$ to $506_{K-1}$ are identical in arrangement to each other, they are indicated as frequency-dependent noise estimation unit 506 in FIG. 30. Frequency-dependent noise estimation unit 506 differs from frequency-dependent noise estimation unit 504 shown in FIG. 20 in that it does not use an input signal having a weighted noisy speech power spectrum and it has divider 5041, nonlinear processor 5042, and multiplier 5043. Frequency-dependent noise estimation unit 506 will be described below basically with respect to these differences.

Divider 5041 divides the frequency-dependent noisy speech power spectrum supplied from demultiplexer 502 (FIG. 29) by the estimated noise power spectrum in the previous frame which is supplied from estimated noise memory 5942, and outputs the divided result to nonlinear processor 5042. Nonlinear processor 5042, which is identical in arrangement and function to nonlinear processor 1485 shown in FIG. 17, calculates a weighting factor depending on the output from divider 5041, and outputs the calculated weighting factor to multiplier 5043. Multiplier 5043 calculates the product of the frequency-dependent noisy speech power spectrum supplied from demultiplexer 502 (FIG. 28) and the weighting factor supplied from nonlinear processor 5042, and outputs the product to switch 5044.

The output signal from multiplier 5043 is equivalent to the frequency-dependent weighted noisy speech power spectrum components in frequency-dependent noise estimation unit 504 shown in FIG. 18. Specifically, the frequency-dependent weighted noisy speech power spectrum can be calculated inside frequency-dependent noise estimation unit 506. In the noise suppressor according to the second embodiment, therefore, the weighted noisy speech calculator may be dispensed with.

Figure 31:
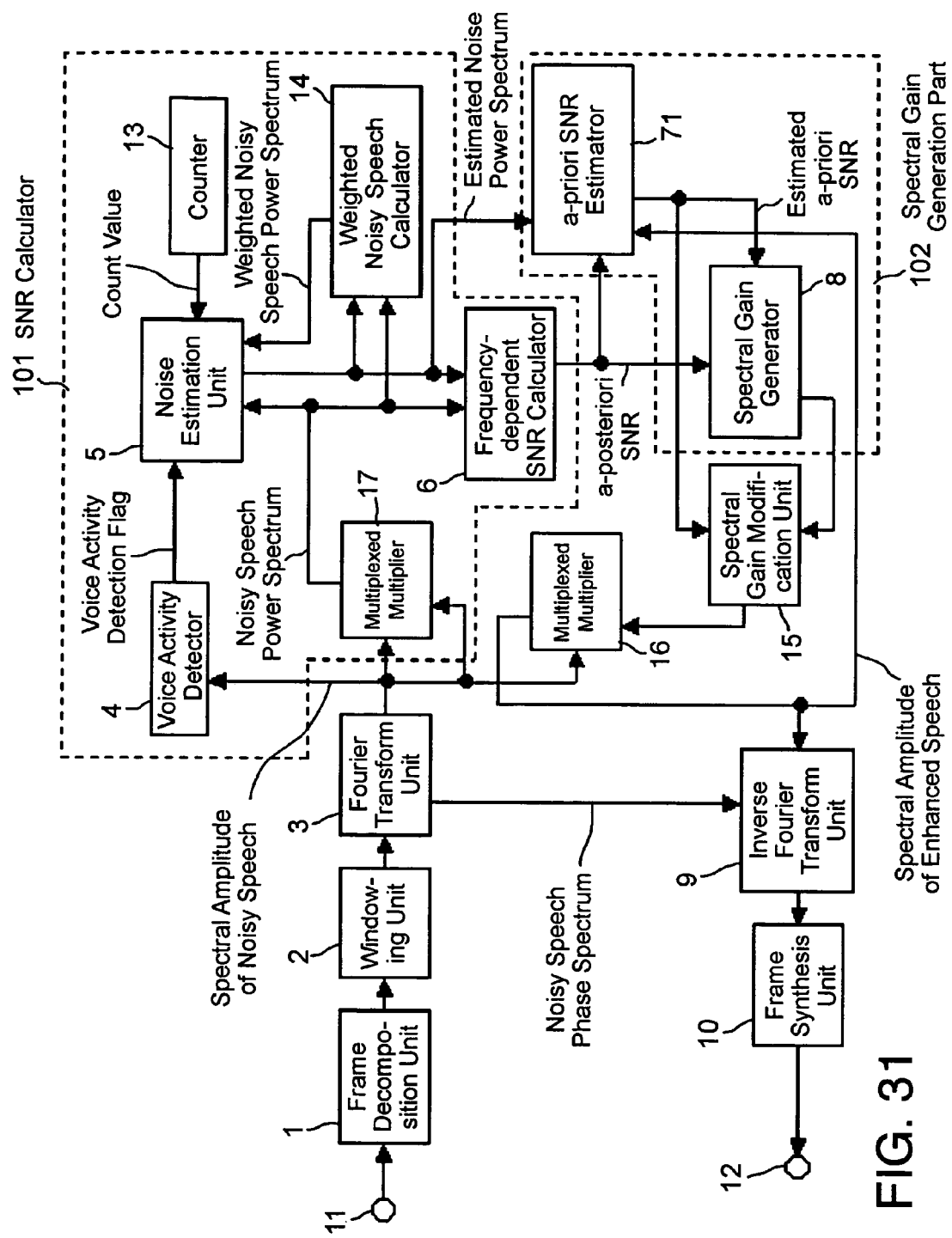
FIG. 31 is a block diagram showing an arrangement of a noise suppressor according to a third embodiment of the present invention.
Figure 32:
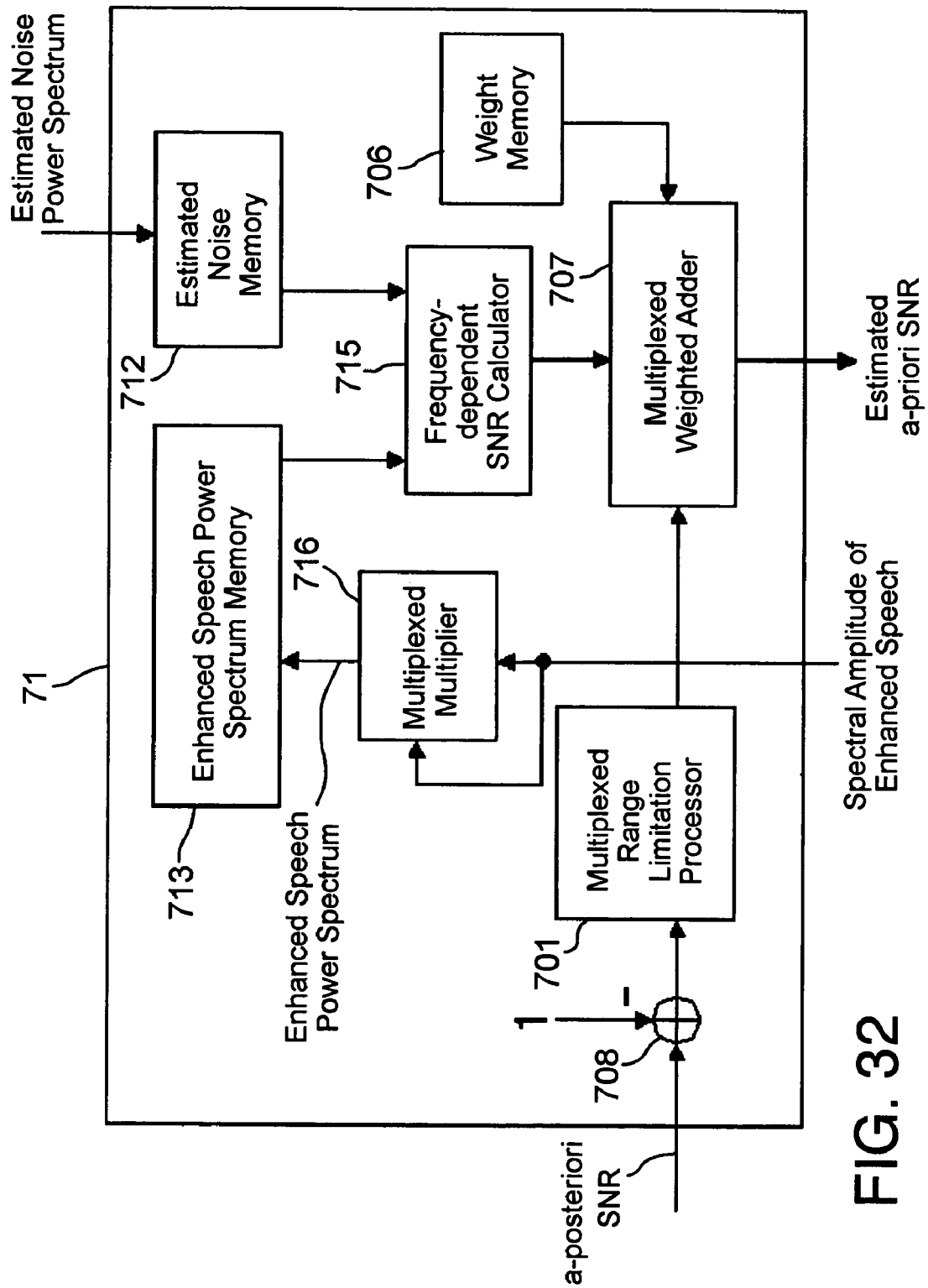
FIG. 32 is a block diagram showing an arrangement of an a-priori SNR estimator included in the noise suppressor shown in FIG. 31.

A third embodiment of the present invention will be described below. A noise suppressor according to the third embodiment of the present invention shown in FIG. 31 differs from the noise suppressor according to the first embodiment shown in FIG. 15 in that a-priori SNR estimator has a different internal arrangement. FIG. 32 shows an arrangement of a-priori SNR estimator 71 used in the third embodiment. A-priori SNR estimator 71 differs from a-priori SNR estimator 7 shown in FIG. 10 in that it has estimated noise memory 712, enhanced speech power spectrum memory 713, frequency-dependent SNR calculator 715, and multiplexed multiplier 716 in place of a-posteriori SNR memory 702, spectral gain memory 703, and multiplexed multipliers 705, 704. Furthermore, whereas the input signal for a-priori SNR estimator 7 shown in FIG. 10 contains a spectral gain, the input signal for a-priori SNR estimator 71 shown in FIG. 32 contains a spectral amplitude of enhanced speech and an estimated noise power spectrum instead of a spectral gain.

Multiplexed multiplier 716 squares the spectral amplitude of enhanced speech supplied from multiplexed multiplier 16 (FIG. 31) per frequency to determine an enhanced speech power spectrum, and outputs the determined enhanced speech power spectrum to enhanced speech power spectrum memory 713. Since multiplexed multiplier 716 is equal in arrangement to multiplexed multiplier 17 described above with reference to FIG. 5, multiplexed multiplier 716 will not be described in detail below. Enhanced speech power spectrum memory 713 stores the enhanced speech power spectrum supplied from multiplexed multiplier 716, and outputs a stored enhanced speech power spectrum in a previous frame to frequency-dependent SNR calculator 715. Since frequency-dependent SNR calculator 715 is equal in arrangement to frequency-dependent SNR calculator 6 described above with reference to FIG. 9, frequency-dependent SNR calculator 715 will not be described in detail below. Estimated noise memory 712 stores the estimated noise power spectrum supplied from noise estimation unit 5 (FIG. 31), and outputs a stored estimated noise power spectrum in a preceding frame to frequency-dependent SNR calculator 715. Frequency-dependent SNR calculator 715 calculates SNRs, for respective frequencies, of the enhanced speech power spectrum supplied from enhanced speech power spectrum memory 713 and the estimated noise power spectrum supplied from estimated noise memory 712, and outputs the calculated SNRs to multiplexed weighted adder 707.

Figure 10:
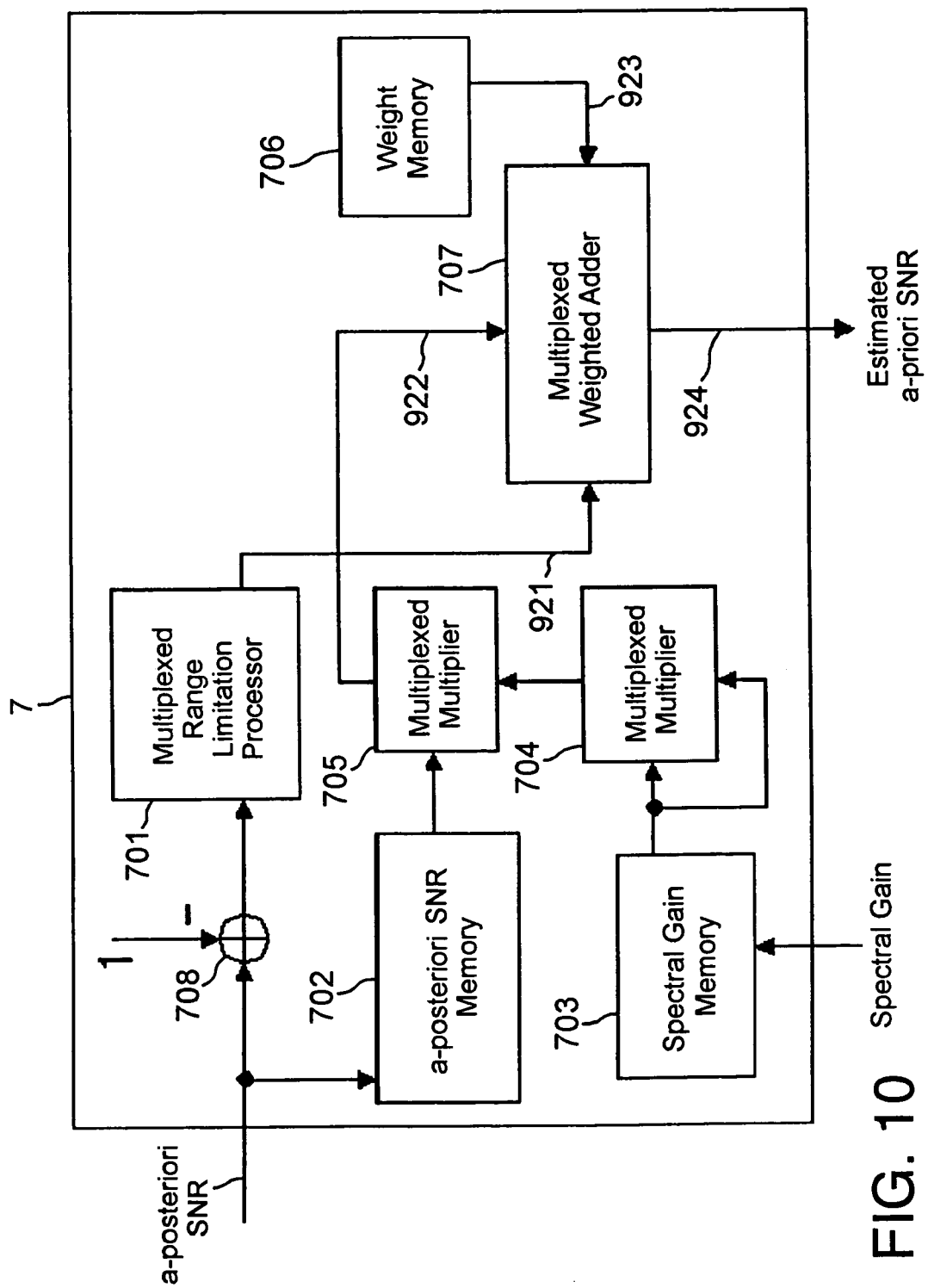
FIG. 10 is a block diagram showing an arrangement of an a-priori SNR estimator included in the noise suppressor shown in FIG. 1.
Figure 11:
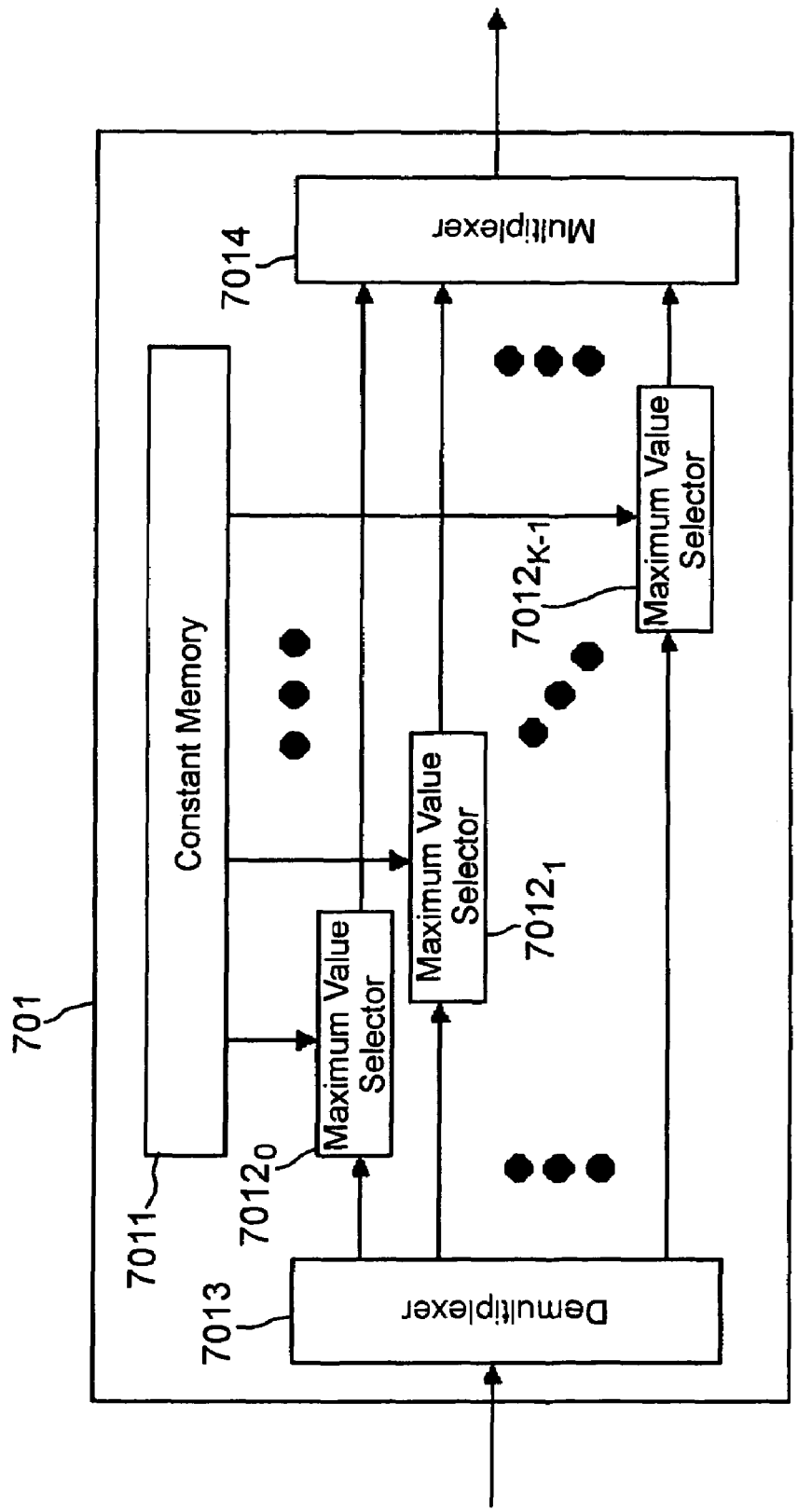
FIG. 11 is a block diagram showing an arrangement of a multiplexed range limitation processor included in the a-priori SNR estimator shown in FIG. 10.
Figure 12:
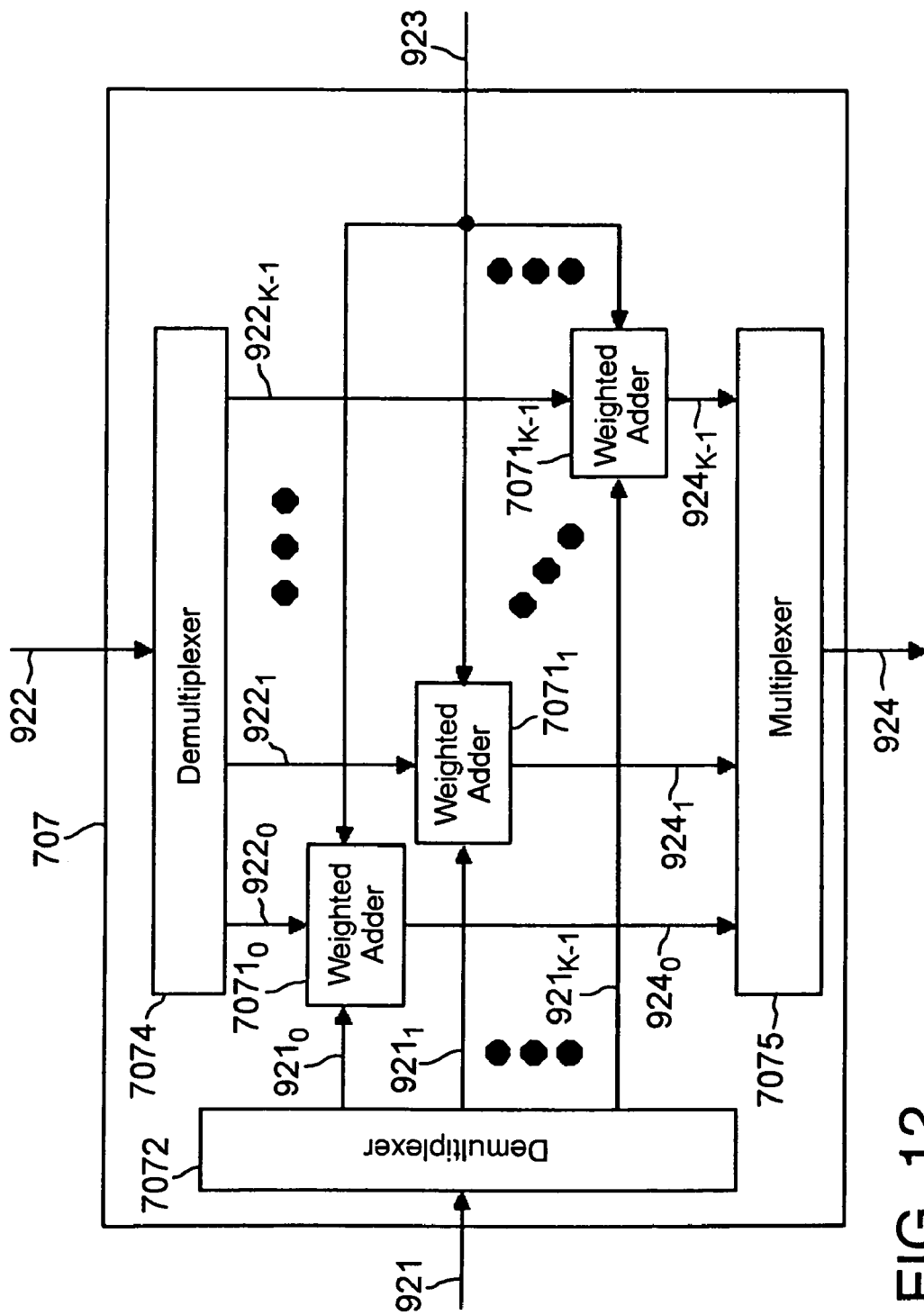
FIG. 12 is a block diagram showing an arrangement of a multiplexed weighted adder included in the a-priori SNR estimator shown in FIG. 10.
Figure 13:
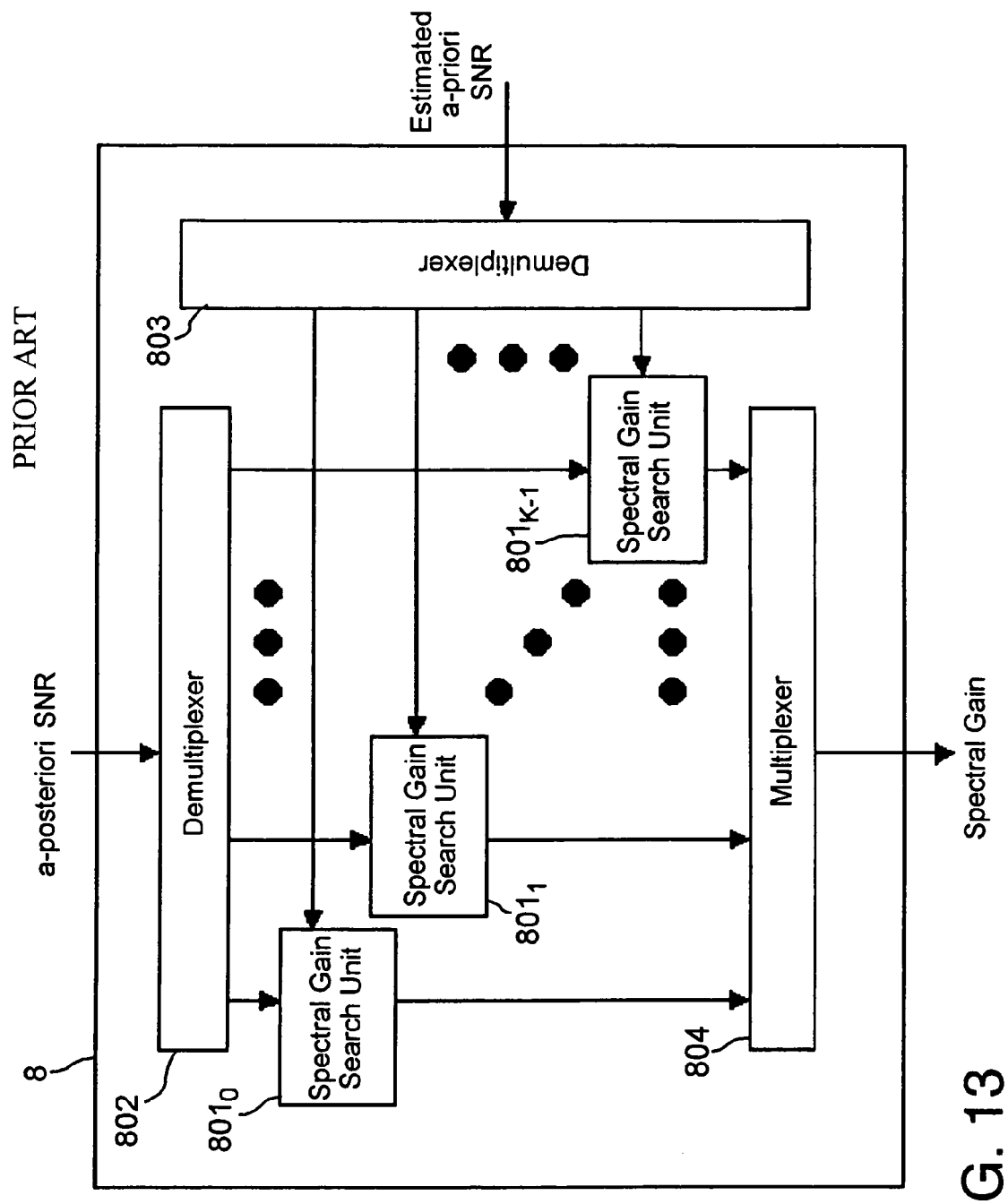
FIG. 13 is a block diagram showing an arrangement of a spectral gain generator included in the noise suppressor shown in FIG. 1.
Figure 14:
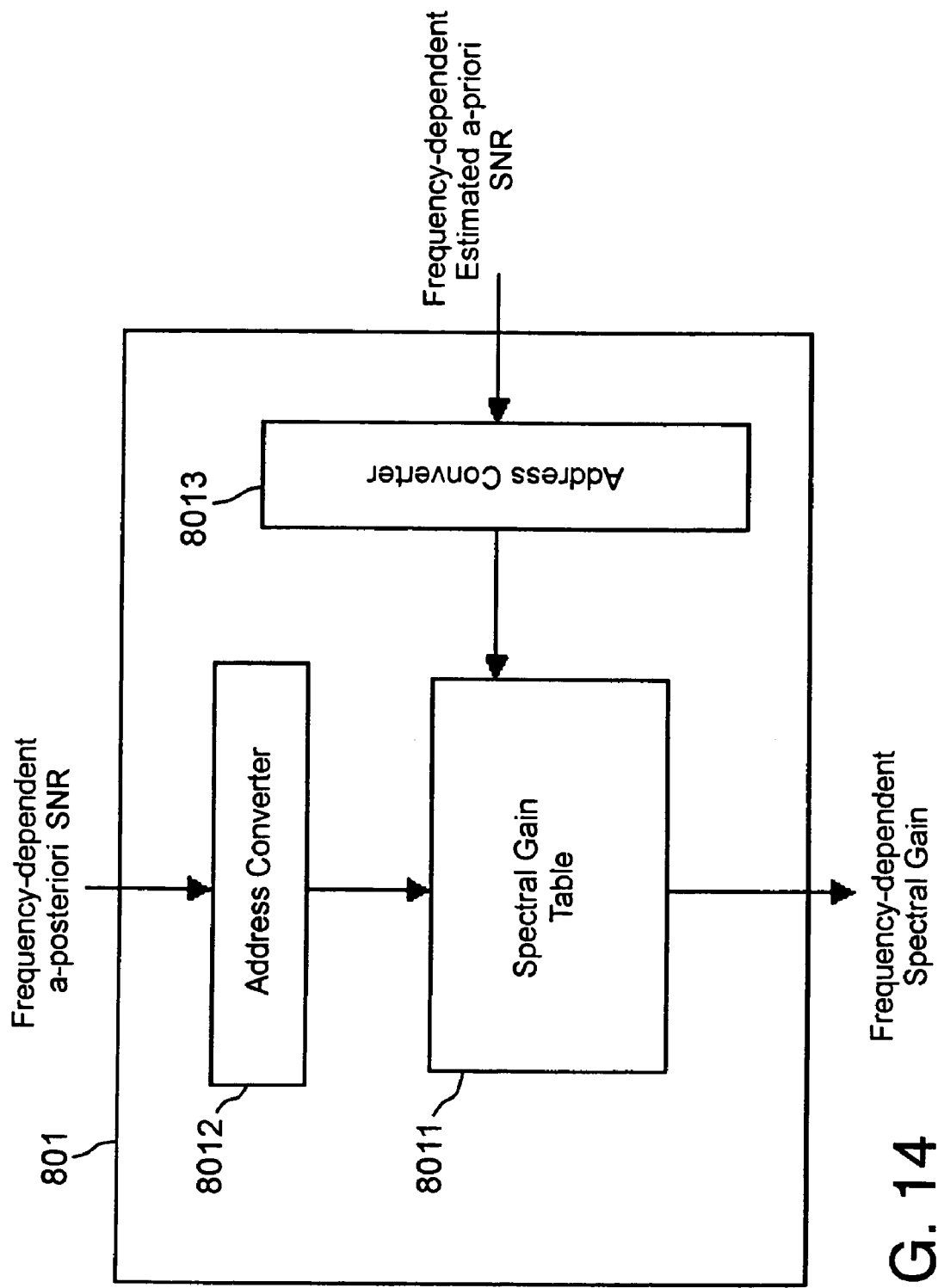
FIG. 14 is a block diagram showing an arrangement of a spectral gain search unit included in the spectral gain generator shown in FIG. 13.

The output signal of frequency-dependent SNR calculator 715 in a-priori SNR estimator 71 shown in FIG. 32 is equivalent to the output signal of multiplexed multiplier 705 in a-priori SNR estimator 7 shown in FIG. 10. Therefore, according to the third embodiment, a-priori SNR estimator 7 may be replaced with a-priori SNR estimator 71 described above.

Figure 33:
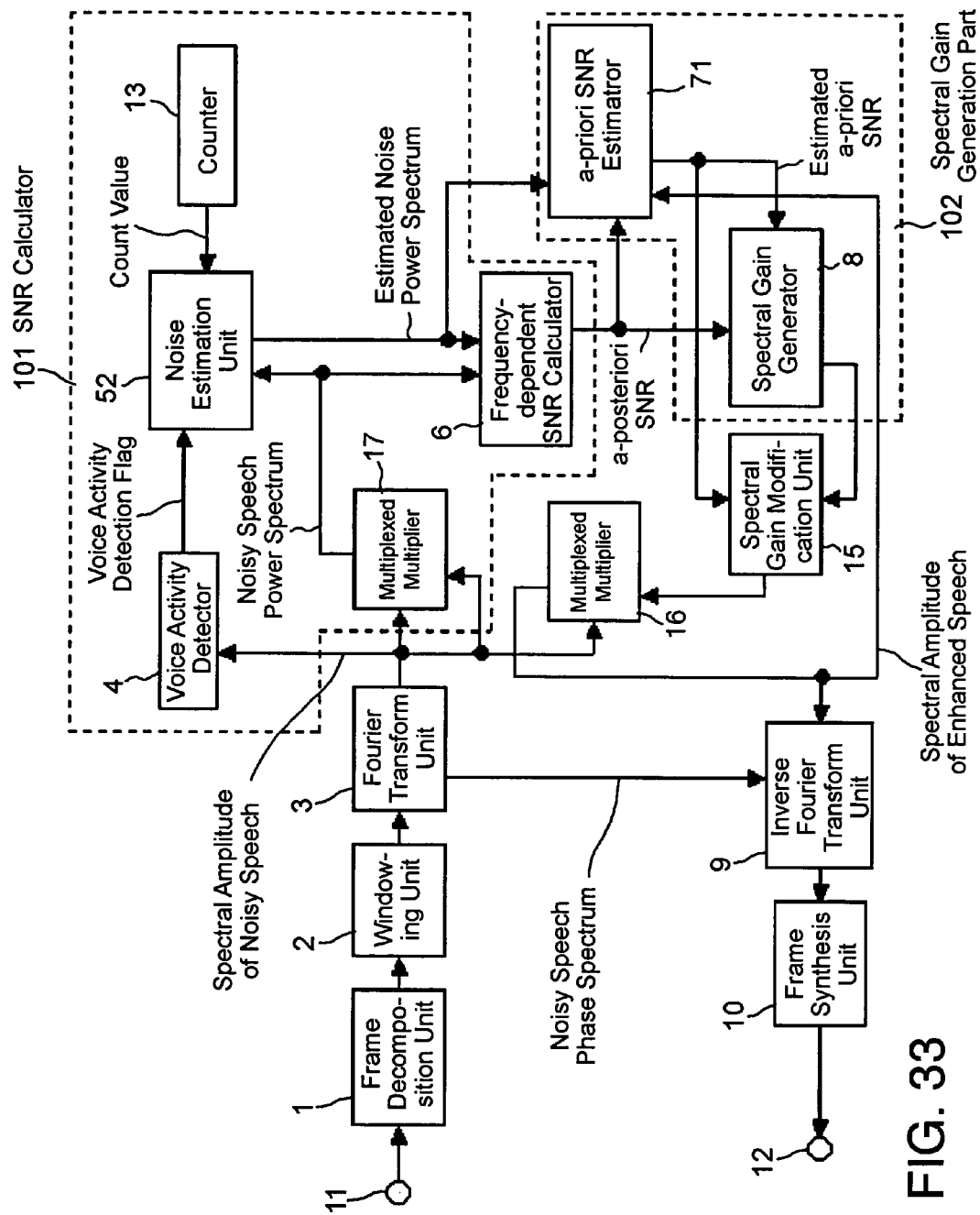
FIG. 33 is a block diagram showing an arrangement of a noise suppressor according to a fourth embodiment of the present invention.

A fourth embodiment of the present invention will be described below. A noise suppressor according to the fourth embodiment of the present invention shown in FIG. 33 differs from the noise suppressor according to the second embodiment shown in FIG. 28 in that a-priori SNR estimator 71 (see FIG. 32) employed in the third embodiment is used as an a-priori SNR estimator. Noise estimation unit 52 is similar in arrangement and operation to the one employed in the second embodiment, and a-priori SNR estimator 71 is similar in arrangement and operation to the one employed in the third embodiment. Therefore, the noise suppressor shown in FIG. 33 performs functions which are equivalent to the functions of the noise suppressor according to the first embodiment shown in FIG. 15.

Figure 34:
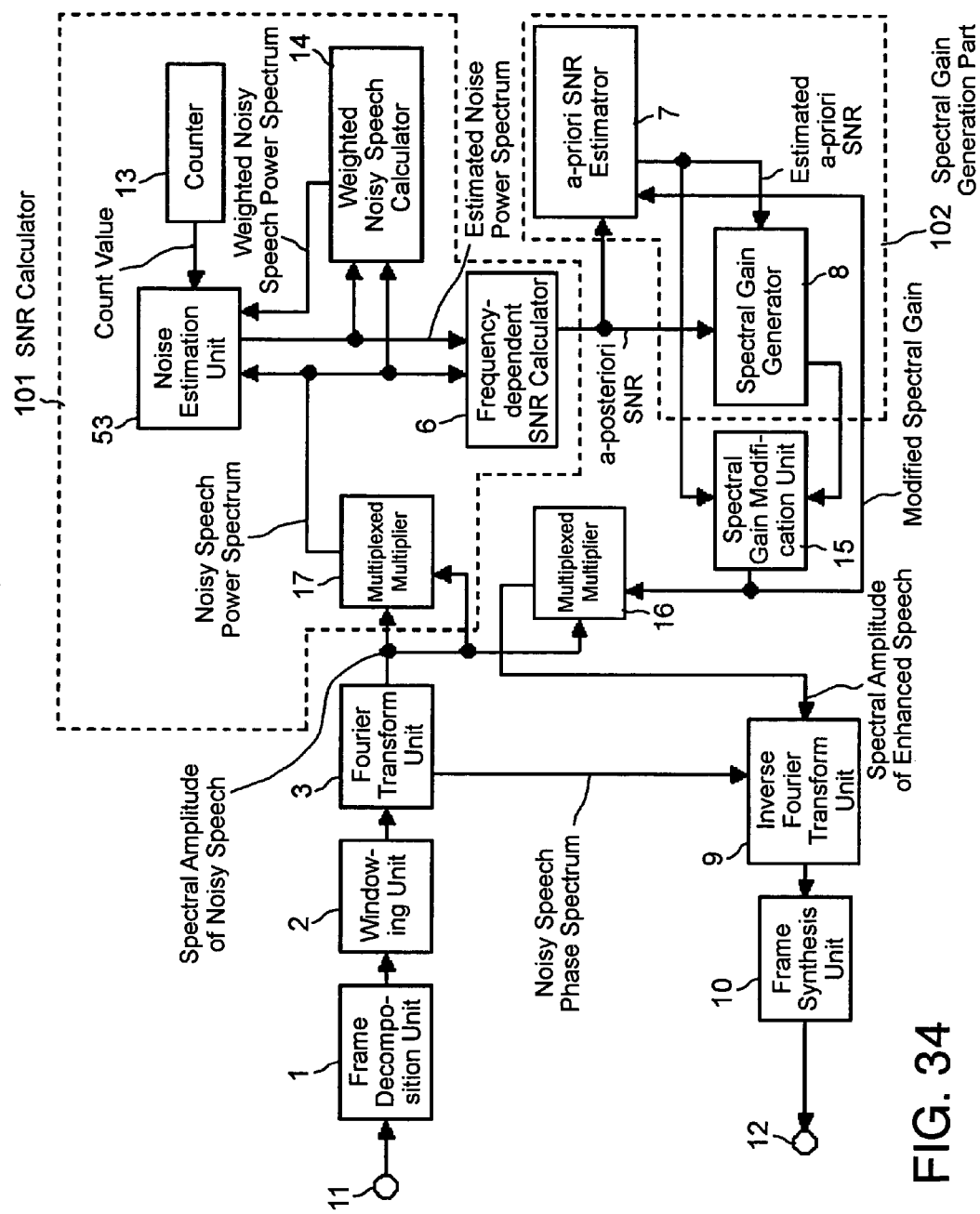
FIG. 34 is a block diagram showing an arrangement of a noise suppressor according to a fifth embodiment of the present invention.

A fifth embodiment of the present invention will be described below. A noise suppressor according to the fifth embodiment of the present invention shown in FIG. 34 differs from the noise suppressor according to the first embodiment shown in FIG. 15 in that noise estimation unit 5 is replaced with noise estimation unit 53 and voice activity detector 4 is dispensed with. Therefore, this noise suppressor is arranged such that it does not require a voice activity detector for estimating noise. The noise suppressor according to the fifth embodiment will be described below in detail basically with respect to these differences.

Figure 35:
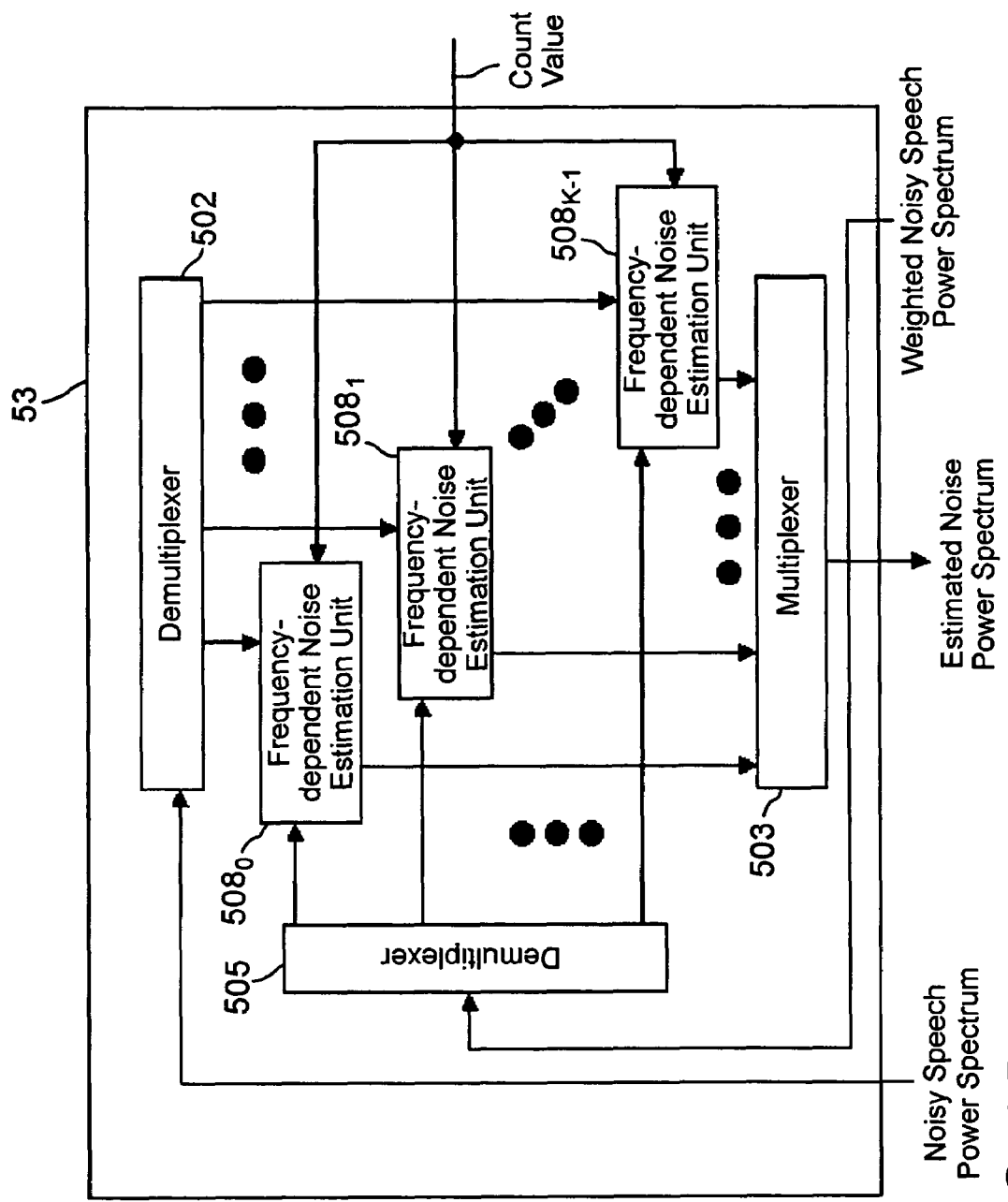
FIG. 35 is a block diagram showing an arrangement of a noise estimation unit included in the noise suppressor shown in FIG. 34.

FIG. 35 shows an arrangement of noise estimation unit 53 used in the fifth embodiment. Noise estimation unit 53 differs from noise estimation unit 5 shown in FIG. 19 in that frequency-dependent noise estimation units $504_0$ to $504_{K-1}$ are replaced with frequency-dependent noise estimation units $508_0$ to $508_{K-1}$ and the input signal contains no voice activity detection flag.

Figure 36:
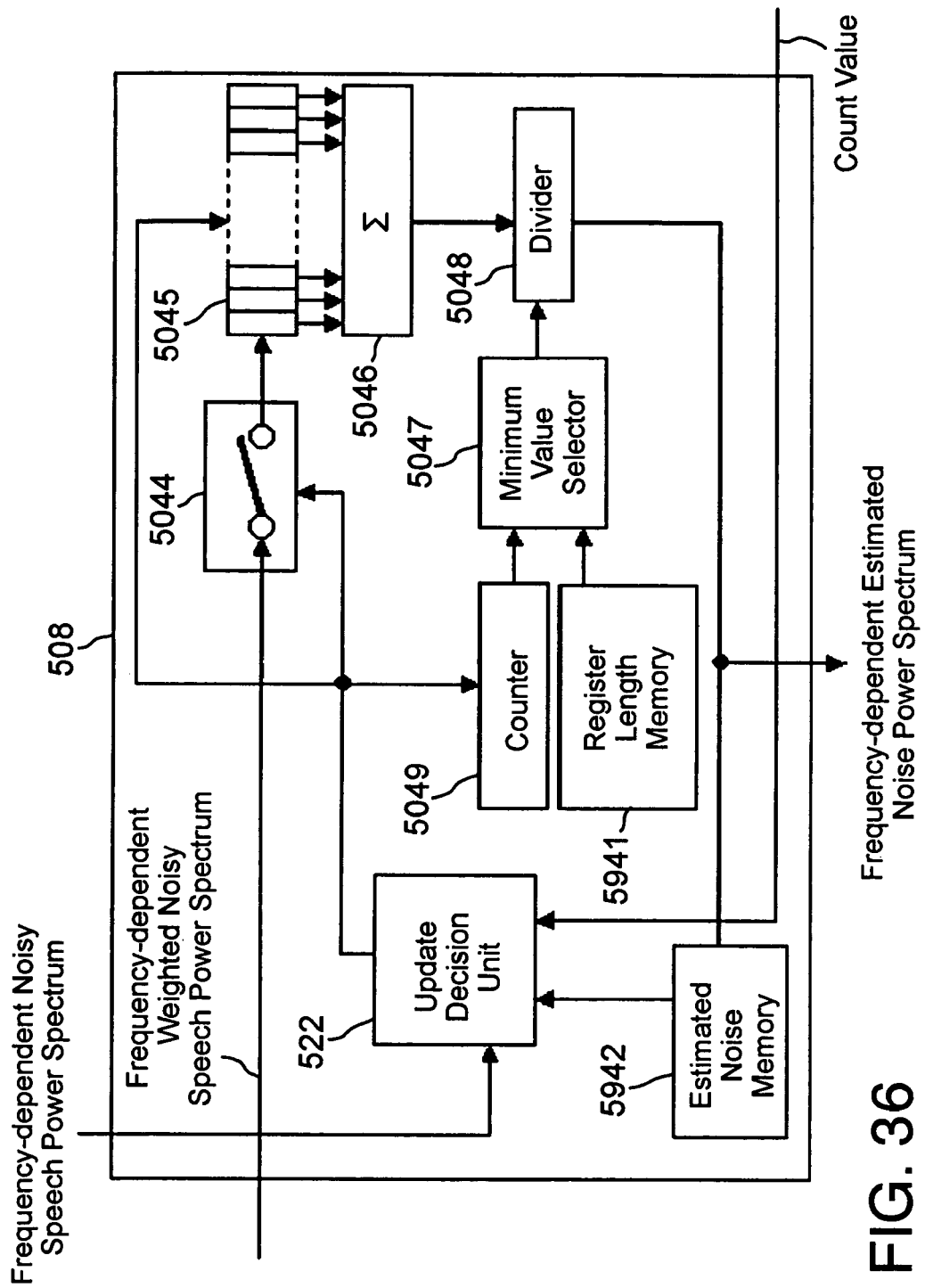
FIG. 36 is a block diagram showing an arrangement of a frequency-dependent noise estimation unit included in the noise estimation unit shown in FIG. 35.
Figure 37:
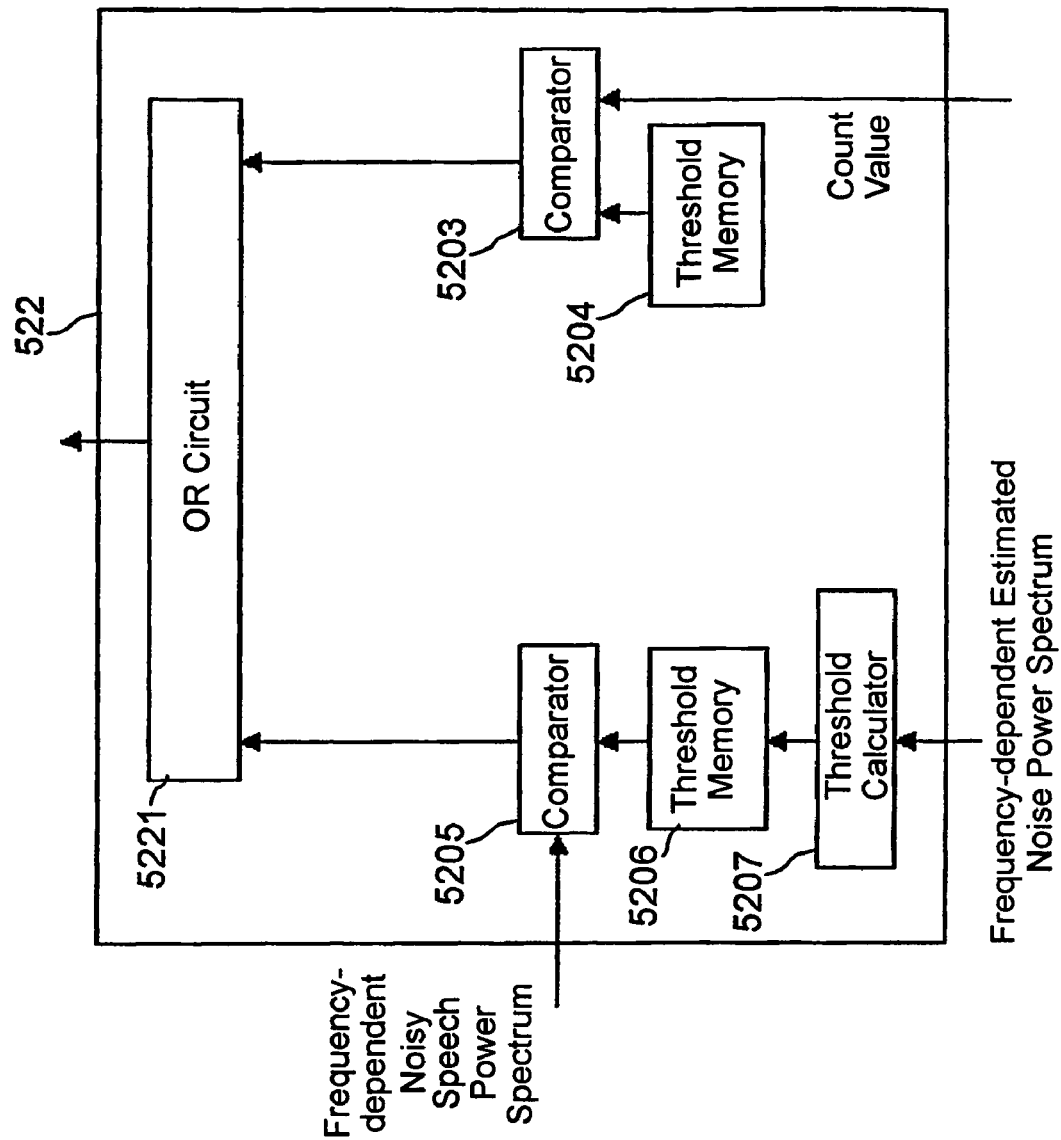
FIG. 37 is a block diagram showing an arrangement of an update decision unit included in the frequency-dependent noise estimation unit shown in FIG. 36.

FIG. 36 shows an arrangement of each of frequency-dependent noise estimation units $508_0$ to $508_{K-1}$. Since frequency-dependent noise estimation units $508_0$ to $508_{K-1}$ are identical in arrangement to each other, they are indicated as frequency-dependent noise estimation unit 508 in FIG. 36. Frequency-dependent noise estimation unit 508 differs from frequency-dependent noise estimation unit 504 shown in FIG. 20 in that update decision unit 520 is replaced with update decision unit 522 and the input signal contains no voice activity detection flag. An arrangement of update decision unit 522 is illustrated in FIG. 37. Update decision unit 522 is different from update decision unit 520 shown in FIG. 21 in that OR circuit 5201 is replaced with OR circuit 5221, NOT circuit 5202 is dispensed with, and the input signal contains no voice activity detection flag. Specifically, update decision unit 522 is different from update decision unit 520 shown in FIG. 21 in that it does not use a voice activity detection flag in updating estimated noise. OR circuit 5221 calculates logical sum of the output value from comparator 5205 and the output value from comparator 5203, and outputs the result to switch 5044, shift register 5045, and counter 5049 (FIG. 36). Update decision unit 522 outputs "1" at all times until the count value reaches a preset value. After the count value reaches the preset value, update decision unit 522 outputs "1" when the noisy speech power is smaller than the threshold value. As described above with reference to FIG. 21, comparator 5025 determines whether the noisy speech signal is noise or not. That is, comparator 5205 detects speech for each frequency. With the above arrangement, therefore, it is possible to realize an update decision unit which does not require a voice activity detection flag to be contained in the input signal.

The noise suppressors according to the preferred embodiments of the present invention have been described above. In the above description, it has been assumed that the minimum mean-square error short-time spectral amplitude is used as a noise suppression algorithm. However, the present invention is also applicable to other noise suppression algorithms. One of such noise suppression algorithm is a Wiener filtering process disclosed in PROCEEDINGS OF THE IEEE, Vol. 67, No. 12, pp. 1586-1604, DECEMBER 1979, (Reference 8).

INDUSTRIAL APPLICABILITY

According to the present invention, as described above, since the power spectrum of noise is estimated using a weighted noisy speech power spectrum, the power spectrum of noise can be estimated accurately regardless of the nature of noise, thus producing enhanced speech with reduced distortion and noise. According to the present invention, furthermore, because noise is suppressed using a spectral gain modified dependent on the value of an SNR (signal-to-noise ratio), it is possible to produce enhanced speech with reduced distortion and noise with respect to all SNR values.

The invention claimed is:

1. A method of noise suppression, using a computer to carry out the steps of:
converting, by at least one processor, an input signal into a frequency-domain and determining a signal-to-noise ratio based on a frequency-domain signal;
determining, by the at least one processor, a spectral gain based on said signal-to-noise ratio;
correcting, by the at least one processor, said spectral gain to produce a modified spectral gain;
weighting, by the at least processor, said frequency-domain signal using said modified spectral gain; and
converting, by the at least one processor, the weighted frequency-domain signal into a time-domain signal to produce an output signal where noise has suppressed,
wherein said step of determining a spectral gain comprises the step of determining said spectral gain based on a modified signal-to-noise ratio which is produced by correcting said signal-to-noise ratio, and
wherein said step of correcting said spectral gain to produce a modified spectral gain comprises the steps of:
estimating, by the at least one processor, an a-priori signal-to-noise ratio value across a frequency spectrum, to obtain an estimated a-priori signal-to-noise ratio value across the frequency spectrum;
receiving, by the at least one processor, the estimated a-priori signal-to-noise ratio value across the frequency spectrum;
demultiplexing, by the at least one processor, the estimated a-priori signal-to-noise ratio value to provide a demultiplexed a-priori signal-to-noise ratio value to a plurality of frequency-dependent spectral gain modification units that cover different frequency ranges of the frequency spectrum;
demultiplexing, by the at least one processor, the spectral gain determined in the determining step to provide a demultiplexed spectral gain to the plurality of frequency-dependent spectral gain modification units that cover different frequency ranges of the frequency spectrum; and
multiplexing, by the at least one processor, respective outputs of the plurality of frequency-dependent spectral gain modification units to obtain the modified spectral gain,
wherein each of the plurality of frequency-dependent spectral gain modification units performs spectral gain correction over the respective different frequency ranges of the frequency spectrum.

2. The method of noise suppression according to claim 1, wherein said step of determining a signal-to-noise ratio comprises the steps of estimating noise using said frequency-domain signal, and determining said signal-to-noise ratio using the estimated noise and said frequency-domain signal.

3. The method of noise suppression according to claim 2, wherein said step of estimating noise using said frequency-domain signal comprises the steps of weighting said frequency-domain signal to determine a weighted frequency-domain signal, and estimating noise using said weighted frequency-domain signal.

4. The method of noise suppression according to claim 3, wherein said step of determining said weighted frequency-domain signal comprises the step of determining a weight using said signal-to-noise ratio.

5. The method of noise suppression according to claim 4, wherein said step of determining said weighted frequency-domain signal further comprises the steps of processing said signal-to-noise ratio with a nonlinear function to determine a modified weight, and weighting said frequency-domain signal using said modified weight.

6. An apparatus for noise suppression, the apparatus embodied in at least one processor, the apparatus comprising:
a signal-to-noise ratio calculator for converting an input signal into a frequency-domain and determining a signal-to-noise ratio using a frequency-domain signal;
a spectral gain generator for determining a spectral gain based on said signal-to-noise ratio;
a spectral gain modification unit for correcting said spectral gain to produce a modified spectral gain;
a multiplier for weighting said frequency-domain signal using said modified spectral gain;
an estimator for estimating an a-priori signal-to-noise ratio value across a frequency spectrum, to obtain an estimated a-priori signal-to-noise ratio value across the frequency spectrum; and
an inverse converter for converting the weighted frequency-domain signal into a time-domain signal,
wherein said modified spectral gain generator includes a modified signal-to-noise ratio calculator for correcting said signal-to-noise ratio to determine a modified signal-to-noise ratio, wherein said spectral gain generator determines said spectral gain based on the modified signal-to-noise ratio which is produced by correcting said signal-to-noise ratio, and wherein each of said spectral gain modification units comprises:
a first demultiplexer configured to receive an estimated a-priori signal-to-noise ratio value across a frequency spectrum, and to demultiplex the estimated a-priori signal-to-noise ratio value to provide a demultiplexed a-priori signal-to-noise ratio value;
a plurality of frequency-dependent spectral gain modification units that cover different frequency ranges of the frequency spectrum and that are configured to receive the demultiplexed a priori signal-to-noise ratio value;
a second demultiplexer configured to receive the spectral gain and to demultiplex the spectral gain to provide a demultiplexed spectral gain to the plurality of frequency-dependent spectral gain modification units; and
a multiplexer configured to multiplex respective outputs of the plurality of frequency-dependent spectral gain modification units and to output the modified spectral gain as a result thereof,
wherein each of the plurality of frequency-dependent spectral gain modification units performs spectral gain correction over the respective different frequency ranges of the frequency spectrum.

7. The apparatus for noise suppression according to claim 6, wherein said signal-to-noise ratio calculator includes a noise estimation unit for estimating noise using said frequency-domain signal.

8. The apparatus for noise suppression according to claim 7, wherein said noise estimation unit includes a weighted frequency-domain signal calculator for weighting said frequency-domain signal to determine a weighted frequency-domain signal.

9. The apparatus for noise suppression according to claim 8, wherein said weighted frequency-domain signal calculator includes a second signal-to-noise ratio calculator for calculating a signal-to-noise ratio.

10. The apparatus for noise suppression according to claim 9, wherein said weighted frequency-domain signal calculator further includes a nonlinear processor for processing said signal-to-noise ratio determined by said second signal-to-noise ratio calculator with a nonlinear function to determine a modified weight.

11. The method of noise suppression according to claim 2, wherein said step of estimating noise using said frequency-domain signal comprises the steps of:
storing, in an estimated noise memory, the estimated noise;
receiving a noisy speech power spectrum obtained from the frequency-domain signal;
determining a frequency-dependent signal-to-noise ratio based on the estimated noise obtained from the estimated noise memory and the noisy speech power spectrum;
processing, by a multiplexed nonlinear processor, the frequency-dependent signal-to-noise ratio to determine a weighting factor; and
multiplying the weighting factor output by the multiplexed nonlinear processor, with the noisy speech power spectrum, to obtain a weighted noisy speech power spectrum.

12. The apparatus for noise suppression according to claim 7, wherein said signal-to-noise ratio calculator includes a weighted noisy speech calculator that comprises:
an estimated noise memory configured to store the estimated noise output by the noise estimation unit;
a multiplexed multiplier configured to receive a noisy speech power spectrum obtained from the frequency-domain signal;
a frequency-dependent signal-to-noise ratio calculator configured to determine a frequency-dependent signal-to-noise ratio based on the estimated noise obtained from the estimated noise memory and the noisy speech power spectrum;
a multiplexed nonlinear processor configured to process the frequency-dependent signal-to-noise ratio output by the frequency-dependent signal-to-noise ratio calculator to determine a weighting factor; and
a multiplexed multiplier configured to multiply the weighting factor output by the multiplexed nonlinear processor, with the noisy speech power spectrum, to obtain a weighted noisy speech power spectrum.

13. A method of noise suppression, using a computer to carry out the steps of:
converting, by at least one processor, an input signal into a frequency-domain signal; and
estimating, by the at least one processor, noise based on said frequency-domain signal;
wherein the estimating step comprises the steps of:
determining, by the at least one processor, a frequency-dependent signal-to-noise ratio based on said frequency-domain signal;
determining, by the at least one processor, a weight based on said frequency-dependent signal-to-noise ratio such that the weight is set to a value less than a predetermined weight when the frequency-dependent signal-to-noise ratio is greater than a predetermined signal-to-noise ratio;
weighting, by the at least one processor, said frequency-domain signal with said weight to determine a weighted frequency-domain signal; and
determining, by the at least one processor, the estimated noise based on said weighted frequency-domain signal.

14. The method according to claim 13, wherein said step of determining a weight comprises the step of determining the weight from said frequency-dependent signal-to-noise ratio with a non-linear function.

15. The method according to claim 13, wherein said step of determining a frequency-dependent signal-to-noise ratio comprises the step of determining said frequency-dependent signal-to-noise ratio based on said frequency-domain signal and a previous estimated noise.

16. The method according to claim 13, wherein the step of determining the estimated noise based on said weighted frequency-domain signal comprises the step of determining said estimated noise from said weighted frequency-domain signal with moving-averaging.

17. The method according to claim 13, further comprising the step of:
suppressing noise in said frequency-domain signal based on the estimated noise.

18. The method according to claim 17, wherein said suppressing step comprises the steps of:
determining a signal-to-noise ratio based on said frequency-domain signal and said estimated noise; and
determining a spectral gain based on said signal-to-noise ratio,
wherein said suppressing step comprises the step of weighting said frequency-domain signal with said signal-to-noise ratio to suppress noise.

19. An apparatus for noise suppression, the apparatus embodied in at least one processor, the apparatus comprising:
- a converter configured to convert an input signal into a frequency-domain signal;
- a noise estimation unit configured to estimate noise across a frequency spectrum based on said frequency-domain signal;
- wherein said noise estimation unit comprises:
  - a frequency-dependent signal-to-noise ratio calculator configured to determine a frequency-dependent signal-to-noise ratio based on said frequency-domain signal;
  - a weight calculator configured to determine a weight such that the weight is set to a value less than a predetermined weight when the frequency-dependent signal-to-noise ratio is greater than a predetermined signal-to-noise ratio;
  - a weighted frequency-domain signal calculator configured to weigh said frequency-domain signal with said weight to determine a weighted frequency-domain signal; and
  - an estimated noise calculator configured to determine the estimated noise based on said weighted frequency-domain signal,
- wherein said frequency-dependent signal-to-noise ratio calculator determines said frequency-dependent signal-to-noise ratio based on said frequency-domain signal and a previous estimated noise.

20. The apparatus according to claim 19, wherein said weight calculator comprises a nonlinear processor configured to the weight from said frequency-dependent signal-to-noise ratio.

21. The apparatus according to claim 19, wherein said estimated noise calculator comprises a moving-average calculator configured to determine said estimated noise from said weighted frequency-domain signal with moving-averaging.

22. The apparatus according to claim 19, further comprising:
- a noise suppressor configured to suppress noise in said frequency-domain signal.

23. The apparatus according to claim 22, wherein said noise suppressor comprises:
- a signal-to-noise calculator configured to determine a signal-to-noise ratio based on said frequency-domain signal and said estimated noise;
- a spectral gain generator configured to determine a spectral gain based on said signal-to-noise ratio; and
- a weighting unit configured to weight said frequency-domain signal with said signal-to-noise ratio to suppress noise.

24. The method according to claim 1, wherein the step of estimating an a-priori signal-to-noise ratio value across a frequency spectrum comprises the steps of:
- receiving and storing, in a first memory, an a-posteriori signal-to-noise ratio across the frequency spectrum;
- receiving and storing, in a second memory, the spectral gain;
- performing multiplexed range limitation processing to the a-posteriori signal-to-noise ratio across the frequency spectrum;
- performing, by a first multiplexed multiplier, a multiplexed multiplication of the spectral gain stored in the second memory in order to obtain and output a squared spectral gain;
- performing, by a second multiplexed multiplier, a multiplexed multiplication of the squared spectral gain output by the first multiplexed multiplier and the a-posteriori signal-to-noise ratio across the frequency spectrum stored in the first memory, to obtain and output a past estimated signal-to-noise ratio value; and
- adding a weight to the past estimated signal-to-noise ratio value output by the second multiplexed multiplier to obtain and output an estimated a-priori signal-to-noise ratio value across the frequency spectrum.

25. The apparatus according to claim 6, further comprising:
- a first memory configured to receiving and store an a-posteriori signal-to-noise ratio across the frequency spectrum;
- a second memory configured to receive and store the spectral gain;
- a multiplexed range limitation processor configured to perform multiplexed range limitation processing on the a-posteriori signal-to-noise ratio across the frequency spectrum;
- a first multiplexed multiplier configured to perform a multiplexed multiplication of the spectral gain stored in the second memory in order to obtain and output a squared spectral gain;
- a second multiplexed multiplier configured to perform a multiplexed multiplication of the squared spectral gain output by the first multiplexed multiplier and the a-posteriori signal-to-noise ratio across the frequency spectrum stored in the first memory, to obtain and output a past estimated signal-to-noise ratio value; and
- an adder configured to add a weight to the past estimated signal-to-noise ratio value output by the second multiplexed multiplier to obtain and output an estimated a-priori signal-to-noise ratio value across the frequency spectrum.

* * * * *

UNITED STATES PATENT AND TRADEMARK OFFICE
CERTIFICATE OF CORRECTION

| | | |
|---|---|---|
| PATENT NO. | : 7,590,528 B2 | Page 1 of 1 |
| APPLICATION NO. | : 10/451141 | |
| DATED | : September 15, 2009 | |
| INVENTOR(S) | : Kato et al. | |

It is certified that error appears in the above-identified patent and that said Letters Patent is hereby corrected as shown below:

On the cover page, item [*] Notice:    Subject to any disclaimer, the term of this patent is extended or adjusted under 35 U.S.C. 154(b) by 875 days.

Delete the phrase "by 875 days" and insert -- by 1193 days --

Signed and Sealed this

Eighth Day of June, 2010

David J. Kappos
*Director of the United States Patent and Trademark Office*